(12) United States Patent
Pereira et al.

(10) Patent No.: US 6,934,796 B1
(45) Date of Patent: *Aug. 23, 2005

(54) CONTENT ADDRESSABLE MEMORY WITH HASHING FUNCTION

(75) Inventors: Jose P. Pereira, Cupertino, CA (US); Sunder R. Rathnavelu, Marlboro, NJ (US); Rodolfo G. Beraha, Redwood City, CA (US); Lewis M. Carroll, Plano, TX (US); Ronald S. Jankov, Woodside, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 177 days.

This patent is subject to a terminal disclaimer.

(21) Appl. No.: 10/061,941

(22) Filed: Feb. 1, 2002

(51) Int. Cl.[7] ............................................. G06F 12/00
(52) U.S. Cl. ..................................... 711/108; 365/49
(58) Field of Search .............................. 711/108, 164; 365/49, 189.07

(56) References Cited

U.S. PATENT DOCUMENTS

| | | | |
|---|---|---|---|
| 4,152,762 A | | 5/1979 | Bird et al. |
| 4,813,002 A | | 3/1989 | Joyce et al. |
| 4,958,377 A | | 9/1990 | Takahashi |
| 5,129,074 A | | 7/1992 | Kikuchi et al. |
| 5,359,720 A | * | 10/1994 | Tamura et al. ............. 711/108 |
| 5,386,413 A | | 1/1995 | McAuley et al. |
| 5,414,704 A | | 5/1995 | Spinney |
| 5,440,715 A | | 8/1995 | Wyland |
| 5,485,418 A | | 1/1996 | Hiraki et al. |
| 5,515,370 A | | 5/1996 | Rau |
| 5,526,504 A | * | 6/1996 | Hsu et al. .................. 711/207 |
| 5,530,958 A | * | 6/1996 | Agarwal et al. .............. 711/3 |
| 5,574,871 A | * | 11/1996 | Hoyt et al. ................. 712/200 |
| 5,642,322 A | | 6/1997 | Yoneda |
| 5,706,492 A | * | 1/1998 | Hoyt et al. ................. 712/238 |
| 5,724,538 A | * | 3/1998 | Morris et al. .............. 711/206 |
| 5,818,786 A | | 10/1998 | Yoneda |
| 5,870,324 A | | 2/1999 | Helwig et al. |
| 5,903,751 A | * | 5/1999 | Hoyt et al. ................. 712/238 |
| 5,920,886 A | | 7/1999 | Feldmeier |
| 5,944,817 A | * | 8/1999 | Hoyt et al. ................. 712/240 |
| 5,999,435 A | | 12/1999 | Henderson et al. |
| 6,006,306 A | | 12/1999 | Haywood et al. |
| 6,011,795 A | | 1/2000 | Varghese et al. |
| 6,098,147 A | | 8/2000 | Mizuhara |
| 6,161,144 A | | 12/2000 | Michels et al. |
| 6,199,140 B1 | | 3/2001 | Srinivasan et al. |

(Continued)

OTHER PUBLICATIONS

J. Da Silva and I. Watson, "Pseudo-Associative Store with Hardware Hashing," IEE Proceedings, Computers and Digital Techniques, vol. 130, Pt. E, No. 1, Jan. 1, 1983, pp. 19–24.

(Continued)

*Primary Examiner*—Kevin Verbrugge
(74) *Attorney, Agent, or Firm*—Shemwell Gregory & Courtney LLP

(57) ABSTRACT

A content addressable memory (CAM) device having a memory, a hash index generator to associate a search value with a unique location within a memory, and a compare circuit. The index generator generates an index based on the search value. The memory receives the index from the index generator and outputs a stored data value from a location indicated by the index. A compare circuit receives the data value from the memory and compares the data value and the search value to generate a match signal indicative of whether the data value and search value match. The match signal and index are output from the CAM device.

104 Claims, 37 Drawing Sheets

U.S. PATENT DOCUMENTS

| | | | |
|---|---|---|---|
| 6,226,710 B1 | | 5/2001 | Melchior |
| 6,289,414 B1 | | 9/2001 | Feldmeier et al. |
| 6,362,992 B1 | | 3/2002 | Cheng |
| 6,370,613 B1 | | 4/2002 | Diede et al. |
| 6,374,349 B1 | * | 4/2002 | McFarling .................. 712/239 |
| 6,389,506 B1 | | 5/2002 | Ross et al. |
| 6,393,544 B1 | * | 5/2002 | Bryg et al. .................. 711/220 |
| 6,499,081 B1 | | 12/2002 | Nataraj et al. |
| 6,735,670 B1 | * | 5/2004 | Bronstein et al. ........... 711/108 |
| 2003/0093616 A1 | * | 5/2003 | Slavin ........................ 711/108 |

OTHER PUBLICATIONS

D. Knuth, "The Art of Computer Programming, vol. 3, Sorting and Searching, Second Edition," Addison Wesley Longman, 1998, pp. 541–545.

V. Srinivasan, S. Suri and G. Varghese, "Packet Classification using Tuple Space Search," Proceedings of SIGCOMM, 1999, pp. 135–146.

Z. Cao, Z. Wang and E. Zegura, "Performance of Hashing–Based Schemes for Internet Load Balancing," Proc. IEEE INFOCOM 2000, Conf. on Computer Comm., vol. 1, 19th Annual Joint Conf. of the IEEE Computer and Comm. Soc., Tel Aviv, Israel, Mar. 26–30, 2000, pp. 1–10.

A. Broder and M. Mitzenmacher, "Using Multiple Hash Functions to Improve IP Lookups," Proceedings of IEEE INFOCOM, 2001, pp. 1454–1463.

Motomura, M., et al., "A 1.2 Million Transistor, 33 MHz, 20–b Dictionary Search Processor (DISP) ULSI with a 160–kb CAM," IEEE Journal of Solid–State Circuits, vol. 25, No. 5, Oct. 1990, pp. 1158–1165.

Robinson, I., "Patern–Addressable Memory," IEEE Micro, vol. 12, No. 3, Jun. 1992, pp. 20–30.

Shah, D. and Gupta, P., "Fast Incremental Updates on Ternary–CAMs for Routing Lookups and Packet Classification," IEEE Micro, 21(1), Jan. 2001, pp. 1–9.

Waldvogel et al., "Scalable High–Speed Prefix Matching," ACM Transactions on Computer Systems, vol. 19, No. 4 Nov. 2001, pp. 440–482.

Kobayashi, M. and Murase, T., "A Processor Based High–Speed Longest Prefix Match Search Engine," IEEE 2001, pp. 233–239.

Huang et al., "A Fast IP Routing Lookup Scheme for Gigabit Switching Routers," IEEE 1999, pp. 1429–1436.

Huang, Nen–Fu and Zhao, Shi–Ming, "A Novel IP–Routing Lookup Scheme and Hardware Architecture for Multigigabit Switching Routers," IEEE Journal on Selected Areas in Communications, vol. 17, No. 6, Jun. 1999, pp. 1093–1104.

V. Srinivasan and G. Varghese, "Fast Address Lookups Using Controlled Prefix Expansion," ACM Transactions on Computer systems, vol. 17, No. 1, Feb. 1999, pp. 1–40.

Gupta et al., "Routing Lookups in Hardware at Memory Access Speeds," Proc. Infocom, San Francisco, CA, Apr. 1998, pp. 1–8.

Waldvogel et al., "Scalable High Speed IP Routing Lookups," SIGCOMM, Cannes, France, 1997, pp. 25–35.

* cited by examiner

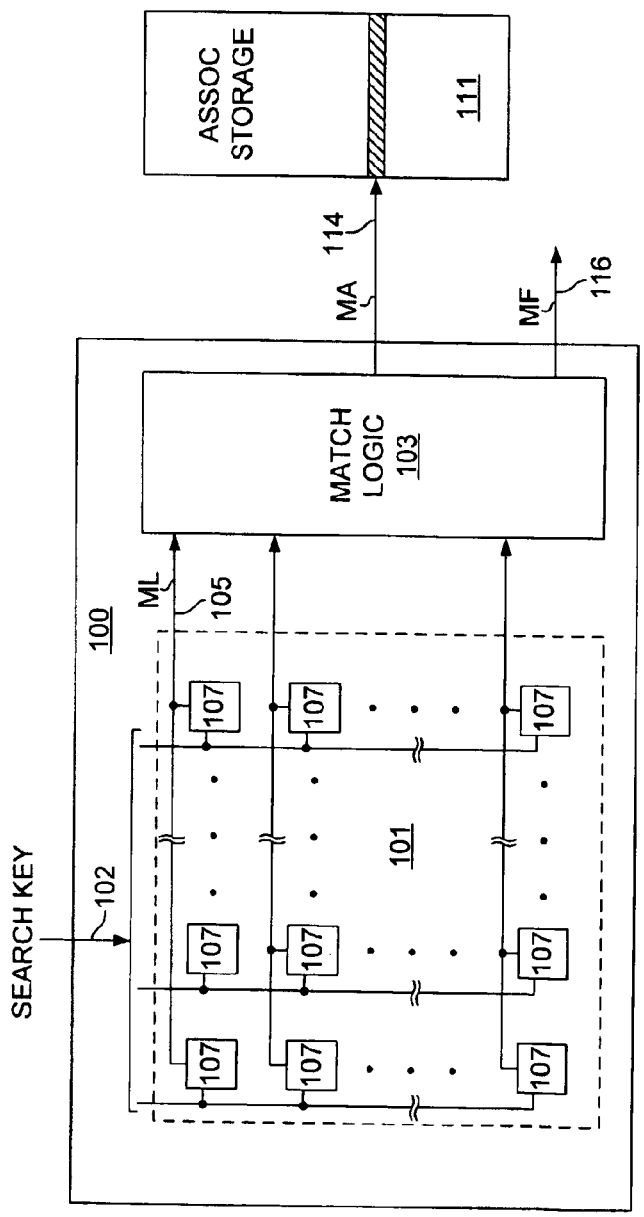
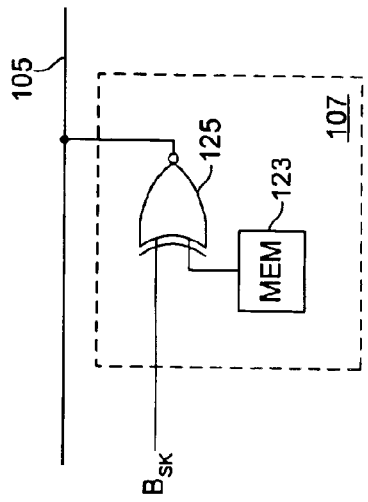
FIG. 1
(Prior Art)
FIG. 2
(Prior Art)

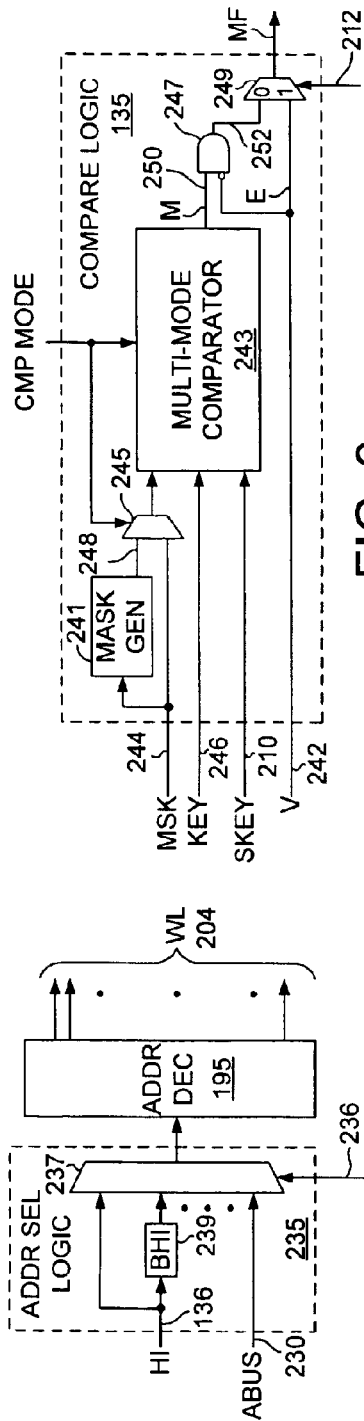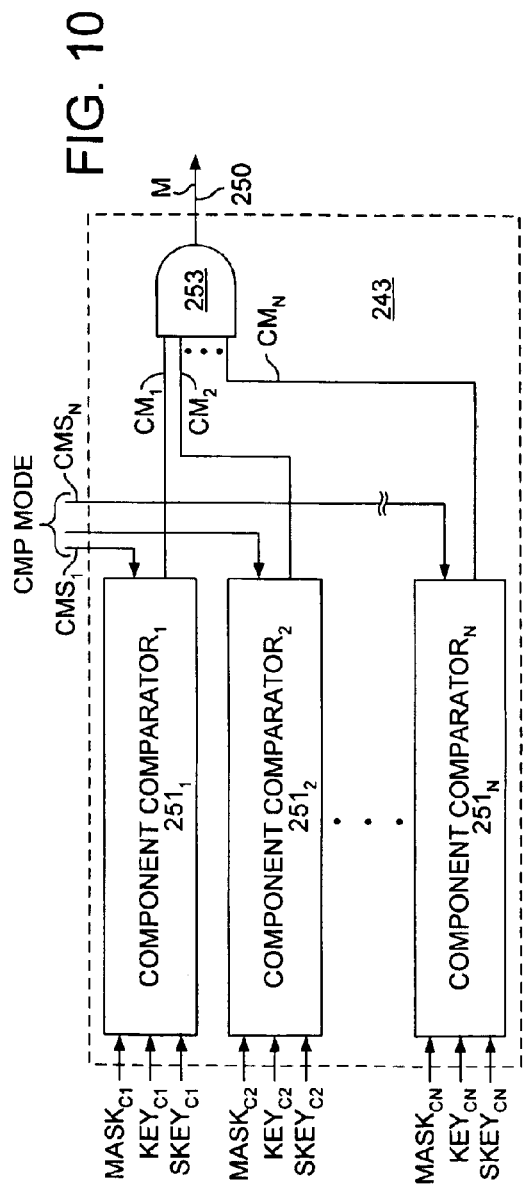

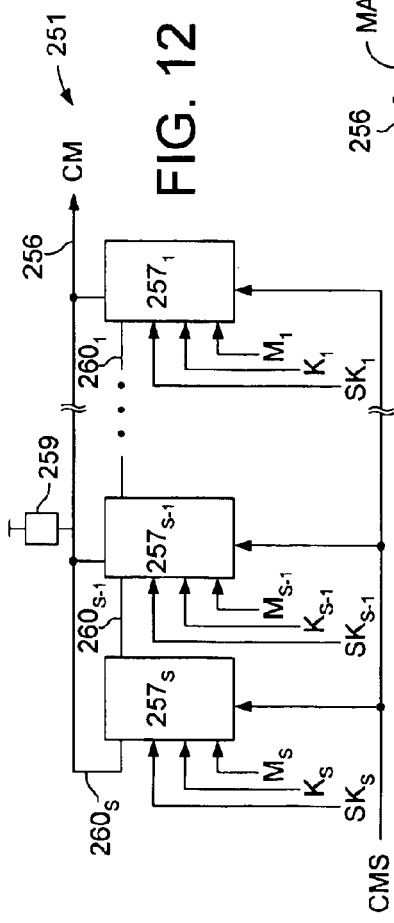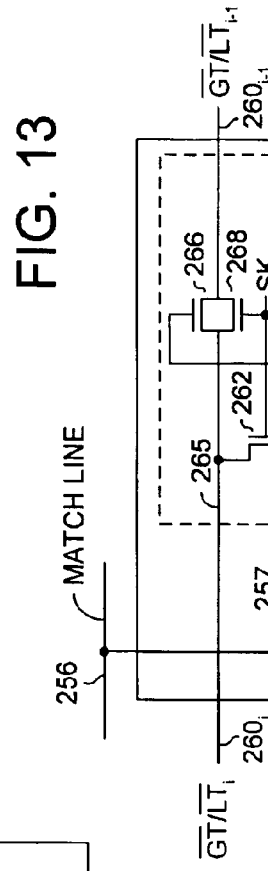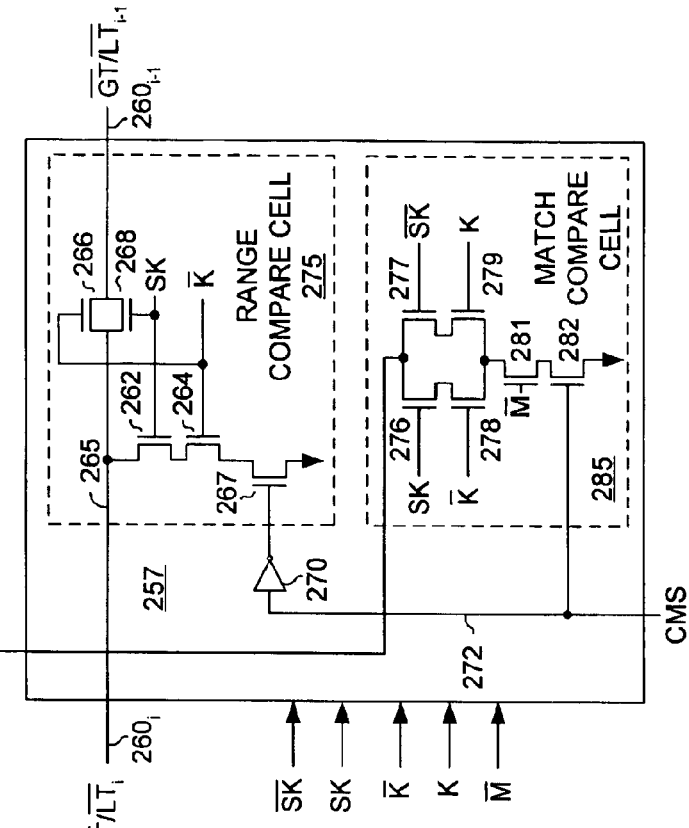

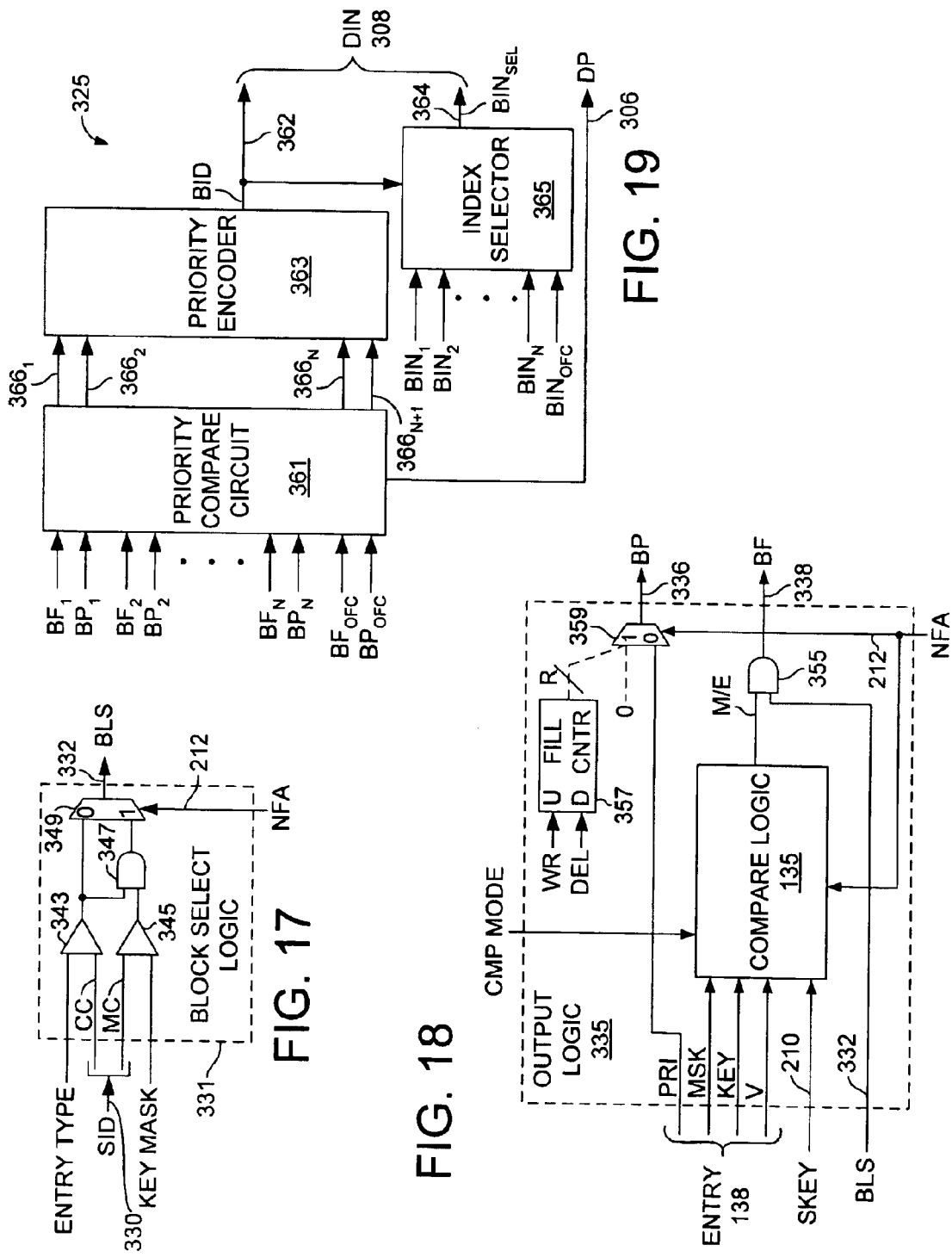

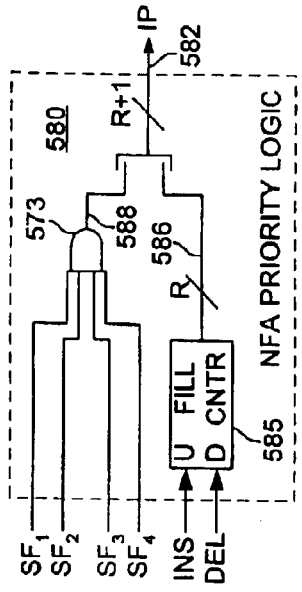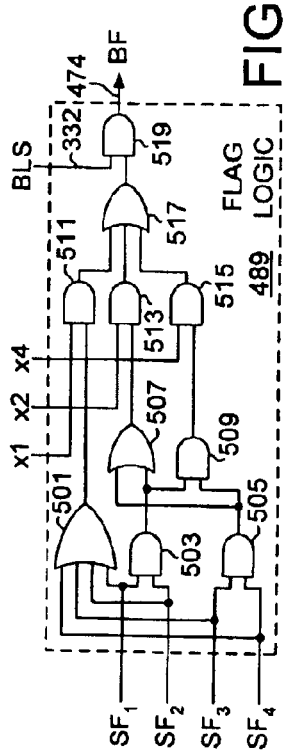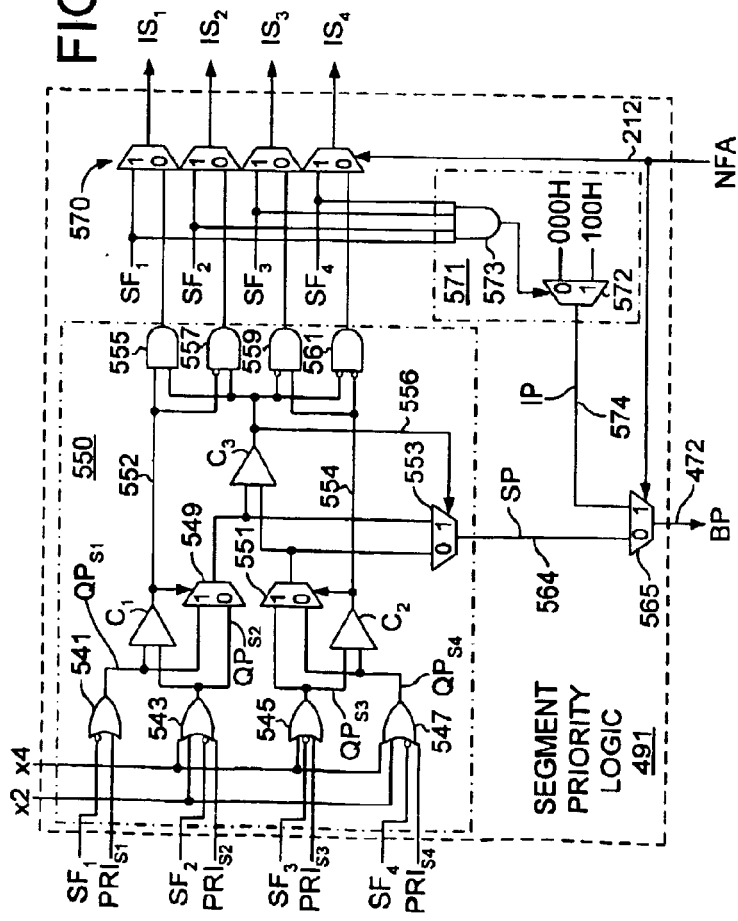

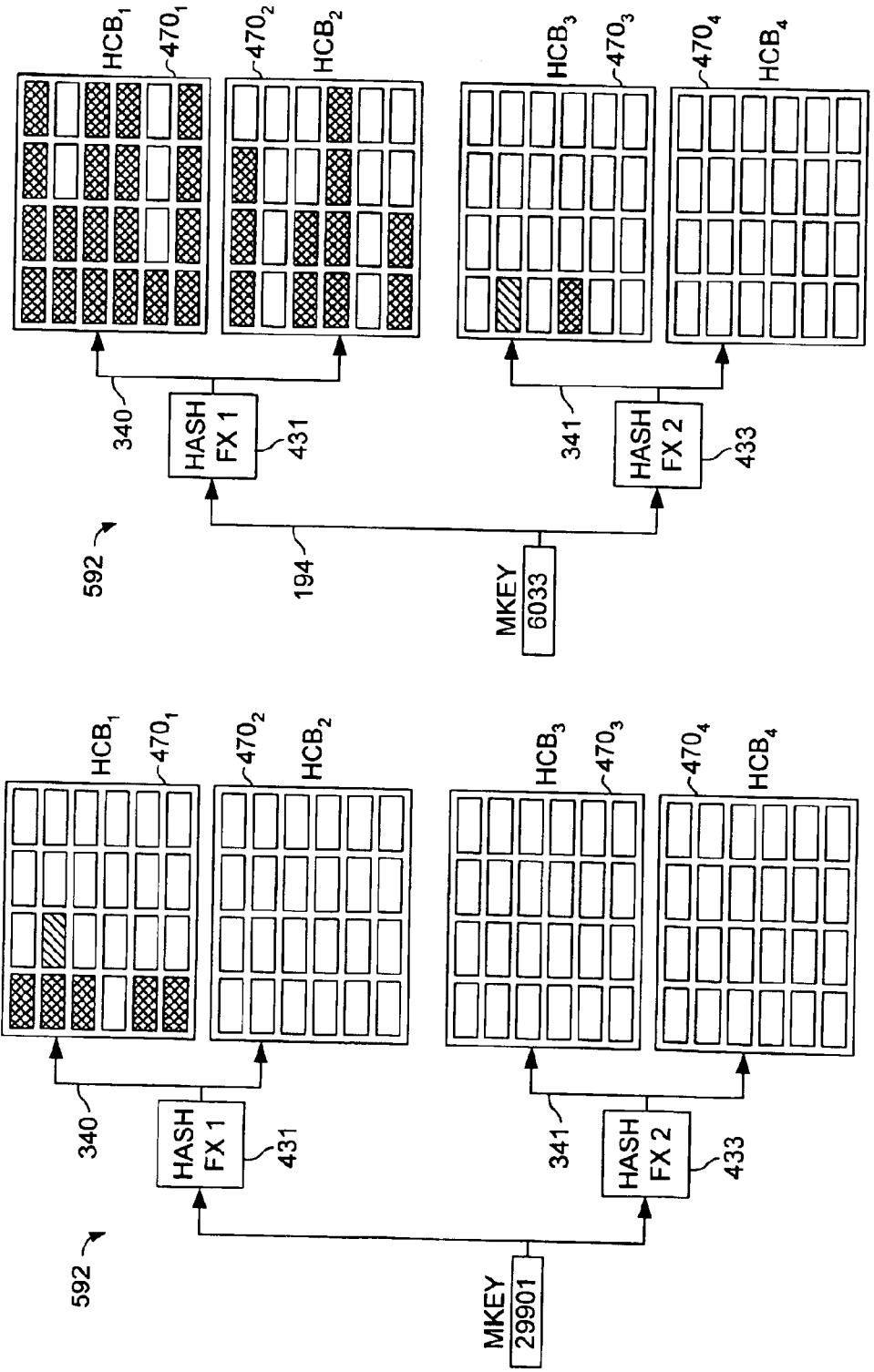

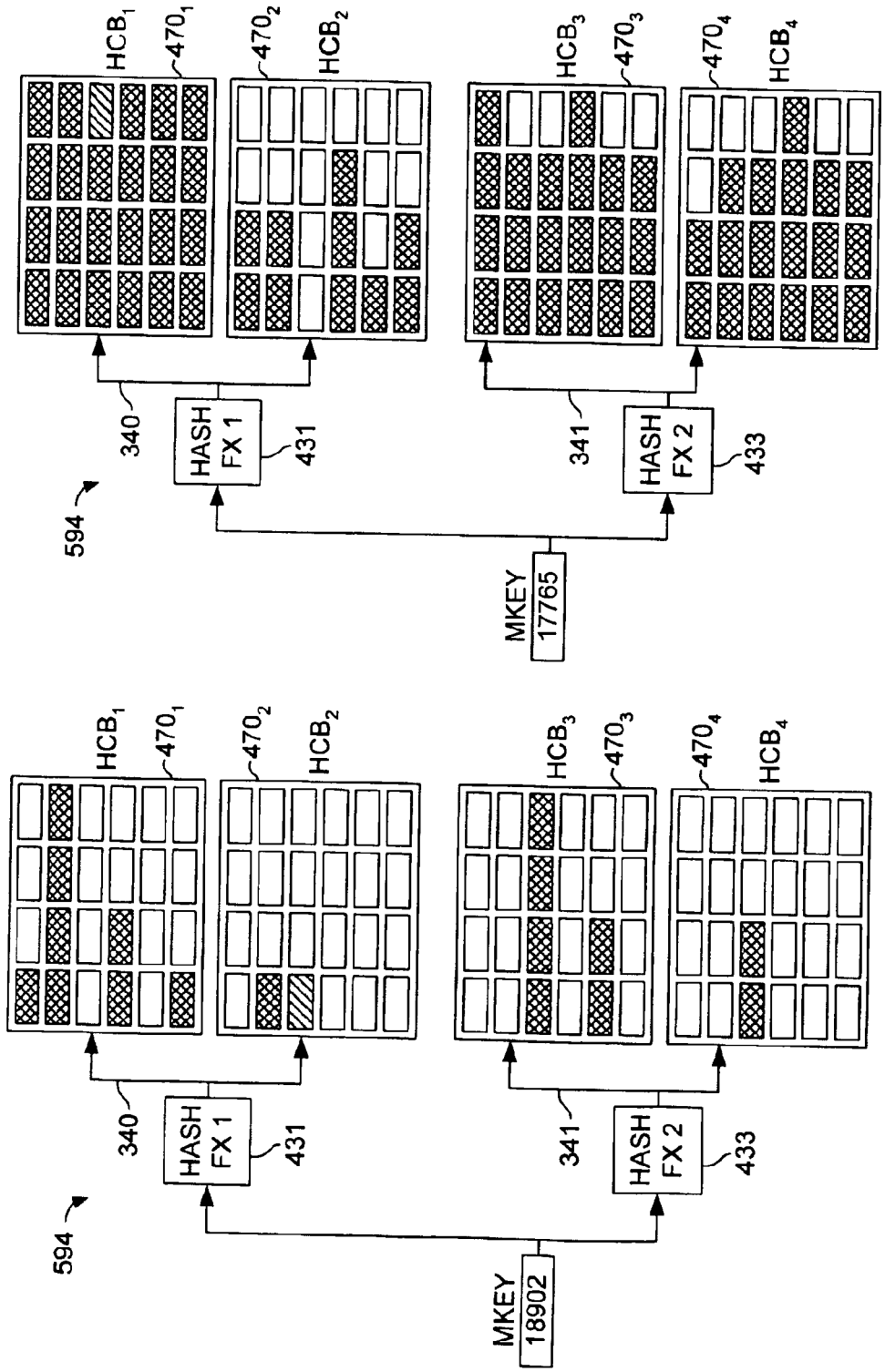

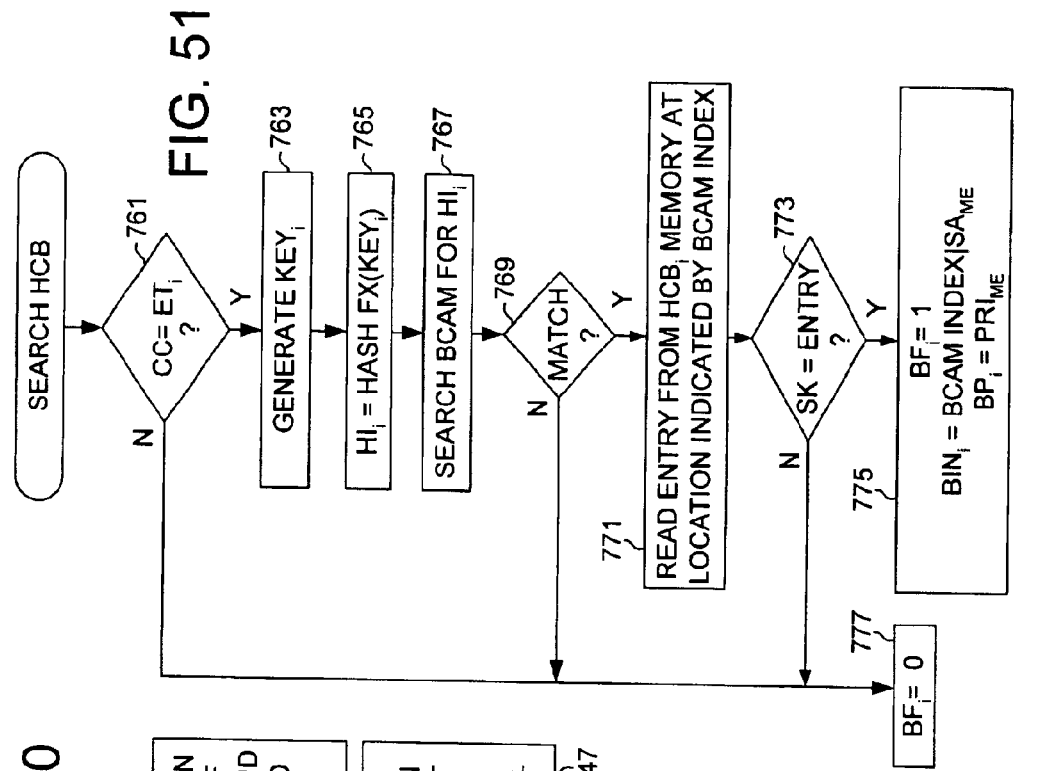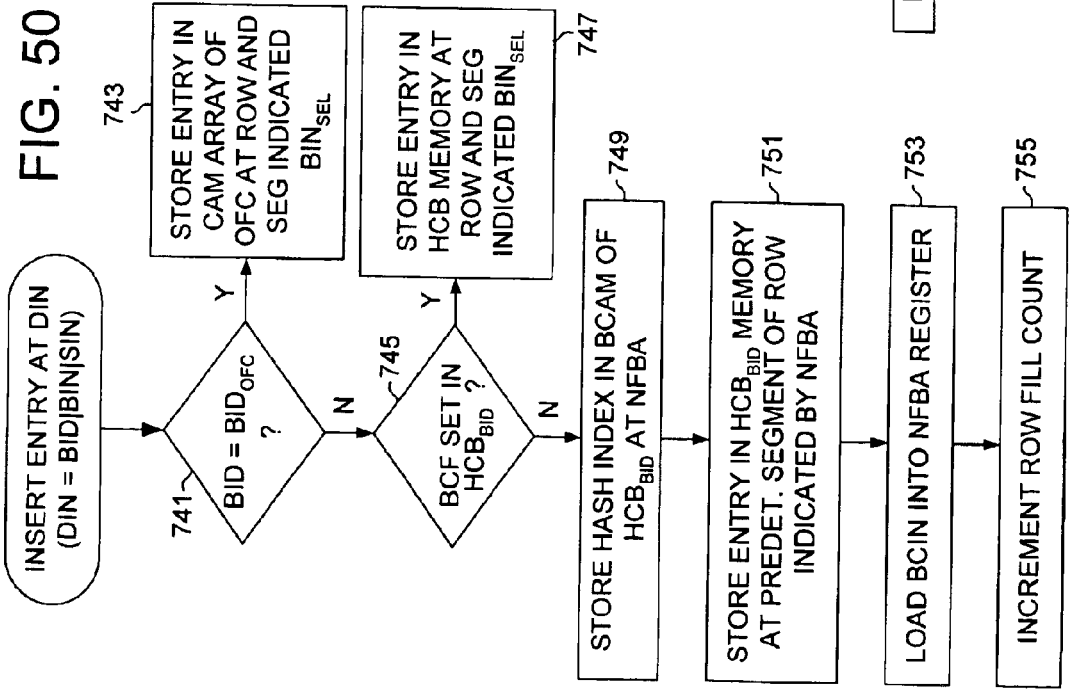

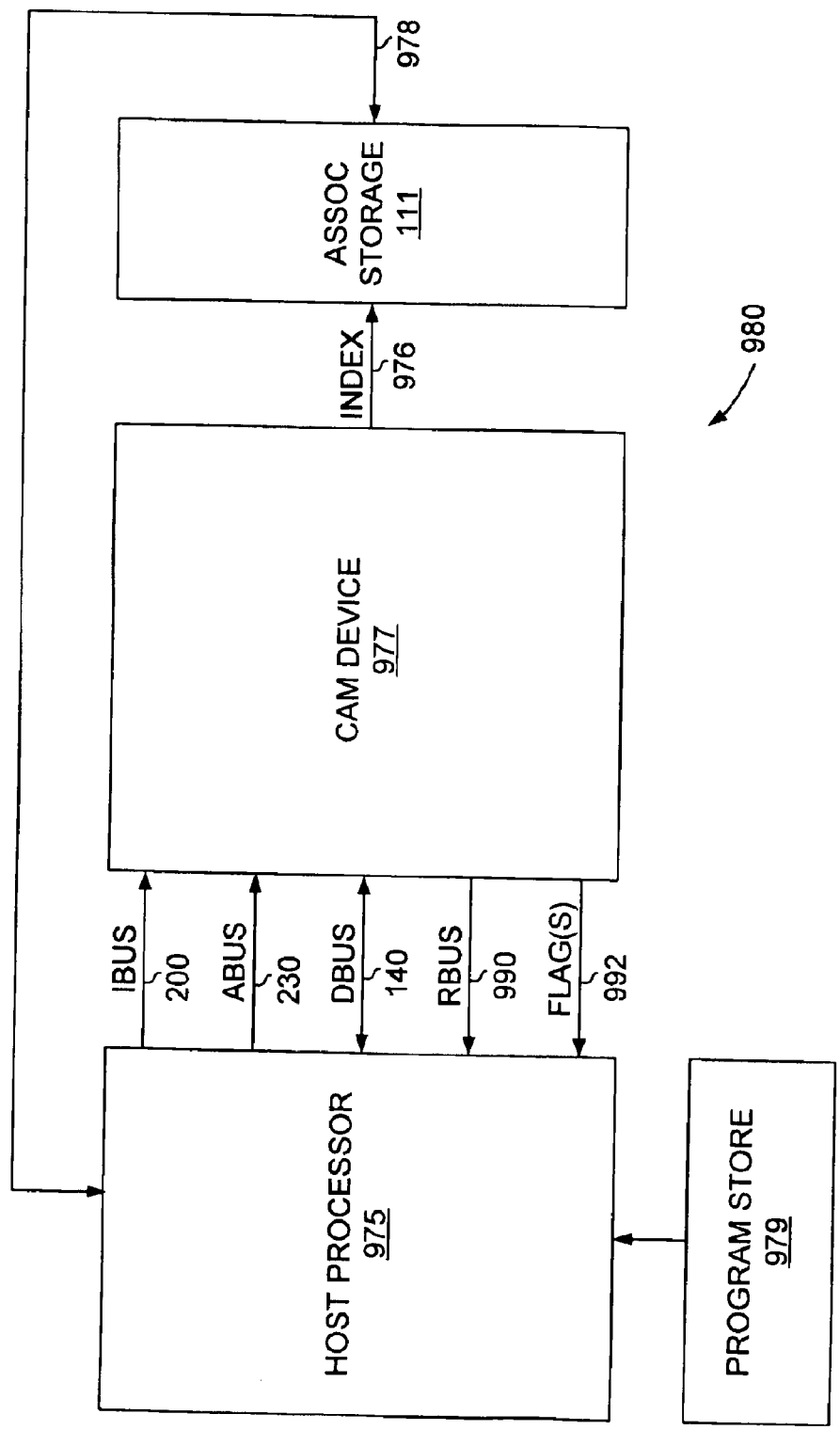

CONTENT ADDRESSABLE MEMORY WITH HASHING FUNCTION

FIELD OF THE INVENTION

The present invention relates generally to information retrieval systems and more particularly to content addressable memory devices.

BACKGROUND

Content addressable memory (CAM) devices are often used to support packet forwarding and classification operations in network switches and routes. A CAM device can be instructed to compare a search value, typically formed from one or more fields within the header of an incoming packet, with entries within an associative storage array of the CAM device. If the search value matches an entry, the CAM device generates an index that corresponds to the location of the matching entry within the storage array, and asserts a match flag to signal the match. The index may then be used to address another storage array, either within or separate from the CAM device, to retrieve routing or classification information for the packet.

FIG. 1 illustrates a prior art CAM device 100 that includes a CAM array 101 coupled to match logic 103 via a plurality of match lines 105 (ML). During a search operation, a search key is compared with the contents of each row of CAM cells 107 within the CAM array 101 to generate a corresponding row match signal. Each row match signal is either asserted or deasserted to indicate a match or mismatch condition, and is output to the match logic 103 via a respective one of the match lines 105. The match logic 103 responds to an asserted match signal by generating a match address 114 (MA) that corresponds to the row of CAM cells 107 that signaled the match, and by asserting a match flag 116 (MF) to indicate the match detection.

Referring to FIG. 2, each CAM cell 107 within the CAM array of FIG. 1 includes both a storage element 123 and a compare circuit 125. During a search operation, a data bit within the storage element is compared to a corresponding bit ($B_{SK}$) of the search key. If the bits do not match, compare circuit 125 pulls match line 105 low to indicate the mismatch. By integrating a storage element and compare circuit within each CAM cell 107 of the CAM array in this manner, a search key may be simultaneously compared with the contents of each row of CAM cells, thereby providing a massively parallel, and therefore extremely rapid search.

Although the integration of compare and storage circuits within each CAM cell 107 enables simultaneous, multi-row searching within the CAM array, the additional transistors required to implement the compare circuit significantly increases the size of the cell 107, reducing the memory density that can be achieved within the CAM device. Also, because each compare circuit in each row of CAM cells is simultaneously activated during a search operation, a relatively large amount of power is required to perform a search. This power consumption results in heat generation that further limits the storage density that can be achieved within the CAM device (i.e., due to thermal constraints).

BRIEF DESCRIPTION OF THE DRAWINGS

The features and advantages of the present invention are illustrated by way of example and are by no means intended to limit the scope of the present invention to the particular embodiments shown, and in which:

FIG. 1 illustrates a prior art CAM device;

FIG. 2 illustrates a prior art CAM cell;

FIG. 8 illustrates address selection logic which may be included within the hash CAM device of FIG. 6;

FIG. 9 illustrates an embodiment of the compare logic of FIG. 6;

FIG. 10 illustrates an embodiment of the multi-mode comparator of FIG. 9;

FIG. 11 illustrates the structure of a component comparator according to one embodiment;

FIG. 12 illustrates the structure of a component comparator according to another embodiment;

FIG. 13 illustrates a compare cell according to embodiment;

FIG. 17 illustrates an embodiment of the block select logic of FIG. 16;

FIG. 18 illustrates an embodiment of the output logic of FIG. 16;

FIG. 19 illustrates an embodiment of the device priority logic of FIG. 15;

FIG. 33 illustrates an embodiment of the flat logic of FIG. 32;

FIG. 34 illustrates an embodiment of the segment priority logic of FIG. 32;

FIG. 35 illustrates alternative NFA priority logic that may be used in place of the NFA priority logic of FIG. 34;

FIG. 36 illustrates an embodiment of the segment index encoder of FIG. 32;

FIG. 37 illustrates a NFA operation within an exemplary CAM device having four hash CAM blocks, each of which includes a four-segment memory, and each of which outputs one of two insert priority values;

FIG. 38 illustrates another exemplary NFA operation within the hash CAM device of FIG. 37 after additional entries have been loaded;

FIGS. 39 and 40 illustrate NFA operations within a hash CAM device that includes the NFA priority logic of FIG. 35;

FIG. 50 is a flow diagram of an insert operation within hash CAM device that includes multiple hash CAM blocks each according to FIG. 41;

FIG. 51 is a flow diagram of a search operation within the hash CAM block of FIG. 41.

FIG. 65 illustrates a system that includes a CAM device according to an embodiment of the present invention.

DETAILED DESCRIPTION

Figure 3:
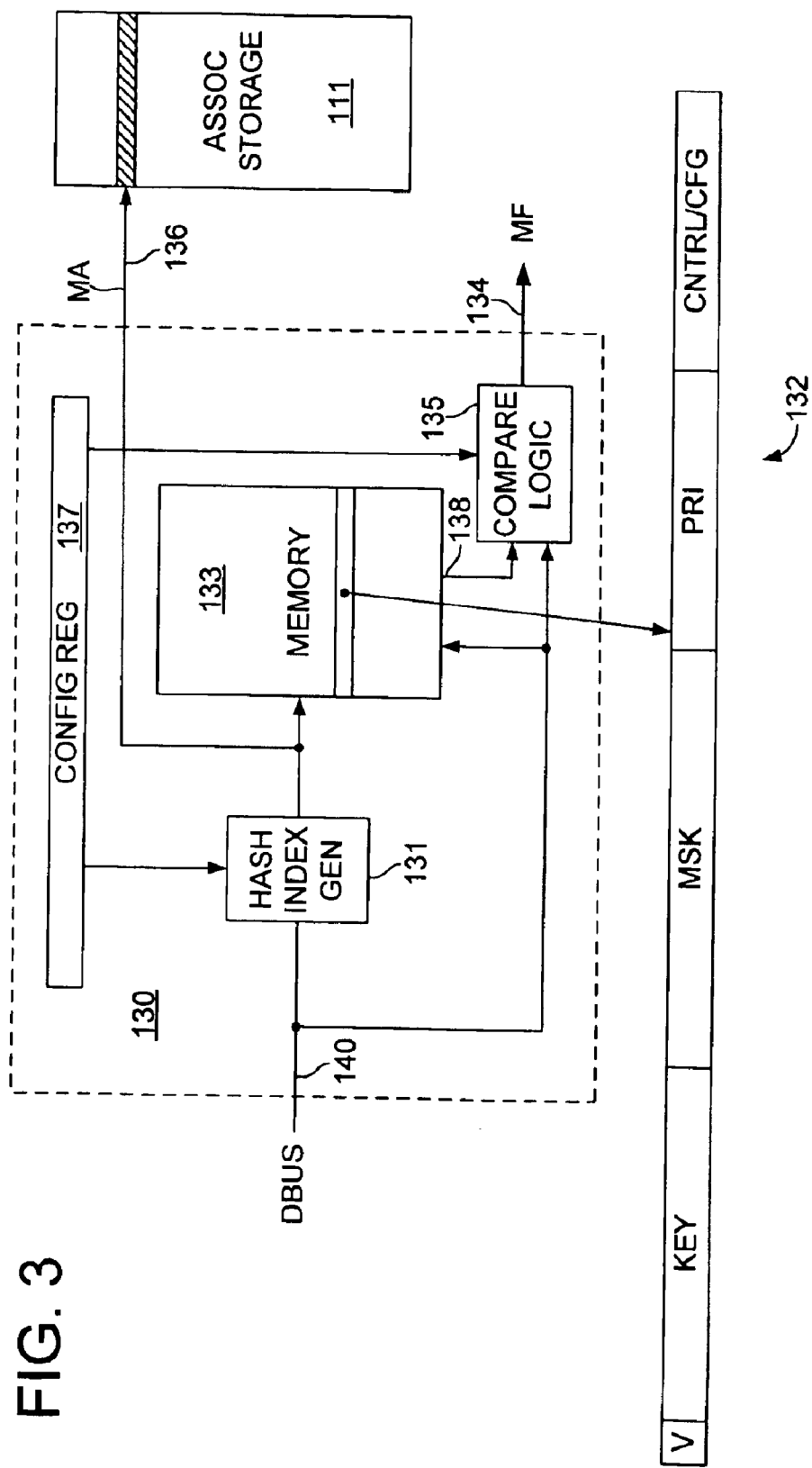
FIG. 3 illustrates a hash CAM device according to an embodiment of the present invention.

In the following description, for purposes of explanation, specific nomenclature is set forth to provide a thorough understanding of the present invention. However, it will be apparent to one skilled in the art that these specific details may not be required to practice the present invention. In some instances, the interconnection between circuit elements or blocks may be shown as buses or as single signal lines. Each of the buses may alternatively be single signal lines, and each of the single signal lines may alternatively be buses. A signal is said to be "asserted" when the signal is driven to a low or high logic state (or charged to a high logic state or discharged to a low logic state) to indicate a particular condition. Conversely, a signal is said to be "deasserted" to indicate the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{<signal name>}}$') is also used to indicate an active low signal. Active low signals may be changed to active high signals and vice-versa as is generally known in the art.

A hash CAM device that includes a memory and hash circuitry to associated a search value with a unique location within the memory is disclosed in numerous embodiments. In contrast to the prior art CAM device described above, a search value is not compared with each entry within an array of CAM cells to locate a matching entry, but rather the search value is input to a hash index generator which generates a search index (i.e., address) to the memory based on the search value itself. Each value stored within the memory was similarly input to the hash index generator to generate a storage index (i.e., memory address at which the value is stored) so that, if the search value matches a previously stored value, the search index and storage index will match. Accordingly, a match may be detected by comparing the search value with the entry stored at the search index. If the entry and search value match, a match flag is asserted to indicate the match detection and the search index is output as the match address. Because compare circuits need not be included within each storage cell of the device memory, a significantly higher memory density may be achieved in the hash CAM device than in the prior art CAM device described above. Also, because a search value is compared with only one memory entry per search (as opposed to comparing a search value with all entries within a CAM array), significantly less power is required to search the hash CAM device than the prior art CAM devices described above.

Overview of a Hash CAM device

FIG. 3 illustrates a hash CAM device 130 according to an embodiment of the present invention. The hash CAM device 130 includes a hash index generator 131, memory 133, compare logic 135 and, optionally, a configuration register 137. A data bus 140 is coupled to the hash index generator 131 and to the compare logic 135 to provide input data values during load operations and search operations. The hash CAM device 130 may also include an instruction decoder (not shown) to generate timing and control signals in response to instructions from a host device, such as a network processor, general purpose processor, application specific integrated circuit (ASIC) or any other instruction-issuing device.

Each data value stored in the memory 133 is referred to herein as an entry (shown generally at 132) and includes at least a key, KEY, and validity value, V. The key is formed from selected bits within the input data value and is input, at least in part, to the hash index generator 131 to generate the hash index at which the entry is stored (i.e., the storage index). The validity value may include one or more bits and is used to indicate the presence of a valid entry. An entry 132 may optionally include mask information, MSK (e.g., a mask value to be applied during a comparison operation, or an encoded value that can be decoded to generate a mask value), a prior value, PRI, which is a numeric value that indicates a priority of the entry relative to other entries, and control/configuration information, CNTRL/CFG, that may be used to control certain operations within the hash CAM device 130. The priority values included within the various entries within the memory 133 may be assigned in ascending priority order (i.e., lower numeric values indicate a higher priority than higher numeric values) or descending priority order (i.e., higher numeric values indicate a higher priority than lower numeric values). In the description that follows ascending priority order to generally assembled, though descending priority order may be alternatively by used. Also, in alternative embodiments, non-numeric values may be used to indicate priority (e.g., codewords or other indications of priority may be used).

Loading and Searching the Hash CAM

The hash index generator 131 ideally generates a unique storage index for each value to be loaded into the memory 133. For most applications, however, it is desirable for the hash index to be smaller (i.e., contain fewer constituent bits) than the corresponding input value, meaning that two or more different input values may yield the same storage index; an event referred to herein as a collision. Accordingly, before loading an input value into the memory 133, it is desirable to determine whether the input value will yield an index to an occupied or unoccupied storage location within memory 133 (i.e., determine whether a collision will occur). Otherwise, a previously loaded entry may be unknowingly overwritten. In one embodiment, a collision determination is achieved through a special type of search operation referred to herein as a next free address (NFA) operation. In a NFA operation, the value to be stored, referred to herein as an entry candidate, is provided in whole or part to the hash index generator 131 to produce a hash index 136. The entry, if any, at the indexed location (i.e., the storage location within memory 133 indicated by the hash index) is output to the compare logic 135 which, in turn, asserts or deasserts the match flag 134 according to the state of the validity value of the entry. If the validity value indicates the presence of a valid entry, a collision between the entry candidate and an existing entry (i.e., a previously loaded entry) has occurred, and the compare logic 135 deasserts the match flag 134 to indicate the conflicting occupation of the indexed memory location and that the candidate input value cannot be stored. If the validity value does not indicate the presence of a valid entry, the compare logic 135 asserts the match flag 134 to indicate that the indexed memory location is unoccupied. The candidate input value is subsequently stored in the memory 133 at the indexed location in an operation referred to herein as an insert operation.

During a search operation, a search value received via the data bus is input to the hash index generator to generate a hash index 136 referred to herein as a search index. The indexed entry 138 (i.e., entry at the location indicated by the search index) is output to the compare logic 135 which compares the entry with the search value. If the entry matches the search value, the match flag 134 is asserted to indicate the match condition. The search index (i.e., hash index 136) is output as the match address and may be used to access an associated storage 111, for example, to retrieve forwarding, classification, policing or other information associated with the entry. If the entry does not match the search value, the match flag 134 is deasserted to indicate that no match was detected within the hash CAM device 130 and, for example, may be used to quality the reach from the associated storage 111.

Figure 4:
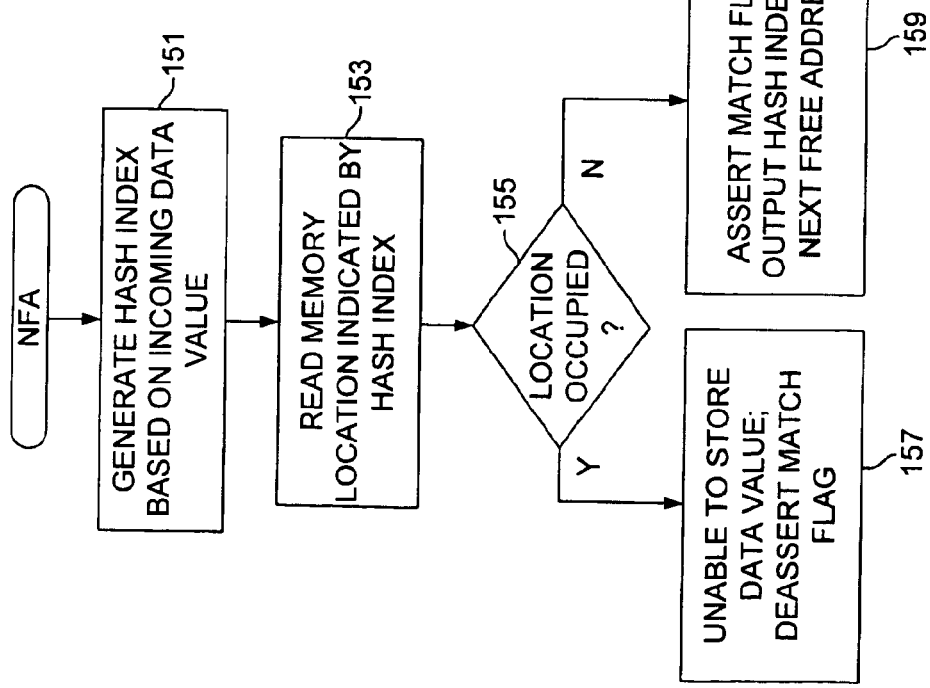
FIG. 4 is a flow diagram of a NFA operation within the hash CAM device of FIG. 3.

FIG. 4 is a flow diagram for a NFA operation within the hash CAM device of FIG. 3. Initially, at 151, a hash index is generated based on an incoming data value. At 153, memory is read at a location indicated by the hash index. If the location is determined to be occupied at 155 (e.g., based on the validity value of the indexed location), the hash CAM device is unable to store the incoming value and the match flag signal is deasserted at 157. If the location is determined to be unoccupied at 155, the hash CAM device asserts the match flag and outputs the hash index as the next free address at 159. The data value may then be stored in the memory location indicated by hash index in a subsequent insert operation.

Figure 5:
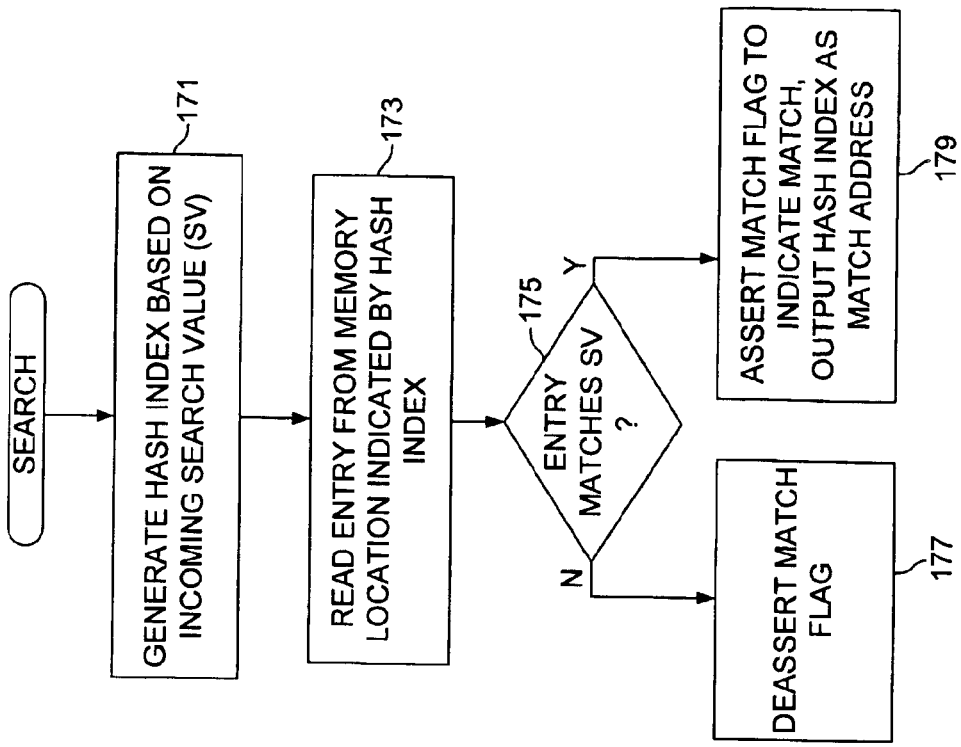
FIG. 5 illustrates a search operation within the hash CAM device of FIG. 3.

FIG. 5 illustrates a search operation within the hash CAM device of FIG. 3. At 171, a hash index is generated based on an incoming search value. At 173, an entry is read from the memory at a location indicated by the hash index. The entry is compared with the search value at 175. If the entry matches the search value, then at 179 the match flag is asserted to indicate the match detection, and the hash index is output as the match address. If the entry does not match the search value, the match flag is deasserted at 177.

Figure 6:
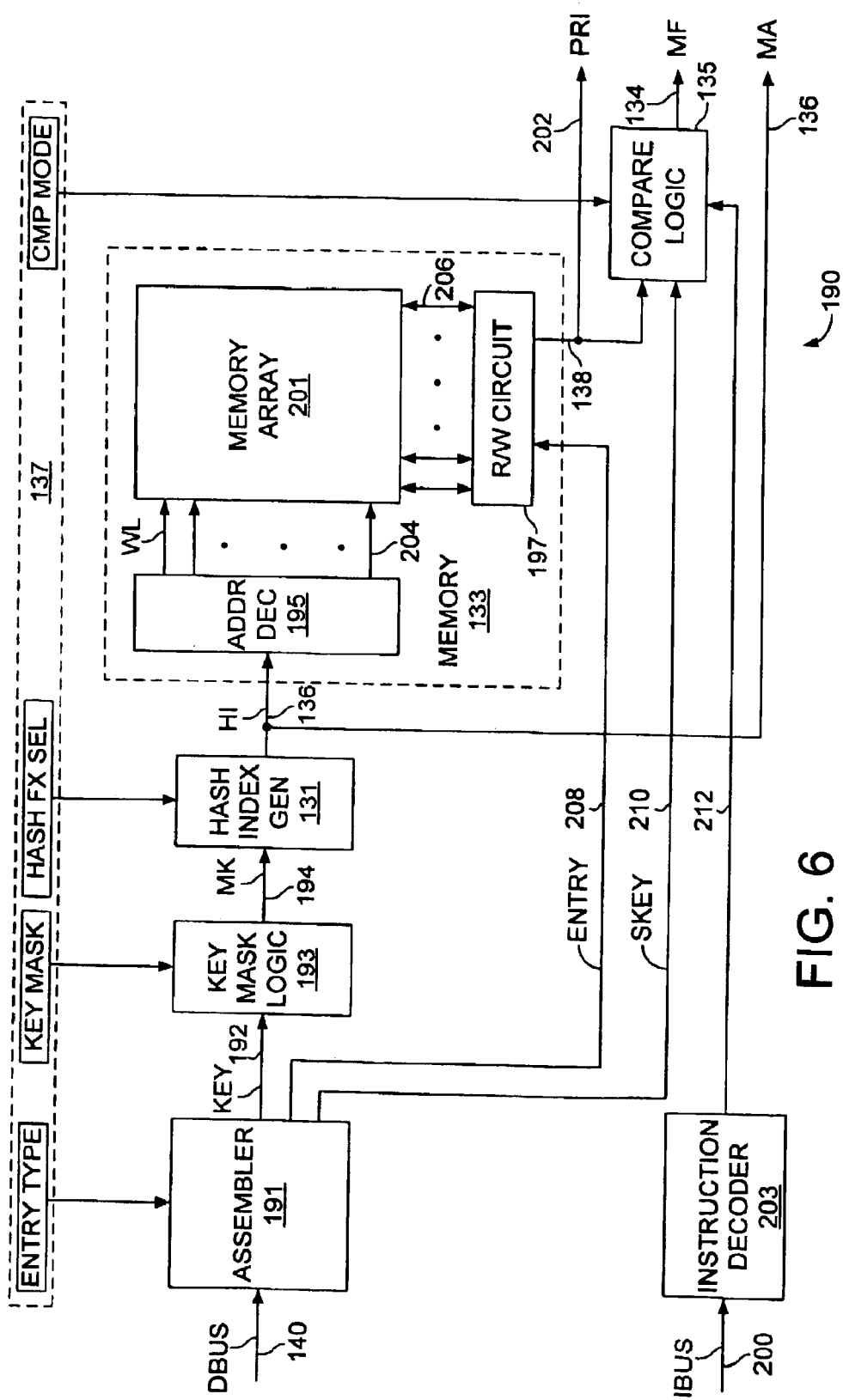
FIG. 6 illustrates an embodiment of a hash CAM device in greater detail.

FIG. 6 illustrates an embodiment of a hash CAM device 190. The hash CAM device 190 includes an assembler circuit 191, key mask logic 193, hash index generator 131, memory 133, compare logic 135, configuration register 137, and instruction decoder 203. The instruction decoder 203 is coupled to an instruction bus 200 to receive instructions from a host device (e.g., network processor, general purpose processor, application specific integrated circuit (ASIC) or any other instruction issuing device), and outputs control and timing signals to other circuit blocks within hash CAM device 190 to carry out the instructed operations. In one embodiment, the primary operations carried out in response to the incoming instructions are NFA, insert and search operations, though numerous other operations may be performed including, without limitation, memory read operations, memory write operations directed to explicitly provided addresses, test operations and so forth.

In one embodiment, the assembler circuit 191 assembles the key, mask information, priority and/or control/configuration values (referred to herein as entry components) from potentially dispersed fields of bits within an incoming data value. An entry type value programmed within the configuration register 137 indicates the location of the bit fields within the incoming data value and is provided to the assembler circuit 191 to enable the assembler circuit to properly assemble the entry components of differently formatted data types (e.g., IPv4 (Internet Protocol version 4), IPv6 (Internet Protocol version 6), MPLS (Multiprotocol Label Switching), etc.). The complete set of assembled entry components constitutes an entry 208 and is output from the assembler circuit to a read/write circuit 197 within the memory 133 for storage in an insert operation. The assembler circuit 191 also outputs the assembled key 192 to the key mask logic 193, and to the compare logic 135. The key provided to the compare logic 135 is referred to herein as a search key 210. Note that, in one embodiment, the key 192 and search key 210 are the same assembled portion of an incoming value, but are nonetheless referred to herein by different names and reference numerals.

The key mask logic 193 receives the key 192 from the assembler circuit 191 and masks selected portions of the key according to a key mask value programmed within the configuration register 137. The resulting masked key 194 is provided to the hash index generator 131. The hash index generator 131 generates a hash index 136 based on the masked key 134. As discussed above, the hash index is used during NFA and search operations to access to location within the memory 133.

Figure 7:
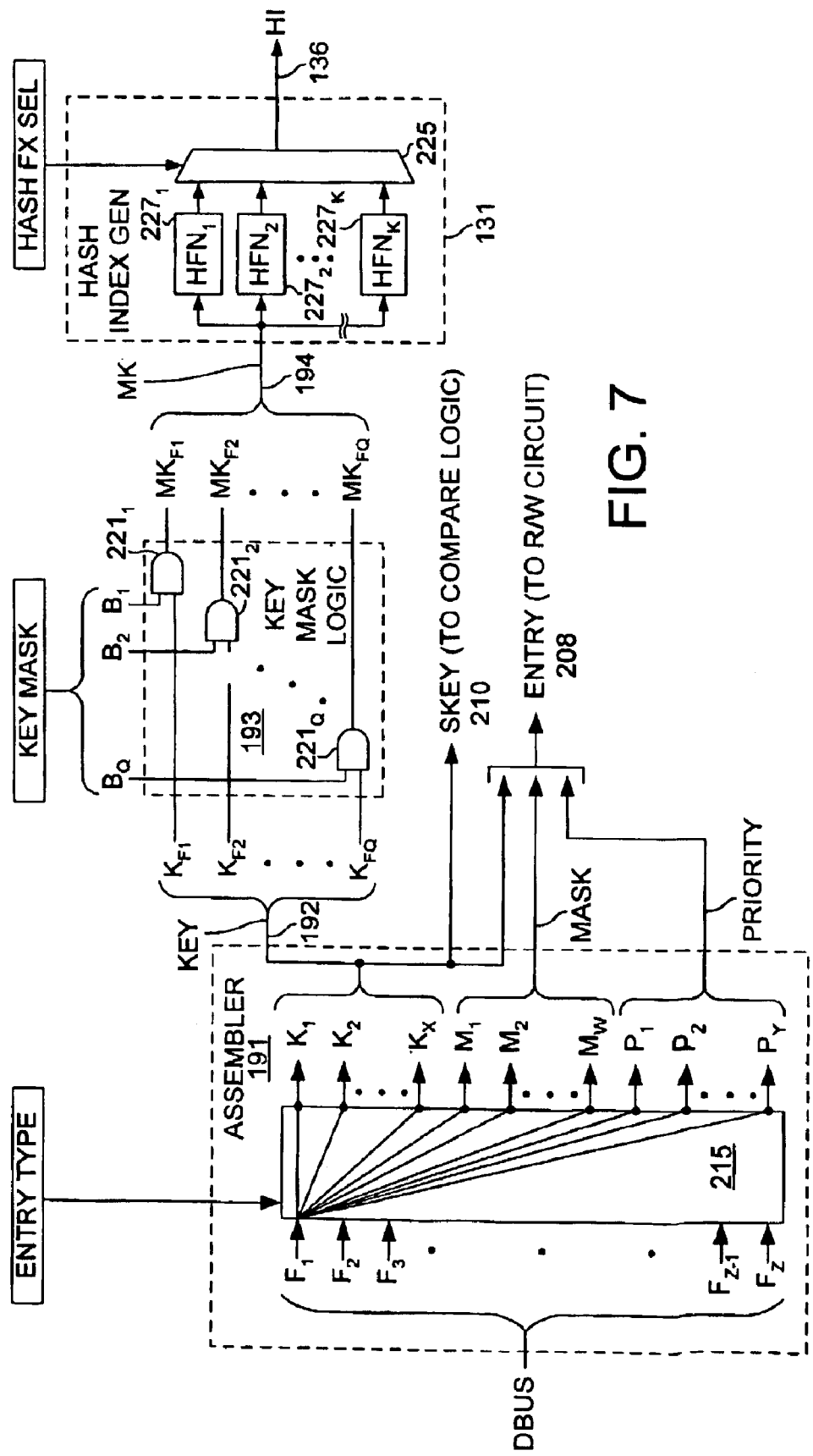
FIG. 7 illustrates an embodiment of the assembler circuit, key mask logic and hash index generator of FIG. 6.

FIG. 7 illustrates an embodiment of the assembler circuit 191, key mask logic 193 and hash index generator 131 of FIG. 6 (other embodiments may be used). Referring first to the assembler circuit 191, bit fields $F_1$-$F_2$ of an incoming data value are assembled according to the programmed entry type value to produce a key having constituent bit fields $K_1$-$K_X$, mask information having constituent bit fields $M_1$-$M_W$, and a priority value having constituent bit fields $P_1$-$P_Y$. As mentioned above, the mask information and/or priority value may be omitted depending upon the entry type of the incoming data value. Also, other entry components such as a control/configuration value may be assembled in alternative embodiments. The complete set of entry components form entry 208 and is output to the read/write circuit, while the key 192 is output to the key mask logic and also, as search key 210, to the compare logic. Note that the constituent bit fields $F_1$-$F_2$ of the incoming data value are not necessarily all the same size. Similarly the constituent bit fields of the key, mask, and priority value may be differently sized.

In one embodiment, Q equally sized bit fields, $K_{F1}$-$K_{FQ}$, within the key 192 are selectively masked by the key mask logic 193 according to a key mask value stored in the configuration register. In one embodiment, for example, each of the Q fields is a 4-bit field that is selectively masked (i.e., forced to a predetermined logic state) by a corresponding bit, $B_1$-$B_Q$, within the key mask value. In the key mask logic 193 of FIG. 7, the bits within a given one of the Q fields are forced to a logic low state by a corresponding one of AND gates $221_1$-$221_Q$ if the corresponding key mask bit is low. In alternative embodiments, the Q fields may each include more or fewer than four bits and may be a single bit. In any case, the resulting masked key 194 is output to the hash index generator 131.

Extending the embodiment to cover ternary searches presents some challenges. In a ternary search, some of the bit fields of a search key (or other portion of the search value) may be masked and are considered as don't cares during a search operation. In the following description, the unmasked portion of a key is called the invariant portion and the masked portion (don't care portion) is called the variant portion. If the hash index were to be calculated on the entire search key, (including the variant and invariant portions of the entry) then the hash index when inserting an entry can potentially be different than the hash index calculated during a search, even through the search value may match the entry (i.e., when selected bits are masked during the compare operation). From a search perspective, introducing the key mask logic 193 effectively isolates the invariant portions of the key 192 both in the insertion as well as the search operations, forming the basis for generation of a unique hash index for each input value. It is not necessary to use the entire invariant portion of the key for hash index generation; it can be a sub-set of the invariant portion. As an example, consider Table 1 below which illustrates how the key mask is chosen and illustrates the operation of a key mask logic circuit. The entries are ternary entries and the variant portions are shown with an 'X'. Each bit of an 8-bit key mask value corresponds to a respective 4-bit field within a 32-bit input key (the symbol 'h' indicates hexadecimal notation and the symbol 'b' indicates binary notation):

TABLE 1

| Entry# | Entry value 192 | Key Mask Value: 1100 0011b After Circuit 193 |
|---|---|---|
| 1 | XX5A5B5Ah | 005A5B00h |
| 2 | FF5A5AXXh | 005A5A00h |
| 3 | FE5A5AXXh | 005A5A00h |

In the above example, the key mask value masks the first and last bytes (i.e., 8 bits) of the input key, thereby establishing the first and last bytes as the variant (don't care) components of the entries and the middle two bytes of the entries as the invariant components of the input key. Note that if two entries are identical after going through the key mask circuit, they will, as in the example above, yield identical hash indices. Conversely, if two inputs keys have different invariant portions, the masked keys will be different and, in general, will yield different hash indices.

As can be seen, the key mask value may be chosen so that the variant portion of all the entries in the search table are in effect set to a known, pre-defined value (in this case binary 0). The search process can be illustrated with an example. If the search key of FF5A5A3Ch is presented, this key goes through the same key mask circuit and will generate the same index as entry #2 in the table, and will also result in a match.

Thus, by programming the key mask value to define a desired invariant component (or components) within an input key, a degree of key masking (i.e., in the variant components) may be achieved within the hash CAM device. This key masking feature may be used to achieve ternary CAM operation within a system that contains multiple hash CAM devices by programming a different key mask value into the configuration register of each hash CAM device, and storing each input value in a CAM device selected according to the invariant/variant key components of the input value. For example, a first hash CAM device may be assigned a key mask value that defines bits 24–31 of an IPv4 destination address as a don't care field (i.e., variant key component)

and bits 0–23 of the destination address as a invariant key component, while a second hash CAM device may be assigned a key mask value that defines bits 16–23 of the IPv4 destination address as variant key component, and bits 0–15 and 24–31 as a invariant key component. Thereafter data values may be loaded into either the first hash CAM device or the second hash CAM device according to whether bits 24–31 or 16–23 may be masked during a search operation. This technique for achieving ternary CAM operation is discussed in further detail below.

Still referring to FIG. 7, the hash index generator 131 includes K hash function circuits $227_1$-$227_K$, each of which applies a different hash function to the masked key 194. A hash function select value stored in the configuration register is used to select, via multiplexer 225, one of the hash index functions $227_1$-$227_K$ to output the hash index 136. By this arrangement different hash CAM devices within a system may be programmed to use different hash functions to reduce the system-wide likelihood of collisions. To understand why different hash function selections reduce collision likelihood, consider an example in which two entries having identical invariant key patterns are stored in hash CAM devices having different hash function selections. During a subsequent NFA operation in which an entry candidate having a different invariant key pattern than the entries is input to both hash CAM devices, the entry candidate may, by happenstance, collide with the entry in one of the hash CAM devices but, due to the different hash function selections, is statistically unlikely to collide with the entries in both of the hash CAM devices. By contrast, if the same hash function is used within each of the two hash CAM devices, happenstance collision between entry candidate stored entry will occur in both CAM devices (i.e., the number of collisions is doubled). Thus, the use of different hash functions in different hash CAM devices within the same system may reduce the system-wide likelihood of collisions.

Still referring to FIG. 7, in one embodiment, the hash index generator 131 includes four hash function circuits $227_1$-$227_4$ each of which generates a respective hash index by dividing the masked key by a different cyclic redundancy check (CRC) polynomial. That is, each of the four hash function circuits 227 is a CRC circuit that generates a different hash index using the same masked key 194. Numerous other hash index generation circuits may be used in alternative embodiments, including encryption circuits, checksum circuits, bit-reordering circuits, or any other circuit to process the search value or a portion thereof to generate a hash index (herein processing a value refers to receiving the value as an input, and generating a different value in response). More generally, while the hash function circuits within the hash index generator are preferably designed to generate non-colliding hash indices for a broad range of input values, any circuits that returns an index (i.e., address) to the memory within the hash CAM block based on all or a selected portion of an input value may be used to implement a hash function circuit 227 without departing from the spirit and scope of the present invention. Also, the assembler circuit 191, key mask logic 193 and hash index generator 131 may viewed collectively to be a hash index generator.

Referring again to FIG. 6, the memory 133 includes a memory array 201, an address decoder 195 coupled to the memory array 201 via a plurality of word lines 204, and a rear/write circuit 197 coupled to the memory array 201 via a plurality of bit lines 206. As discussed above, compare circuits are not integrated with storage elements within the memory array 201 (i.e., the memory array does not include CAM cells) so that a significantly higher storage density may be achieved in memory 133 than in the prior art CAM device of FIG. 1. In one embodiment, the storage elements used to implement the memory array 201 are static random access memory (SRAM) storage cells, though dynamic RAM cells or any other form of storage cells may alternatively be used.

The address decoder 195 receives the hash index 136 from the hash index generator 131 and decodes the hash index to activate one of the word lines 204. The activated word line switchably couples a corresponding row of storage elements within the memory array 201 to the bit lines 206, thereby enabling read and write access to the storage elements (i.e., the selected row). In a memory read, for example, during a NFA or search operation, the contents of the selected row is output via the bit lines 206 to a bank of sense amplifiers within the read/write circuit 197. The sense amplifiers sense the contents of the selected row and output the sensed data to the compare logic as entry 138. In a memory write (e.g., during an insert operation), a bank of write drivers within the read/write circuit 197 drives an entry 208 onto the bit lines for storage within the selected row.

FIG. 8 illustrates address selection logic 235 which, though not shown in FIG. 6, may be included within the hash CAM device to enable selection of memory addresses from different sources. For example addresses may be provided via address but 230 (e.g., to enable testing of the memory array 201). Also, in one embodiment, a register 239 is provided to buffer the hash index generated during a NFA operation. If the indexed location is determined not to be occupied, register 239 may be selected to provide the address for entry storage during a subsequent insertion operation. Also, during a NFA or search operation, the hash index 136 is selected to address the memory 133. Additional address sources may be provided in an alternative embodiment. In the embodiment of FIG. 8 address selection is performed by a multiplexer 235 in response to an address select signal 236 (ASEL). The address select signal 236 may be provided, for example, by the instruction decoder 203 of FIG. 6 or from another source.

Returning again to FIG. 6, the compare logic 135 operates as discussed in reference to FIG. 3 to generate a match flag 134. That is, during a NFA operation, the compare logic 135 outputs a match flag that indicates whether the memory location selected by the hash index is occupied. During a search operation, the compare logic 135 outputs a match flag 134 that indicates whether the search key 210 matches an entry 138 output from a memory location selected by the hash index. A NFA signal 212 from the instruction decoder 203 is provided to the compare logic 135 to select between different match flag sources according to whether a NFA operation or search operation is being performed.

FIG. 9 illustrates an embodiment of the compare logic 135 of FIG. 6. The compare logic 135 receives an entry (i.e., entry 246, mask information 244 and validity value 242) from the memory array and the search key 210 as inputs, and includes a multi-mode comparator 243, mask generator 241, multiplexers 245 and 249, and AND gate 247. The mask generator 241 decodes the mask information 244 into a decoded mask value 248. Multiplexer 245 selects, according to a compare mode value within the configuration register, either the decoded mask value 248 or the mask information 244 to be input to the multi-mode comparator 243 as the selected mask value. Thus, if the mask information represents an encoded mask value (e.g., as in the case of a prefix value included with an IPv4 entry type), the mask generator will decode the prefix value to generate a corresponding decoded mask value, and the compare mode value is programmed to select the decoded mask value 248 for input to the multi-mode comparator 243. Alternatively, if the mask information is a mask value rather than an encoded mask value, the compare mode value may be programmed to select the mask information 244 to be input to the multi-mode comparator 243. One example of an encoded mask value is a prefix length value that indicates the number of unmasked bits within an IPv4 or IPv6 address field. In the case of IPv4, for example, the prefix length value is a 5-bit value that indicates how many bits within a 32 bit address field of an IPv4 packet are to be unmasked. Thus, a n-bit prefix length value may be decoded by mask generator 241 to produce a $2^n$ bit mask value having a mask (and unmask) bit pattern according to the numeric value of the prefix length. For one example, when the prefix length value is 16 (010000 binary), the decoded prefix length value (i.e., decoded mask value) is 0000 0000 0000 0000 1111 1111 1111 1111 binary, where a logic 1 represents a masked bit and a logic 0 represents an unmasked bit. In an alternative embodiment, the mask generator 241 may be a lookup table containing mask values that are selected (i.e., looked up) by the mask information 244; the looked up mask value being output as mask value 248. Alternative mask encoding schemes and mask generation schemes may be used in other embodiments.

The multi-mode comparator receives the entry key 246 and search key 210 and compares the two keys in accordance with the mask value selected by multiplexer 245 and the compare mode indicated by the compare mode value. If entry key and search key are determined to match one another (i.e., after any masking specified by the compare mode and mask value), the multi-mode comparator asserts a match signal 250 to indicate the match detection. If the entry key and search key are determined not to match, the match signal is deasserted. The match signal 250 is logically ANDed with an active low validity value 242 in AND gate 247 to generate a qualified match signal 252. Thus, only a match between the search key and the key of a valid entry will result in assertion of the qualified match signal 252. Multiplexer 249 selects either the qualified match signal 252 or the validity value 242 to be output as a match/empty value 134 according to the state of the NFA signal 212. Thus, when the NFA signal is high (i.e., during a NFA operation), the state of the validity value is output by multiplexer 249 to indicate whether or not the memory location selected by the hash index is occupied. During a search operation, when the NFA signal is low, the qualified match signal 252 is output to indicate whether a match was detected.

Still referring to FIG. 9, in one embodiment, the validity value is a single bit value that is low (e.g., logic 0) to indicate a valid entry and high otherwise. Accordingly, the validity value may alternatively be viewed, and is occasionally referred to herein, as an empty signal that is high (e.g., logic 1) when the entry-sourcing memory location is empty (i.e., does not contain valid data) and low when the memory location is occupied (i.e., contains valid data). Validity signals having more bits and different logic states may be used in alternative embodiments. More generally, alternative embodiments of the compare logic 135 may be used within the hash CAM devices of FIGS. 6 and 3. For example, in one alternative embodiment, the multiplexer 249 and NFA signal 212 are omitted and the existence and location of a next free address within the hash CAM block is determined by circuitry external to the hash CAM device (e.g., a programmed processor that tracks memory usage within the hash CAM device).

In one embodiment, the multimode comparator 243 is capable of performing different types of comparisons according to the programmed compared mode value. Fore example, the compare mode value may indicate a binary comparison, ternary comparison (i.e., comparison in which mismatch conditions are ignored for selected bit positions), range comparisons (i.e., comparison to determine whether search key is greater than or less than a given value) or any combination of binary, ternary and/or range comparisons. In an application where less than all types of comparisons are needed, the multi-mode comparator 243 may be replaced by a comparator that performs only the needed types of comparisons.

FIG. 10 illustrates an embodiment of the multi-mode comparator 243 of FIG. 9 that includes N component comparators $251_1$–$251_N$ (other embodiments may be used). In one implementation, each of the component comparators 251 receives a respective mask value component ($MASK_{C1}$–$MASK_{CN}$), entry key component ($KEY_{C1}$–$KEY_{CN}$) and search key component ($SKEY_{C1}$–$SKEY_{CN}$), and compares the search key and entry key components in accordance with the mask value and in accordance with a respective one of compare mode select signals $CMS_1$–$CMS_N$. The compare mode select signals are component signals of the compare mode value stored in the configuration register. Each of the component comparators 251 outputs a respective component match signal, $CM_1$–$CM_N$, which is ANDed with the component match signals output by the others of the component comparators in AND gate 253. AND gate 253 outputs the match signal 250 to AND gate 247 of FIG. 9.

FIG. 11 illustrates the structure of a component comparator 251 of FIG. 10 according to one embodiment. The component comparator includes compare elements $254_1$–$254_F$, each to compare a sub-field of an entry key component (i.e., sub-fields $K_1$–$K_F$) with a respective sub-field of a search key component (i.e., sub-fields $SK_1$–$SK_F$). Each of the F sub-fields may include one or more bits and each sub-field may include a different number of bits than others of the sub-fields. In the embodiment of FIG. 11, the output of each compare element 254 is high if the corresponding entry key and search key sub-fields match. OR gates $255_1$–$255_F$ receive the outputs of the compare elements $254_1$–$254_F$, respectively, and also receive mask signals from the mask information included within the entry (MASK). The mask information may include bit mask values to selectively mask single-bit sub-fields, and the mask information may additionally include mask values to mask multi-bit sub-fields. The mask value that corresponds to each sub-field is supplied to an input of OR gates $255_1$–$255_F$ and is used to selectively mask a mismatch indication from a corresponding compare element. As an example, if the sub-field comparison within compare element $254_1$ is to be masked, a logic high mask value is input to OR gate $255_1$ so that, regardless of whether compare element $254_1$ indicates a mismatch or a match, the output of logic OR gate 255 will be high, indicating a match condition. If the outputs of all the OR gates $255_1$–$255_F$ are high, AND gate 258 outputs a logic high component match signal 256 (CM) to indicate the match condition. If any of the outputs of compare elements $254_1$–$254_F$ are low (indicating a mismatch condition), and not masked by a corresponding mask value, a logic low signal will be input to AND gate 258, thereby producing a low component match signal 256 to indicate the mismatch condition. In an embodiment in which masking is not required, the OR gates 255 may be omitted from the component comparator of FIG. 11. Also, different logic states may be used in alternative embodiments. Further any circuit may be used to implement the OR gate 255 and/or AND gate 258 including, without limitation, wired OR and wired AND logic.

FIG. 12 illustrates the structure of a component comparator 251 of FIG. 10 according to another embodiment (yet other embodiments may be used). The component comparator 251 includes S compare cells, $257_1$–$257_S$, each to compare a respective bit of an entry key component (i.e., bits $K_1$–$K_S$) with a corresponding bit of the search key component (bits $SK_1$–$SK_S$) in accordance with the state of a corresponding bit of the mask value component (bits $M_1$–$M_S$). In one embodiment, the compare cells are chained to one another via greater-than (GT)/less-than (LT) lines, $260_1$–$260_{S-1}$, to enable numeric range comparisons. Each of compare cells $257_1$–$257_S$ receives a compare mode select signal (CMS) that indicates a compare mode for the corresponding entry and search key components, and each compare cell 257 outputs a match signal which is coupled to a component match line 256. In the embodiment of FIG. 12, the component match line 256 is pulled up to a first reference level (e.g., a supply voltage level) by pull-up circuit 259, and pulled-down to a second reference level (e.g., a ground voltage level) by a mismatch or out-of-range detection within compare cells $257_1$–$257_S$. Different voltage levels and/or logic states may be used to signal match/mismatch in alternative embodiments.

FIG. 13 illustrates a compare cell 257 according to one embodiment. The compare cell 257 receives a search key bit (SK) and complement search key bit (/SK), an entry key bit (K) and complement entry key bit (/K), and a complement mask (/M) as inputs. The compare cell 257 includes a range compare cell 275 to perform a single bit range comparison, and a match compare cell 285 to perform a maskable, bitwise match comparison. The compare mode select signal, CMS, is used to alternately enable the range compare cell 275 and disable the match compare cell 275, or enable the match compare cell 285 and disable the range compare cell 275. More specifically, when the compare mode select signal is high, transistor 282 is switched on to enable operation of the match compare cell 285, and transistor 267 is switched off (i.e., due to the operation of inverter 270) to disable operation of the range compare cell 275. Conversely, when the component compare mode select signal is low, transistor 282 is switched off to disable the match compare cell 285 and transistor 267 is switched on to enable the range compare cell 275.

When the match compare cell 285 is enabled, transistors 276, 278, 277, 279, and 281 cooperate to perform a maskable comparison of the search key bit and entry key bit. Transistor 281 is coupled to receive the complement mask bit, /M, so that when the complement mask bit is low (i.e., mask bit high to mask the compare operation), transistor 281 is switched off, and transistors 276, 278, 277 and 279 are prevented from pulling the match line low, thereby masking any mismatch indication. By contrast, when the active low mask bit is high (i.e., mask bit low to unmask the compare operation), transistor 281 is turned on to enable transistors 276, 278, 277 and 279 to pull the match line 256 low in the event of a mismatch between the search key bit and entry key bit. For example, if the entry key bit is high and the search key bit is low, transistors 279 and 277 will be switched on, pulling the match line low through transistors 281 and 282. Alternatively, if the search key bit is high and the entry key bit is low, transistors 276 and 278 will be switched on, pulling the match line through transistors 281 and 282.

The range compare cell 275, when enabled, signals an out-of-range condition by asserting a logic low signal ($GT_i$) on GT line $260_i$ if either (1) the search key bit is greater than the entry key bit, or (2) the search key bit and entry key bit are equal and a greater-than signal ($GT_{i-1}$) from a less significant compare cell is low. More specifically, if the search key bit is high and the entry key bit is low (i.e., if the search key bit is greater than the entry key bit), then transistors 262 and 264 are switched on to form, along with enabling transistor 267, a path between the GT line $260_i$ and ground, thereby pulling the GT line $260_i$ low. Transistors 266 and 268 are used to couple the $GT_{i-1}$ signal on input GT line $260_{i-1}$ to the GT line $260_i$ if the search key bit and entry key bit are equal. That is, if the search key bit is high (meaning that the search key bit must either be equal to or greater than the search key bit), transistor 266 is switched on to enable the $GT_{i-1}$ signal onto the GT line $260_i$, and if the entry key bit is low (again meaning that the search key bit is equal to or greater than the entry key bit), then transistor 268 is switched on to enable the $GT_{i-1}$ signal onto the GT line $260_i$. Thus, if either transistor 266 or 268 is switched on, a low $GT_{i-1}$ signal (indicating that a less significant portion of the search key component is greater than a corresponding less significant portion of the entry key component), will be propagated to the GT line $260_i$ of range compare cell 275. Referring to FIG. 11, the propagation of a low GT signal continues through the chain of compare cells (from right to left in the exemplary digram of FIG. 11) until the signal is blocked by a compare cell that receives an entry key bit that is greater than the search key bit (i.e., transistors 266 and 268 are both switched off), or until the signal is output from the most significant compare cell in the chain (i.e., compare cell $257_S$ in this example). The GT line $260_S$ driven by the most significant compare cell $257_S$ is coupled to the match line 256, thereby pulling the match line 256 low in the event of an out-of-range condition (i.e., search key component greater than entry key component).

Note that the compare cells $257_1$–$257_S$ may alternatively pull the match line low in response to detecting that the search key component is less than the entry key component (i.e., signal a less-than (LT) condition). Referring again to FIG. 13, for example, instead of comparing the search key bit against the complement of the stored key in transistors 262 and 264, the complement search key bit may be compared against the uncomplemented entry key bit, pulling line $260_i$ (now a LT line) low if the entry key bit is high and the search key bit is low. Similarly transistors 268 and 266 may pass a $LT_{i-1}$ signal from a less significant compare cell to the LT line $260_i$ if the complement search key bit is high (meaning that the search key bit is low) or the entry key bit is high.

In another embodiment, both out-of-range conditions, GT and LT, may be signaled by a single compare cell by using the mask bit to indicate the lower (or upper) boundary of the range definition. In yet another embodiment, a selection may be made between GT and LT range comparisons by selectively multiplexing the key bits applied to transistors 262, 264, 266 and 268. Also, the mask transistor 281 may be omitted from the match compare cell 285 in an alternative embodiment in which maskable compare (i.e., ternary compare) operation is not needed.

Referring again to FIG. 10 each of the component comparators 251 may include any number of compare cells and may include compare cells that are dedicated or configurable to perform range comparisons, ternary comparisons and/or binary comparisons. For example, in alternative embodiments, one or more of the compare cells within component comparators 251 may include only range compare cells 275 and not match compare cells 285, or only match compare cell 285 and not range compare cells 275.

Reflecting on the operation of the hash CAM devices of FIGS. 3 and 6 it should be noted that, in an alternative embodiment, the information maintained in the configuration register 137 may be stored on an entry-by-entry basis within memory 133, effectively enabling multiple search tables to be stored within a single device. In such an embodiment, a hash index may be generated based on a predetermined portion (or all) of a search value. The configuration information within the entry retrieved from the indexed location may then be used to qualify the comparison of the search value and the entry. For example, an entry type within the entry may be compared with a class code associated with the search value to qualify any match detection (i.e., suppress assertion of the match flag 136 if the entry type and class code do not match), mask information within the entry may be used to mask mismatches at selected bit positions of the entry and search key, control information within the entry may be used to select the type of comparison operation to be performed (e.g., binary, ternary and/or range compare) and so forth. In general, any information that may be stored in the configuration register may be stored on an entry by entry basis within the memory 133.

Overflow CAM

Reflecting on the operation of the hash CAM devices described in reference to FIGS. 3 and 6, it should be noted that a host device generally will not know beforehand whether a given data value may be stored within the hash CAM device. That is, except when the hash CAM device is completely empty, a preliminary search (i.e., NFA operation) is used to determine whether a collision with an existing hash CAM entry will occur. If a collision is detected, the data value may not be stored in the hash CAM device and the hash CAM device is said to be conflicted as to that data value. In a system that includes multiple hash CAM devices, a data value that cannot be stored in a conflicted hash CAM device may instead be stored in another hash CAM device. To maintain determinism in the data load operation, all the hash CAM devices in the system may be concurrently instructed to perform a NFA operation, followed by an insert instruction to an unconflicted one of the hash CAM devices. In the event that all the hash CAM devices in the system are conflicted, a data value may be stored in a backup or overflow CAM device that includes an array of CAM cells. Taking this concept a step further, the overflow CAM device may be implemented in the same integrated circuit as the hash CAM device (or multiple hash CAM devices), and control over the CAM devices combined within a unified instruction decoder or other control unit. This approach has the advantage of relieving system level resources (i.e., host processor, instruction buses etc.) from managing load and search operations. In one embodiment, referred to herein as a unified load embodiment, the presence of the hash CAM is hidden from the host altogether by performing both a NFA operation and an insert operation within an integrated hash CAM/overflow CAM device in response to a single load instruction. That is, from the host perspective, the integrated hash CAM/overflow CAM device behaves like a conventional CAM device by deterministically storing a data value (i.e., storing the data value within a known time) in response to a load instruction. In an alternative embodiment, referred to herein as a two-phase load embodiment, a load operation is achieved by issuing a NFA instruction to the integrated hash CAM/overflow CAM device, followed by an insert instruction.

Figure 14:
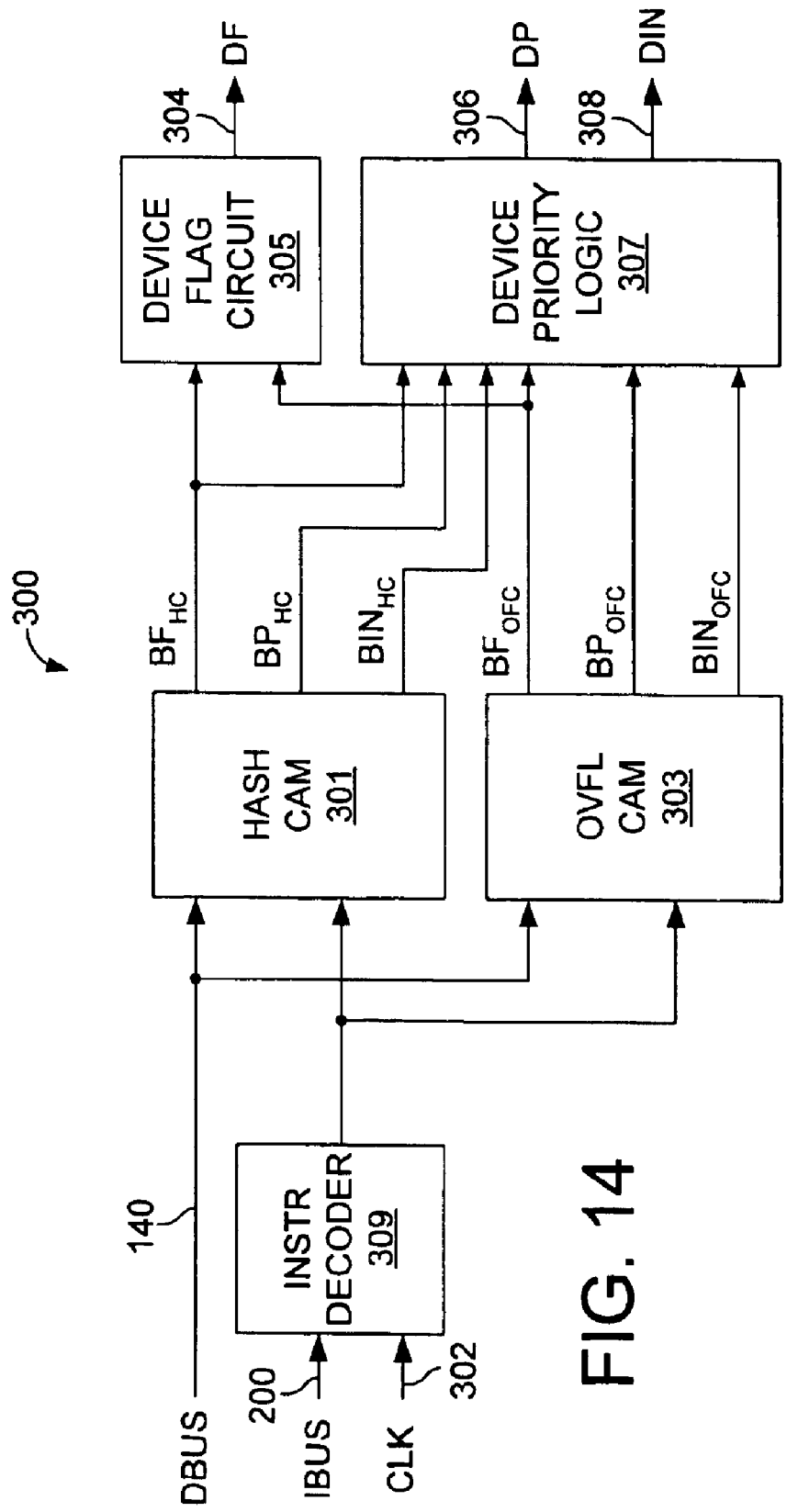
FIG. 14 illustrates a CAM device that includes a hash CAM block and a overflow CAM block.

FIG. 14 illustrates a CAM device 300 that includes both hash CAM and overflow CAM functions in a hash CAM block 301 and overflow CAM block 303, respectively. The hash CAM block 301 may include, for example, the circuit blocks of hash CAM device 130 of FIG. 3 or hash CAM device 190 of FIG. 6. A shared instruction decoder 309 issues control and timing signals to both CAM blocks in response to host instructions received via instruction bus 200 and a clock signal received via clock line 302. A data bus 140 is input to both the hash CAM block and the overflow CAM block, and each of the CAM blocks 301 and 303 outputs a respective block flag ($BF_{HC}$, $BF_{OFC}$), block priority value ($BP_{HC}$, $BP_{OFC}$) and block index ($BIN_{HC}$, $BIN_{OFC}$).

The CAM device 300 also includes a device flag circuit 305 and device priority logic 307. The device flag circuit 305 receives the block flags from the hash CAM and overflow CAM blocks and logically combines the block flags to generate a device flag 304 (DF). In one embodiment, the block flags are combined in an OR operation so that, if either CAM block indicates a match condition, the device flag circuit 305 will assert the device flag 304. The device flag 304 may also be asserted to indicate a full/empty status for the CAM device 300 (e.g., during a non-search operation), or a separate signal or signals may be output for such purposes. Further, additional flags may be output by the flag logic such as a multiple match flag (to be asserted, for example, when more than CAM block indicates a match condition), an almost full flag (to be asserted, for example, when a CAM block reaches a predetermined fill-level), and so forth. The device priority logic 307 receives the block flags, block priority values and block indices from the hash CAM and overflow CAM blocks, and outputs, as a device priority value 306 (DP), a highest priority one of the block priority values for which the corresponding block flag is asserted. The device priority logic 307 also outputs a device index 308 (DIN) that includes a block identifier (block ID) component and a block index component. The block identifier component is a block address that corresponds to the CAM block (301 or 303) that sourced the device priority value, and the block index component is the block index ($BIN_{HC}$ or $BIN_{OFC}$) output by the CAM block indicated by the block ID.

In response to a load instruction (or NFA instruction in the case of a two-phase load embodiment), the instruction decoder 309 initiates a NFA operation within the hash CAM block 301 to determine whether the hash CAM block 301 is conflicted. In response, the hash CAM block outputs 301 a block index ($BIN_{HC}$) and a block flag ($BF_{HC}$) that indicates whether the indicated memory location is empty or occupied. In one embodiment, the instruction decoder 309 does not enable the overflow CAM block 303 to participate in the NFA operation so that the overflow CAM block 303 does not assert a block flag. Consequently, during the NFA operation, the device flag circuit 305 outputs a device flag 304 that corresponds to the state of the hash CAM block flag ($BF_{HC}$) and the device priority logic 307 outputs a device index 308 that includes a block ID that corresponds to the hash CAM block 301 and the hash CAM block index ($BIN_{HC}$). Thus, after a NFA operation within the CAM device 300, the device flag 304 will indicate whether a candidate entry may be stored in the hash CAM block 301 and, if so, the device index 308 will indicate the location within the hash CAM block 301 at which the entry may be inserted (i.e., the insertion address). In a two-phase load embodiment, the host may respond to an asserted device flag signal by issuing an insert instruction to insert the candidate entry at the indicated location within the hash CAM block 301. If the device flag is not asserted, the host may issue an instruction to insert the entry candidate into the next free address within the overflow CAM block 303. In one embodiment, during an insertion into the overflow CAM block 303, the overflow CAM block 303 outputs a next free address (i.e., available location within the overflow CAM block) and a block flag ($BF_{OFC}$) that indicates whether the overflow CAM is full. The overflow CAM block flag is output by device flag circuit 305 as the device flag 304 (the block flag from hash CAM block 301 being deasserted) so that a host device may determine when the overflow CAM block 303 becomes full and cease further instructions to insert collision-producing entry candidates into the overflow CAM block 303.

In an alternative embodiment of the hash CAM device 300, the overflow CAM block 303 participates in a NFA operation by asserting its block flag signal, $BF_{OFC}$, if the overflow CAM block 303 is not full and by outputting the next free address within the overflow CAM as block index, $BIN_{OFC}$. The overflow CAM block 303 further outputs a predetermined block priority value, $BP_{OFC}$, that is lower than the priority value output by an unconflicted hash CAM block 301. By this arrangement, so long as the overflow CAM block 303 is not full, the CAM device 300 will always assert the device flag signal in response to a NFA instruction, and the device priority logic will select, according to which CAM block (301 or 303) outputs the highest priority block priority value in combination with an asserted block flag, one of the block indices, $BIN_{HC}$ or $BIN_{OFC}$, to form the block index component of the device index 308, and will generate a block ID that corresponds to the selected block index. Thus, if the device flag 304 is asserted in response to a NFA instruction, the host device may instruct the CAM device 300 to store the entry candidate at the block and storage location indicated by the device index 308. Note that, in a unified load embodiment, the instruction decoder 309 (or other control circuit within the CAM device 300) may respond to assertion of the device flag 304 and device index 308 by signaling the indicated CAM block (301 or 303) to store the candidate entry at the indicated block index. In either embodiment (i.e., unified or two-phase load), a collision within the hash CAM block 301 will not prevent the CAM device 300 from being able to store an incoming data value. Also, from the perspective of a host device, the unified load embodiment of CAM device 300 responds to a load request by carrying out the instructed load operation. The host device (and therefore the system designer) need not know that the CAM device 300 searches for an insertion address, and system level operation is not impacted by which of the hash CAM block 301 and the overflow CAM block 303 is ultimately selected for entry insertion.

Using Multiple Hash CAM Blocks to Achieve Ternary CAM Operation

As discussed above in reference to FIGS. 6 and 7, the portion of the key used to generate the storage index of an entry and the search index for a matching search key may not be masked without destroying the equality between the two indices. This aspect of hashing operation presents a significant obstacle to ternary CAM operation in which the portion of the search key to be masked varies from one search value to the next.

As discussed above in reference to FIG. 7, the key mask value within a configuration register may be used to define a desired invariant component (or components) within an input key, thereby defining the remainder of the key to be a maskable, variant portion of the key. Consequently, ternary CAM operation in which selected bits of a search value are ignored for match detection purposes, may be achieved at least within the variant portion of the key. In one embodiment of the present invention, this limited ternary CAM operation is extended by providing multiple hash CAM blocks within a CAM device, and by selectively storing entries within the hash CAM blocks according to the locations of the variant portions of their key components (i.e., according to their variant key definitions). For example, all entries having a first variant key definition may be stored in a first hash CAM block (or set of hash CAM blocks), all entries having a second variant key definition may be stored in a second hash CAM block (or set of hash CAM blocks), and so forth. By this arrangement, all or a significant percentage of anticipated variant key definitions may be allocated among the multiple hash CAM blocks (or sets of hash CAM blocks) to achieve a relatively robust ternary CAM operation. Entry candidates having an unassigned variant key definition may be stored in an overflow CAM block.

In one embodiment, a variant key definition is assigned to a given hash CAM block by programming a corresponding key mask value into the configuration register of the CAM block. Thereafter, as part of a NFA operation, the key mask value within each CAM block is compared with a mask code that indicates a variant key definition for the entry candidate (i.e., the mask code indicates which bits within the key of the entry candidate may be masked). Using this approach, the key mask value programmed within each CAM block effectively allocates the hash CAM block to a logical group of hash CAM blocks (or at least one hash CAM block) referred to herein as a mask pool.

The entry type value programmed within the configuration register of each hash CAM block also allocates the hash CAM block to a logical group of one or more hash CAM blocks referred to herein as an entry type pool. In one embodiment, each hash CAM block is allocated to one of a finite number of entry type pools which are used to store only entries having the programmed entry type. For example, a first set of hash CAM blocks may be allocated (i.e., by appropriate assignment of entry type values within their respective configuration registers) to an IPv4 pool, a second set of hash CAM blocks may be allocated to an MPLS pool, a third set of hash CAM blocks may be allocated to a packet classification pool, a fourth set of hash CAM blocks may be allocated to an IPv6 pool, and so forth. Any hash CAM block, in any physical order, can be assigned to any entry type pool.

During a NFA operation, the programmed entry type and key mask value of each hash CAM block are compared with the entry type and key mask value of the entry candidate. Only those hash CAM blocks which fall within the mask pool and entry type pool indicated by the entry candidate are enabled to participate in the NFA operation, with all other CAM blocks being disabled from asserting their block flags (i.e., disabled from indicating an ability to store the candidate entry). Thus, all hash CAM blocks configured with the same key mask value and entry type define a logical pool, called an insertion pool, into which an entry having a matching key mask value and entry type may be asserted.

During a search operation, the entry type for an incoming search value is compared with the entry type of each hash CAM block, and only those hash CAM blocks which have been programmed with a matching entry type are enabled to participate in the search. That is, all hash CAM blocks which do not fall within the indicated entry type pool are disabled from signaling a match.

CAM Device with Multiple Hash CAM Blocks

Figure 15:
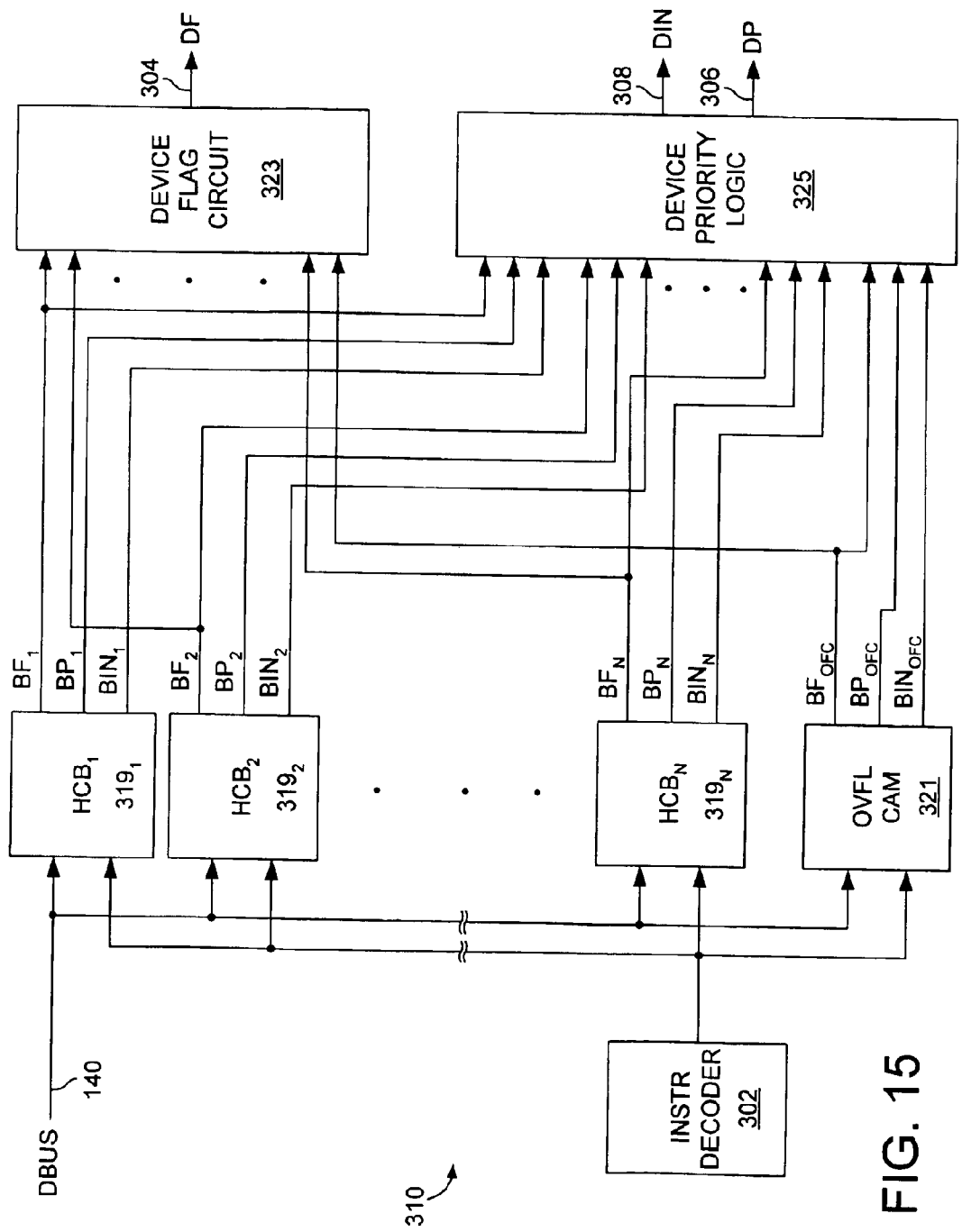
FIG. 15 illustrates an embodiment of a CAM device that includes a multiple hash CAM blocks and an overflow CAM block.

FIG. 15 illustrates an embodiment of a CAM device 310 that includes multiple hash CAM blocks 319$_1$–319$_N$ along with an overflow CAM block 321. Each of the hash CAM blocks 319 outputs a respective block flag (BF$_1$–BF$_N$), block priority value (BP$_1$–BP$_N$), and block index (BIN$_1$–BIN$_N$), as does the overflow CAM block 321 (i.e., BF$_{OFC}$, BP$_{OFC}$ and BIN$_{OFC}$). Device flag circuit 323 receives the block flag signals (BF) from each of the hash CAM blocks 319 and the overflow CAM block 321, and a device priority logic circuit 325 receives the block priority value, block index, and block flag signal from each of the hash CAM blocks 319 and the overflow CAM block 321. The hash CAM device 310 operates similarly to the hash CAM device 300 of FIG. 14 to perform NFA, insert and search operations in response to corresponding signals from an instruction decoder 302. During a search operation, each hash CAM block 319$_1$–319$_N$ and the overflow CAM block 321 is searched concurrently to generate a set of block flags (BF$_1$–BF$_N$, BF$_{OFC}$), block priority values (BP$_1$–BP$_N$, BP$_{OFC}$) and block indices (BIN$_1$–BIN$_N$, BIN$_{OFC}$). The device flag circuit 323 asserts the device flag 304 if any of the block flag signals are asserted. The device priority logic 307 generates a device index and device priority value according to the highest priority block priority value for which the corresponding block flag is asserted. During a NFA operation, each hash CAM block generates a block flag to indicate whether the CAM block is conflicted, and also a block priority value that may be used to select between multiple unconflicted CAM blocks according to a predetermined insertion policy.

Figure 16:
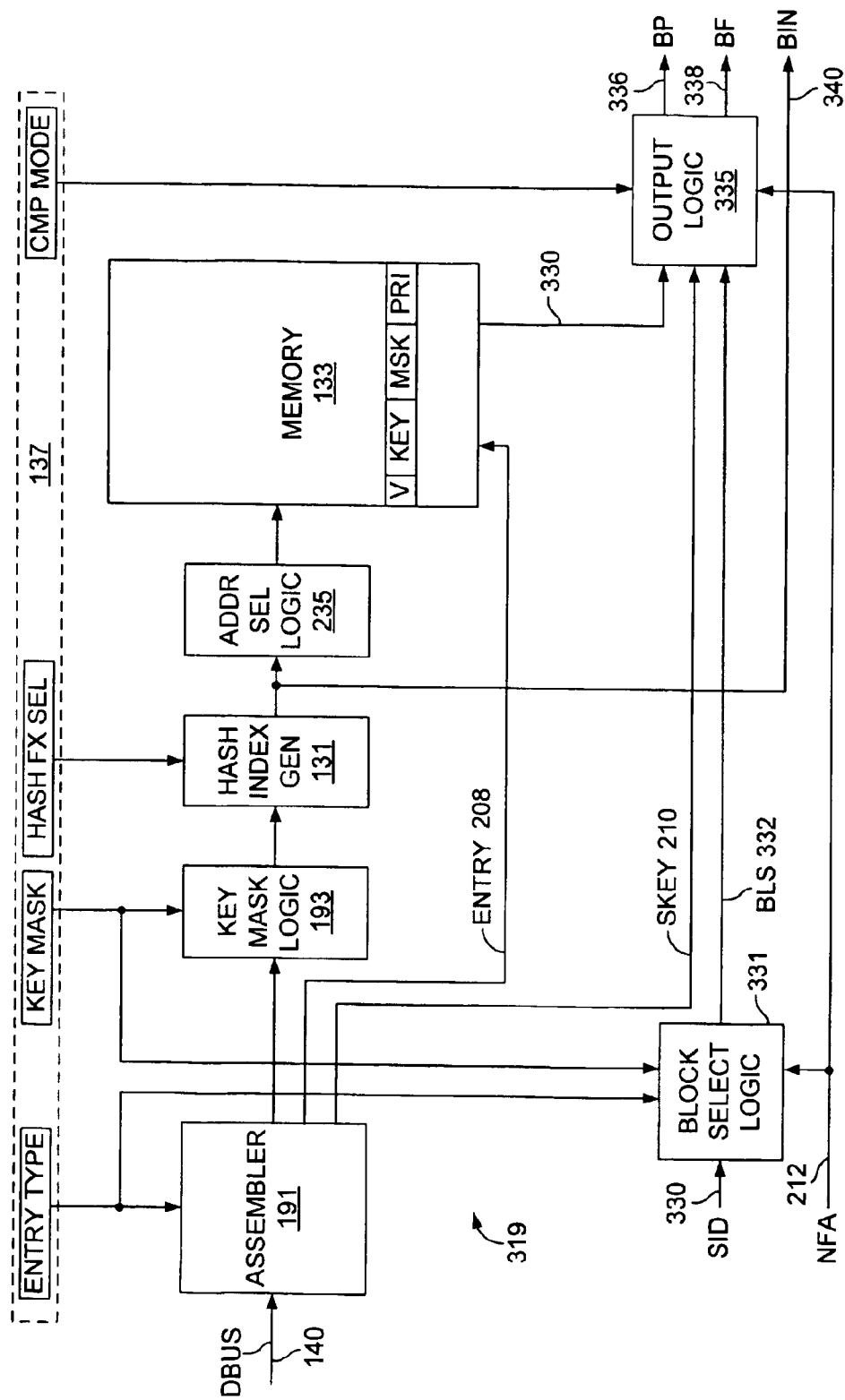
FIG. 16 illustrates the structure of a hash CAM block that may be used within the hash CAM device of FIG. 15.

FIG. 16 illustrates the structure of a hash CAM block 319 that may be used within the hash CAM device 310 of FIG. 15. The hash CAM block 319 includes an assembler circuit 191, key mask logic 193, hash index generator 131, address select logic 235, memory 133 and configuration register 137, all of which operate generally as described in reference to FIGS. 6–8, as well as output logic 335. Referring briefly to FIG. 15, it should be noted that the size of the memory 133 within a given one of the hash CAM blocks 319$_1$–319$_N$ may be different from others of the hash CAM blocks. For example, in one embodiment, some of the hash CAM blocks contain memories with 256 storage rows, while others of the hash CAM blocks contain memories with 512 storage rows. Other sized memories may be used in alternative embodiments.

The hash CAM block 319 further includes block select logic 331 to generate a block select signal 332 according to an incoming search ID value 330 (SID). In one embodiment, the search ID 330 is incorporated or encoded within the operation code or operand of an incoming NFA instruction or search instruction. In a NFA instruction, the search ID includes a mask code and class code that correspond to a key mask value and entry type value, respectively, and therefore specify an insertion pool. The block select logic compares the mask code and class code against the key mask and entry type values, respectively, programmed into the configuration register 137. If the specified codes match the programmed values, the block select logic 331 asserts the block select signal 332 to enable the output logic 335 to assert the block flag 338 (i.e., if no collision is detected). If the codes do not match the programmed values (i.e., the specified insertion pool does not match the programmed insertion pool), the block select logic 331 deasserts the block select signal 332 to disable the output logic 335 from asserting the block flag 338, thereby preventing the hash CAM block from being selected for entry insertion.

In a search instruction, the search ID includes a class code, but no mask code. Accordingly, the block select logic 331 compares only the programmed entry type value with the class code. If the class code and programmed entry type match (i.e., programmed entry type pool matches the search-specified entry type pool), the block select signal 332 is asserted to enable the output logic 335 to assert the block flag 338 (i.e., if a match is detected between search value and entry). If the programmed and specified entry type pools do not match, the block select signal 332 is deasserted to disable the output logic 335 from asserting the block flag 338. Note that, in alternative embodiments, the block select signal 332 may be applied to any other circuit blocks within the hash CAM block to prevent operation of those circuits (e.g., to save power) in the event of a mismatch between the search ID and programmed value(s).

FIG. 17 illustrates an embodiment of the block select logic 331 of FIG. 16 (other embodiments may be used). The block select logic 331 includes a pair of comparators 343 and 345, AND gate 347 and a multiplexer 349. As shown, an input search ID 330 includes a class code (CC) that specifies an entry type pool and, in a NFA operation, a mask code (MC) that specifies a mask pool. During a NFA operation, the mask code is compared to the key mask value in comparator 345 and the class code is compared with the entry type value in comparator 343, the key mask and entry type values being stored within the configuration register of the hash CAM block. If the entry type matches the class code and the key mask matches the mask code, both inputs to AND gate 347 will be high resulting in a logic high output to a first input port of the multiplexer 349. The NFA signal 212 is high during the NFA operation, causing the multiplexer 349 to select the output of AND gate 347 to drive the block select signal 332. Thus, during a NFA operation, the block select signal 332 will have a high or low state according to whether the insertion pool specified by the search ID matches the insertion pool defined by the programmed key mask and entry type values.

During a search operation, the NFA signal is low so that the multiplexer 349 selects the output of comparator 343 to set the state of the block select signal 332. Consequently, during a search operation, the block select signal 332 will have a high or low state according to whether the entry type pool specified by the search ID matches the entry type pool indicated by the programmed entry type value.

FIG. 18 illustrates an embodiment of the output logic 335 of FIG. 16 (other embodiments may be used). The output logic 335 includes the compare logic 135 discussed above in reference to FIG. 6 as well as AND gate 355 to disable assertion of the block flag 338 if the block select signal 332 is not asserted (i.e., to a logic high state in this example).

The block priority value 336 output during a NFA operation is referred to herein as an insert priority value, and is compared with insert priority values output by other hash CAM blocks to select one of a number of available hash CAM blocks to store the input value. During a search operation, by contrast, the priority component (PRI) of the indexed entry 138 (referred to as a search priority value) is output as the block priority value 336. The output logic 335 includes a multiplexer 359 to select, either an insert priority value or the search priority value to be output as block priority value 336 according to the state of the NFA signal 212. That is, if the NFA signal is low, indicating a search operation, the priority component of entry 138 is selected to be output as the block priority value 336. If the NFA signal is high, indicating a NFA operation, an insert priority value is selected. In one embodiment, the insert priority value is a predetermined priority value (zero in this example). Alternatively, in an embodiment that implements a capacity-dependent insertion policy, the insert priority value is maintained in a R-bit fill counter 357 that is incremented in response to an insertion operation within the hash CAM block (in which case signal WR is asserted, for example, by the instruction decoder) and decremented in response to a delete operation within the hash CAM block (in which case signal DEL is asserted). Thus, the insertion priority value indicates the fill level of the hash CAM block, and, when output as block priority value 336, enables the device priority logic 325 of FIG. 15 to select between multiple unconflicted hash CAM blocks (i.e., for entry insertion) on the basis of which is most or least filled.

FIG. 19 illustrates an embodiment of the device priority logic 325 of FIG. 15 (other embodiments may be used). (Note that the device priority logic 325 may also be used in the hash CAM block of FIG. 14; a case in which there is only one hash CAM block). The device priority circuit 325 includes a priority compare circuit 361, priority encoder 363 and index selector 365. As discussed in reference to FIG. 15, the device priority logic 325 receives the block flags, block priority values and block indices from each of N hash CAM blocks (i.e., $BF_1-BF_N$, $BP_1-BP_N$, and $BIN_1-BIN_N$) and also the block flag, block priority value and block index from the overflow CAM device ($BF_{OFC}$,$BP_{OFC}$,$BIN_{OFC}$), and outputs a highest priority one of the block priority values, for which the corresponding block flag signal is asserted, as a device priority number 306 (DP). Herein, a block priority value for which the corresponding block flag signal is asserted is referred to as a match-qualified block priority value, and, conversely, a block priority value for which the corresponding block flag signal is deasserted is referred to as a disqualified block priority value. During a given NFA or search operation, disqualified block priority values are disabled from participation in a priority number comparison operation (e.g., by being forced to a lowest possible priority value) such that only a match-qualified block priority value may be output as the device priority number. In one embodiment, if all the block priority values are disqualified (i.e., no match signals are asserted), a lowest possible priority number is output as the device priority number 306.

The priority compare circuit also outputs a plurality of qualified match signals $366_1-366_{N+1}$, each of which corresponds to a respective one of the N+1 CAM blocks (i.e., match signals $366_1-366_N$ correspond to the N hash CAM blocks 319 and match signal $366_{N+1}$ corresponds to the overflow CAM block 321). Each qualified match signal, if asserted, indicates that the corresponding CAM block sourced (i.e., output to the priority compare circuit) the device priority number. The priority encoder 363 encodes the qualified match signals into a block identifier (BID) that identifies the CAM block that sourced the device priority number. Note that multiple CAM blocks may source the device priority number (a multiple match condition), in which case the priority encoder generates a block identifier according to a predetermined tie resolution policy. For example, in one embodiment, the priority encoder generates a block identifier that identifies the lowest numbered one of the CAM blocks for which qualified match signals are asserted. In one embodiment, for example, the lowest numbered one of the CAM blocks is the CAM block having the lowest physical address for the memory address space spanned by the hash CAM blocks. Different priority encoding policies may be used in alternative embodiments.

Still referring to FIG. 19, the block identifier is supplied to the index selector where it is used to select the block index output by the identified CAM block as a selected block index ($BIN_{SEL}$). In one embodiment, the index selector is a multiplexer circuit that selects the block index to be output as $BIN_{SEL}$ in response to the block identifier. Together, the block identifier and the selected block index constitute the device index, DIN.

Figure 20:
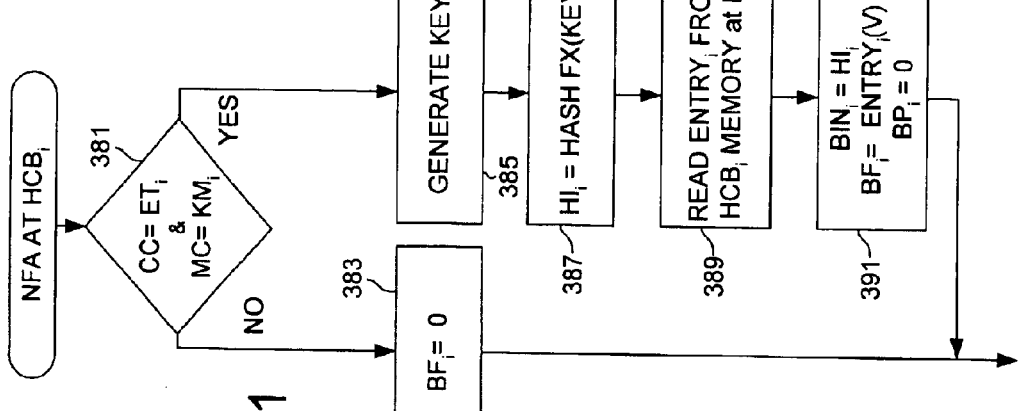
FIG. 20 is a flow diagram of a NFA operation within the hash CAM device of FIG. 15.

FIG. 20 is a flow diagram of a NFA operation within the hash CAM device of FIG. 15. In response to a NFA signal from the instruction decoder, NFA operations are performed concurrently within each of the N hash CAM blocks at $375_1-375_N$ to generate a corresponding set of N block priority values and N block flags. At 377, a block identifier (BID) is generated by priority encoding the match-qualified block priority values. Also at 377, the block index that corresponds to the block ID is chosen to be the selected block index, $BIN_{SEL}$. At 379, a device flag (DF) is generated by logically ORing the block flag signals received from the hash CAM blocks, and the device index (DIN), formed by the block identifier and selected block index, is output.

Still referring to FIG. 20, it should be noted that the block flag signal and block priority value from the overflow CAM device may also included in the block identifier, block index selection and device flag generation operations. In one embodiment, block flag signal from the overflow CAM, $BF_{OFC}$, is suppressed during a NFA operation (i.e., disabled from being asserted), so that the overflow CAM device is not identified by the block ID and does not contribute the device flag generation. In an alternative embodiment, discussed below, the overflow CAM device is enabled to participate in a NFA operation.

Figure 21:
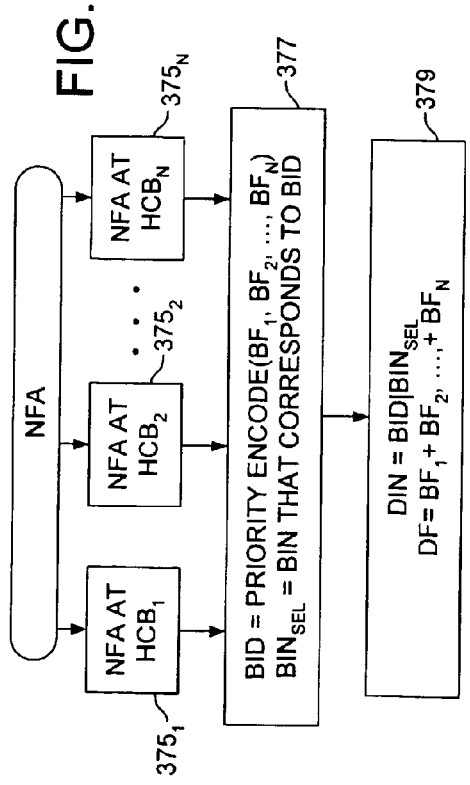
FIG. 21 is a flow diagram of a NFA operation within the hash CAM block of FIG. 16.

FIG. 21 is a flow diagram of a NFA operation within an $i^{th}$ one of the hash CAM blocks of FIG. 15, i being an integer value between 1 and N, inclusive. At 381, the class code of the NFA instruction (CC) is compared with the entry type of the CAM block ($ET_i$), and the mask code of instruction (MC) is compared with the key mask of the CAM block ($KM_i$). If the class code matches the block entry type and the mask code matches the block key mask, then at 385, a key is generated from a selected portion of the incoming value. A hash index is generated based on the key at 387, and at 389 an entry is read from the hash block memory at the location indicated by the hash index. Finally, at 391, the hash index is output as the block index; the validity value of the entry read from memory is output as the block flag; and a predetermined value (e.g., 0) or, in an alternative embodiment, a value indicative of the block fill level is output as the block priority value. If, at 381, the class code does not match the block entry type, or the mask code does not match the block key mask, the block flag is deasserted at 383.

Figure 22:
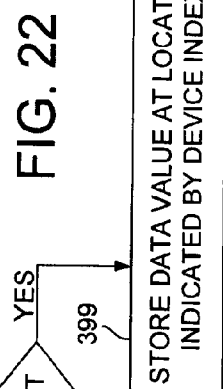
FIG. 22 illustrates an insert operation within the hash CAM device to FIG. 15.

FIG. 22 illustrates an insert operation within the hash CAM device of FIG. 15. The device flag is evaluated at 395. If the device flag is not set, then no hash CAM block asserted its block flag during a preceding NFA operation, and the data value is stored in the overflow CAM (397). If the device flag is set, then at least one hash CAM block is available to store the data value, and the data value is stored at the location indicated by the device index (399).

Figure 23:
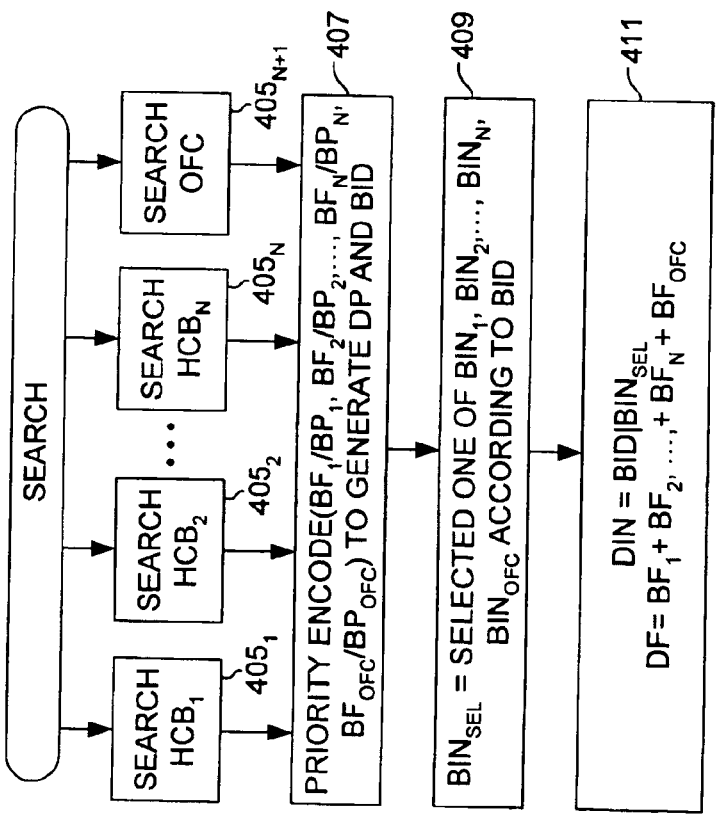
FIG. 23 illustrates a search operation within the hash CAM device of FIG. 15.

FIG. 23 illustrates a search operation within the hash CAM device of FIG. 15. At $405_1-405_{N+1}$, each of the N hash CAM blocks and the overflow CAM block are searched in parallel to generate a set of blocks flags, block priority values, and block indices. At 407, a block identifier (BID) and device priority (DP) are generated by priority encoding the block flags according to the block priority values. At 409, one of the N+1 block indices (i.e., $BIN_1$, $BIN_2$, . . . $BIN_N$ or $BIN_{OFC}$) is selected according to the block identifier to be $BIN_{SEL}$, the selected block index. At 409, the block identifier and selected block index are output to form the device index (DIN), and the device flag (DF) is generated by logically ORing the block flags from the hash CAM blocks and overflow CAM block.

Figure 24:
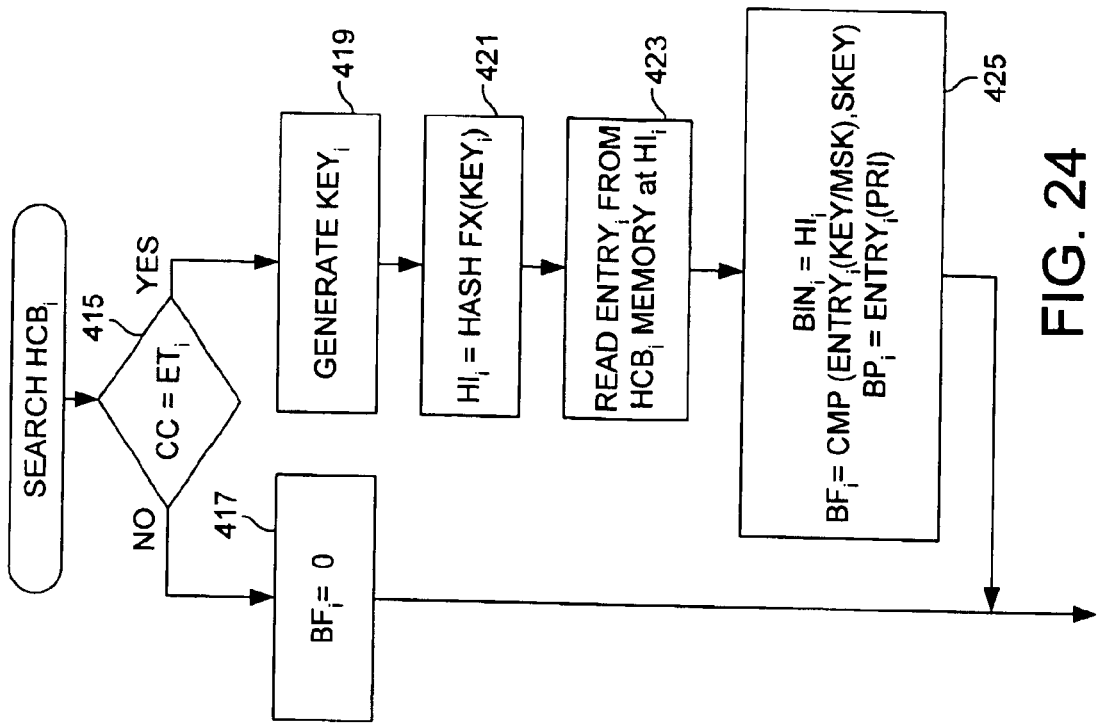
FIG. 24 illustrates a search operation within a hash CAM block of FIG. 15.

FIG. 24 illustrates a search operation within a hash CAM block of FIG. 15. At 415, the class code of the incoming search instruction (CC) is compared with the entry type ($ET_i$) of the hash CAM block. If the class code does not match the entry type, the block flag ($BF_i$) is deasserted at 417 and the search operation is concluded. If the class code does match the entry type, then a key is generated at 419, and used to generate a hash index at 421. At 423, an entry is read from the hash CAM block memory at a location indicated by the hash index. At 425, the block index is assigned to be the hash index and output from hash CAM block. Also at 425, the block flag ($BF_i$) is asserted or deasserted according to whether the search key matches the entry key (i.e., after accounting for any masking indicated by the mask information within the entry), and the priority field of the entry is output as the block priority value ($BP_i$).

Figure 25:
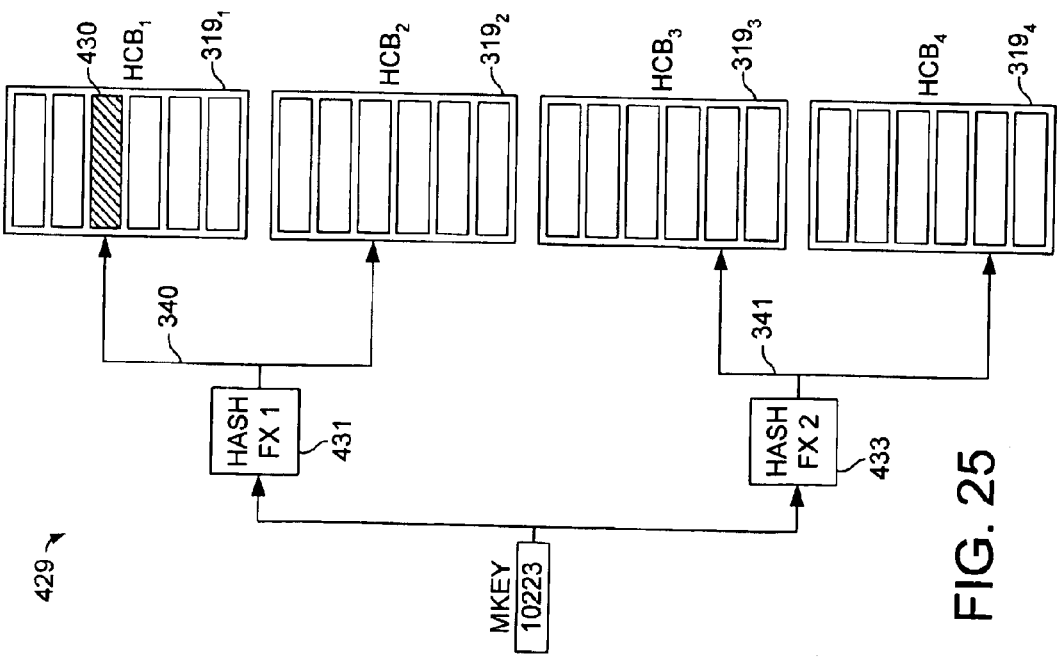
FIG. 25 illustrates a NFA operation within an exemplary CAM device having four hash CAM blocks, each of which outputs a fixed insert priority value.

FIG. 25 illustrates a NFA operation within an exemplary CAM device 429 having four hash CAM blocks, $319_1$–$319_4$, each of which outputs a fixed insert priority value. For simplicity, each hash CAM block is depicted as having six storage locations, with hash CAM blocks 1 and 2 ($319_1$, $319_2$) programmed to select the hash index generated by a first type of hash function circuit 431 and hash CAM blocks 3 and 3 ($319_3$, $319_4$) programmed to select a hash index generated by a second type of hash function circuit 433. Thus, for a given masked key value (MKEY), the hash indices generated within hash CAM blocks 1 and 2 will be the same (i.e., index 340), and the hash indices generated within CAM blocks 3 and 4 will be the same (i.e., index 341), but, except in cases of coincidence, index 340 will be different from index 341. Also for simplicity, the key mask values and entry type values programmed within the four hash CAM blocks are assumed to be the same (i.e., all four hash CAM blocks are in the same insertion pool).

Because all four hash CAM blocks $319_1$–$319_4$ are initially empty, each hash CAM block will respond during a NFA operation by asserting its block flag and outputting the same fixed block priority value. Thus, the device priority logic (i.e., element 325 of FIGS. 15 and 19) will select one of the hash CAM blocks according to a predetermined, hardwired tie resolution policy. In this particular example, lower numbered hash CAM blocks (e.g., those with lower physical addresses) are given higher priority over higher numbered hash CAM blocks so that, even though all four hash CAM blocks output the same priority number, the device priority logic will generate a block identifier (BID) that corresponds to hash CAM block 1 ($319_1$). (In alternative embodiments, different tie resolution policies may be used, and a value within the block configuration register may be used to select between multiple tie resolution policies). Thus, in the example of FIG. 25, hash index 340 and a block identifier for hash CAM block 1 form the device index output by the CAM device 429. Accordingly, during an ensuing insert operation, an entry is stored in hash CAM block 1 at the location pointed to by hash index 340. This location within the hash CAM device (i.e., location 430) is referred to herein as an insertion address, and is indicated in FIG. 25 by a lined shading pattern.

Figure 26:
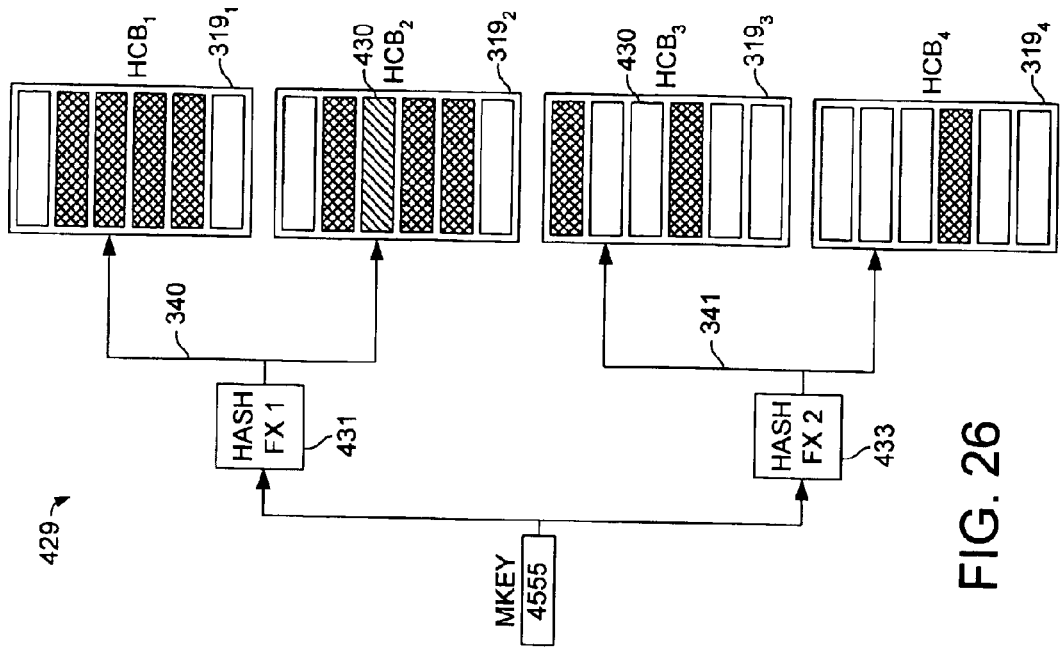
FIG. 26 illustrates an exemplary NFA operation within the hash CAM device of FIG. 25 after a number of entries have been loaded.

FIG. 26 illustrates an exemplary NFA operation within the hash CAM device 429 of FIG. 25 after a number of entries (indicated by cross-hatched shading) have been loaded into the hash CAM blocks $319_1$–$319_4$. During the NFA operation, hash CAM block 1 deasserts its block flag to signal its inability to store the data value that produced the masked key because an entry has previously been inserted at the indexed location. That is, hash CAM block 1 is conflicted due to a collision between index 340 and the index generated by a previously loaded entry. Hash CAM blocks 2, 3 and 4, on the other hand, are unconflicted and each asserts its block flag and outputs the fixed insert priority value. Thus, each of the hash CAM blocks 2, 3 and 4 provides the same match-qualified priority value to the device priority logic which, in this example, is hardwired to resolve ties in favor of the lowest numbered hash CAM block. Accordingly, as indicated by insertion address 430, hash CAM block 2 is selected to store the new entry in this example.

Figure 28:
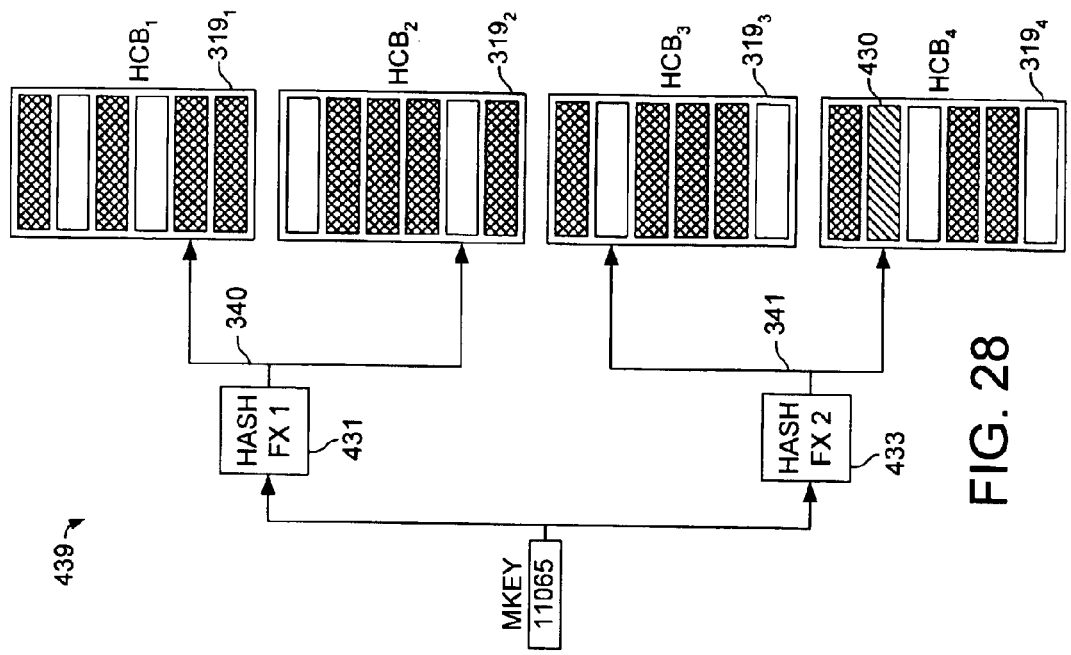
FIGS. 27 and 28 illustrate NFA operations within a hash CAM device that implements a capacity-dependent insertion policy.
Figure 27:
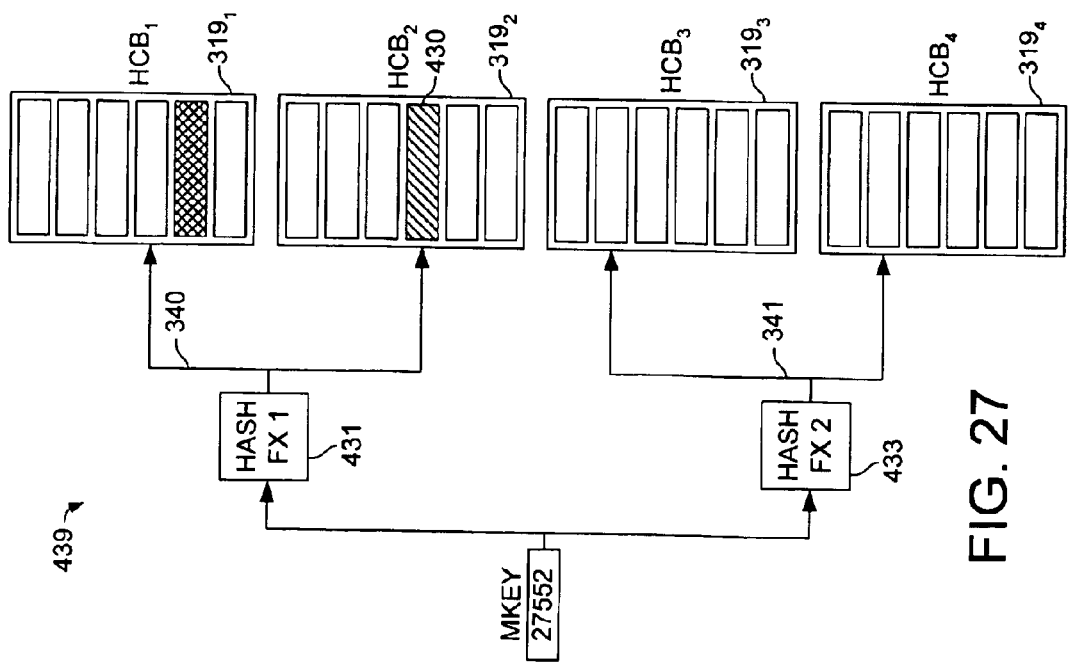

FIGS. 27 and 28 illustrate NFA operations within a hash CAM device 439 that is identical to the exemplary hash CAM device 429 of FIGS. 25 and 26 except that the hash CAM device 439 implements a capacity-dependent insertion policy. In the examples of FIGS. 27 and 28, each hash CAM block responds to a NFA instruction by outputting a priority value that is proportional to its fill level. Referring specifically to FIG. 27, hash CAM blocks 2, 3 and 4, being completely unfilled, output numerically lower insert priority values than hash CAM block 1, which contains a previously loaded entry. In an embodiment in which numerically lower values indicate a higher priority than numerically higher values (the case in the example of FIG. 27), hash CAM blocks 2, 3, and 4 will each output a match-qualified priority number having a higher priority than the match qualified priority number output by hash CAM block 1, with hash CAM block 2 ultimately being selected by the device priority logic (i.e., by hardwired tie resolution logic) for entry insertion. Note that, had fixed insert priority values been used, hash CAM block 1 would have sourced the same match qualified priority number as hash CAM blocks 2, 3 and 4 and would have been selected for entry insertion by the hardwired tie resolution logic.

FIG. 28 illustrates an exemplary NFA operation within the hash CAM device 349 of FIG. 27 after a number of entries have been loaded into the hash CAM blocks $319_1$–$319_4$. In this example, hash CAM block 1 ($319_1$) is conflicted, but hash CAM blocks 2, 3 and 4 are not Hash CAM blocks two and three each contain four previously loaded entries, however, while hash CAM block 4 contains only three previously loaded entries. Consequently, hash CAM block 4 ($319_4$) will output a lower priority number than hash CAM blocks 2 and 3, and therefore be selected for entry insertion. Note that, had fixed insert priority values been used, hash CAM blocks 2, 3 and 4 would each have output the same match-qualified priority number, thereby causing CAM block 2 to be selected for entry insertion according to the hardwired tie resolution policy.

Although FIGS. 27 and 28 illustrate NFA examples using a least-filled insertion policy, a most-filled insertion policy (i.e., policy which favors a more-filled rather than a less filled hash CAM block for entry insertion purposes) may be applied instead. A most-filled insertion policy may be implemented, for example, by using an empty counter rather than the fill counter 357 within the output logic 355 of FIG. 18. The empty counter may be preloaded to a predetermined value, then decremented in response to each insertion event (i.e., insertion of an entry within the corresponding hash CAM block) and incremented in response to each delete event. Referring to FIG. 27, in such an embodiment, hash CAM block 1 would output a numerically lower (higher priority) priority value than hash CAM blocks 2, 3 and 4 due to the previously inserted entry. Similarly, if a most-filled insertion policy was used in the example of FIG. 28, either hash CAM block 2 or 3 would be selected over hash CAM block 4 due to the fact that hash CAM blocks 2 and 3 are more filled than hash CAM block 4. Note that hash CAM block 1 remains conflicted and therefore unable to store the candidate entry, and that the selection between hash CAM blocks 2 and 3 may be determined by a hardwired or programmable tie resolution policies.

Hash CAM Device having Shared Key/Hash Index Generation Circuitry

Figure 30:
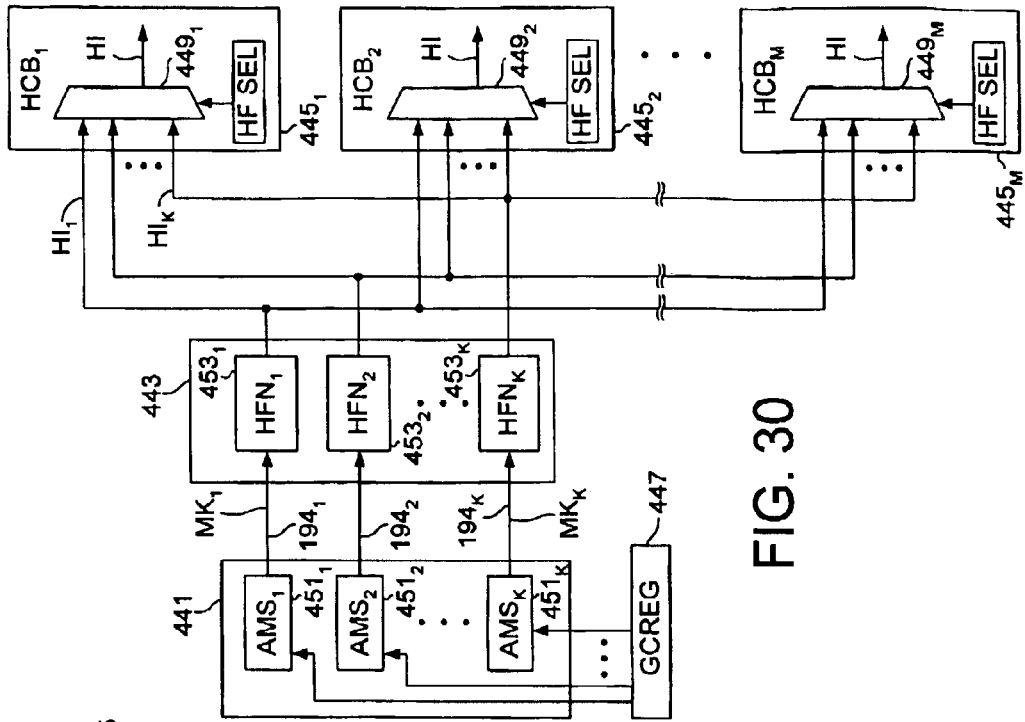
FIG. 30 illustrates a more detailed embodiment of the assembler/mask circuit and hash index generator of FIG. 29.
Figure 29:
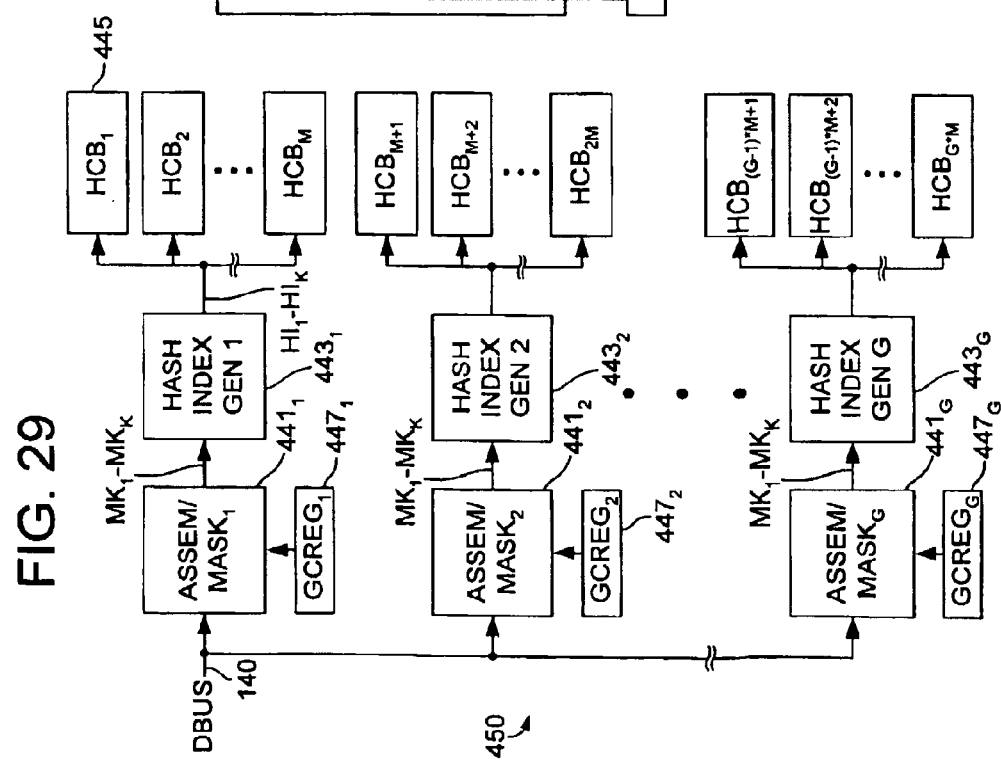
FIG. 29 illustrates an alternative embodiment of a CAM device that includes multiple hash CAM blocks.

FIG. 29 illustrates an alternative embodiment of a CAM device 450 that includes multiple hash CAM blocks 445. In the CAM device 450, the hash CAM blocks 445 are organized into G groups of M hash CAM blocks each, with each hash CAM block operating as described in reference to the previous figures, and with each group of hash CAM blocks sharing a respective assembler/mask circuit $441_1$–$441_G$ and hash index generator $443_1$–$443_G$. A group configuration register $447_1$–$447_G$ is associated with each group of hash CAM blocks and used to control the operation of the corresponding assembler/mask circuit. FIG. 30 illustrates a more detailed embodiment of the assembler/mask circuit 441 and hash index generator 443 of FIG. 29. As shown, the assembler/mask circuit 441 includes K assembler/mask subcircuits, $451_1$–$451_K$, each coupled to provide a respective masked key, $194_1$–$194_K$, to a corresponding one of K hash function circuits $453_1$–$453_K$ within the hash function generator 443. Each assembler/mask subcircuit includes an assembler subcircuit and key mask logic subcircuit that operate in the manner described above in reference to the assembler circuit 191 and key mask logic 193 of FIG. 6 to generate an assembled, masked key. In one embodiment, the group configuration register 447 includes a set of K entry type values that are input, respectively, to the K assembler/mask subcircuits $451_1$–$451_K$ to enable each assembler/mask subcircuit to be configured to output a different masked key based on the same incoming data value. By this arrangement, each hash function circuit $451_1$–$453_K$ may receive a different masked key. Each of the M hash CAM blocks within a given group (i.e., $445_1$–$554_M$) includes a configuration circuit that may be programmed with a respective hash function select value (HFSEL) and includes a hash function select circuit $449_1$–$449_M$ to select, according to the programmed hash function select value, one of the K hash indices, $HI_1$–$HI_K$, generated by the hash index generator 443. Accordingly, each hash CAM block within the group may receive a hash index which has been generated according to a selected entry type, key mask and hash function. Comparing the hash CAM device 450 to the hash CAM device of FIG. 15, the total number of hash index generator circuits is reduced by a factor of M while retaining independent configurability for each hash CAM block 445. Note that in an alternative embodiment, the groups of hash CAM blocks depicted in FIG. 29 need not all include the same number of CAM blocks. Also, while embodiments of hash CAM blocks are described below as including a dedicated assembler circuit, key mask logic and hash index generator, such hash CAM blocks may be modified to operate with the shared assembler/mask circuit 441 and shared hash index generator 443 of FIGS. 29 and 30.

Hash CAM Block with Segmented Memory

Figure 31:
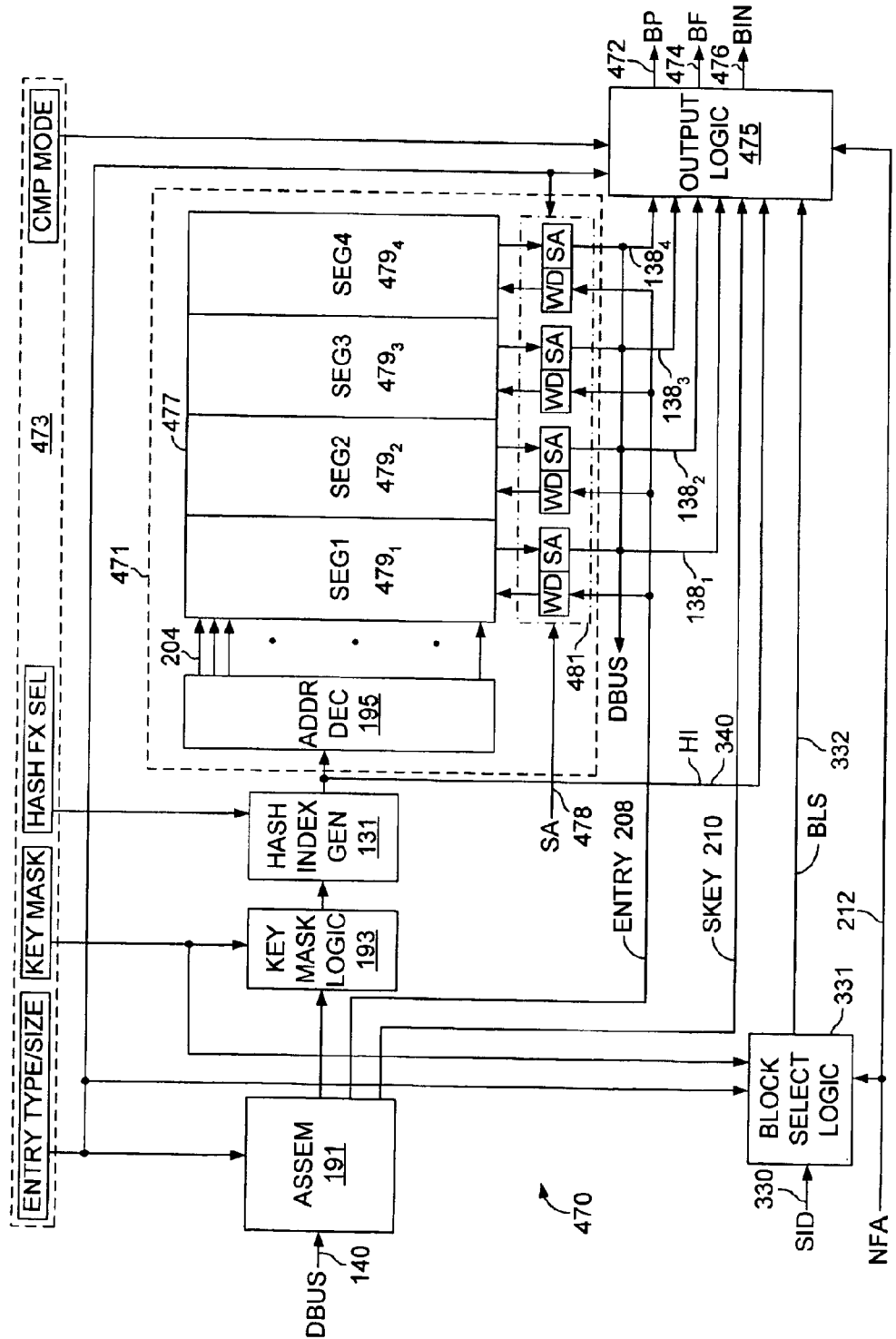
FIG. 31 illustrates an embodiment of a hash CAM block that includes a segmented memory.

FIG. 31 illustrates an embodiment of a hash CAM block 470 that includes a segmented memory 471 and which may be used within any of the multiple hash CAM block devices or single hash CAM block devices described above. The hash CAM block 470 includes an assembler circuit 191, key mask logic 193, hash index generator 131 and block select logic 331 that operate generally as described above in reference to FIG. 16. The segmented memory 471 includes an address decoder 195, read write circuit 481 and segmented memory array 477. The address decoder 195 responds to a hash index 340 from the hash index generator 131 by activating one of a plurality of word lines 204 in the manner described above in reference to FIG. 6. Each word line 204 is shared among each of four segments $479_1$–$479_4$ within the segmented memory array 477 (more or fewer segments may be used to form the memory array in alternative embodiments), so that the activated word line enables read and write access to a row of storage cells that spans all four segments. During a NFA or search operation, the contents within the entire row of storage cells (i.e., the contents of the word-line indicated location within each of segments $479_1$–$479_4$) are sensed by a set of four sense amplifier banks (SA) within the read/write circuit 481 and output as a set of four entry segments $138_1$–$138_4$ to an output logic circuit 475. During an insert operation, a segment address 478 (SA) is provided to the read/write circuit 481 to select one or more of write driver banks (WD) within the read/write circuit 481 to store an entry within the corresponding segment or segments 479.

The hash CAM block 470 includes a configuration register 473 that is similar to the configuration register 137 described in reference to FIGS. 6 and 16, except that the entry type value within the configuration register includes an entry size field which specifies the size (i.e., number of constituent bits) of entries stored within the segmented memory 471. In the embodiment of FIG. 31 for example, entries which span 1, 2, or 4 segments may be stored within the segmented memory. Such values are referred to herein as x1, x2, and x4 entries and correspond to x1, x2, and x4 operating modes of the CAM block 470 selected by the entry size field. In alternative embodiments that include more or fewer memory segments 479, entries may span different numbers of segments.

The entry size field within the entry type value (collectively designated an entry type/size value in FIG. 31 to emphasize the presence of entry size information) is provided to the read/write circuit 481 to control which of the segments 479 are accessed in a read or write access to the segmented memory array 477. For example, during an insert operation in the x1 mode, a 2-bit segment address 478 is provided to the read/write circuit 481 to enable one of four write driver circuits (WD) within the read/write circuit 481 to store a x1 entry in a corresponding one of the memory array segments 479. During an insert operation in the x2 mode, the least significant bit of the 2-bit segment address 478 is ignored, and the most significant bit of the segment address value is used to enable one of two pairs of write driver circuits to store a x2 entry in segment pair $479_1$/$479_2$ or $479_3$/$479_4$, respectively. During an insert operation in the x4 mode, both bits of the segment address 478 are ignored and all four writ driver circuits within the read/write circuit 481 are enabled to store a x4 entry in the memory array 477. In all three operating modes, the word line activated by the address decoder 195 selects the row of the memory array 477 in which the entry is stored.

The entry size information within configuration register 473 is also provided to the output logic 475 to control the generation of a block flag signal 474, block priority value 472 and block index 476. The output logic 475 is coupled to the sense amplifier banks (SA) within the read/write circuit 481 to receive an entry segment $138_1$–$138_4$ from each of the corresponding segments $479_1$–$479_4$ of memory array 471. Depending on the operating mode selected by the entry type/size value within the configuration register 473, the entry segments $138_1$–$138_4$ may be four distinct entries (x1 mode) that each span a single memory segment 479, two distinct entries (x2 mode) that each span a pair of memory segments, or a single entry that spans all four memory segments (x4 mode). The output logic 475 also receives the search key 210 from the assembler circuit 191, hash index 340 from the hash index generator 131, block select signal 332 from the block select logic 331, and NFA signal 212 from an instruction decoder (not shown in FIG. 31) or other control circuit.

Figure 32:
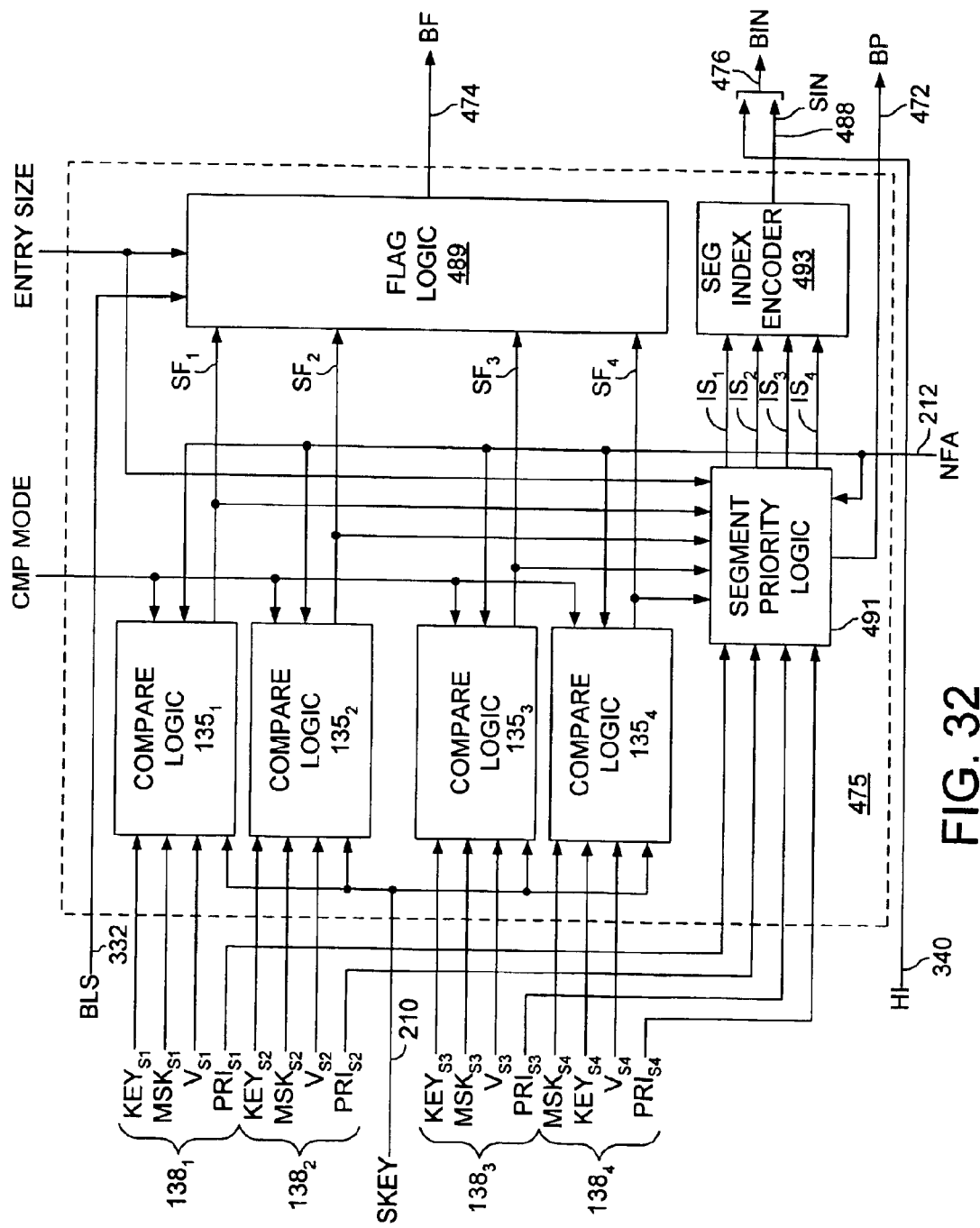
FIG. 32 illustrates an embodiment of the output logic of FIG. 31.

FIG. 32 illustrates a more detailed embodiment of the output logic 475 of FIG. 31 (other embodiments may be used). The output logic 475 includes four compare logic circuits $135_1$–$135_4$, segment priority logic 491, flag logic 489 and segment index encoder 493. Each of the compare logic circuits $135_1$–$135_4$ receives a respective entry segment $138_1$–$138_4$ (i.e., from memory segments $479_1$–$479_4$ of FIG. 31) and operates generally as described in reference to FIG. 9 to generate a corresponding match/empty signal, referred to herein as a segment flag (SF). During a NFA operation, each segment flag, $SF_1$–$SF_4$, indicates the state of the valid bit for the corresponding segment, and therefore indicates whether the corresponding segment is occupied (i.e., by a valid entry or portion thereof) or unoccupied. During a search operation, each segment flag indicates whether the entry key for the corresponding segment (i.e., $KEY_{S1}$, $KEY_{S2}$, $KEY_{S3}$, $KEY_{S4}$) matches the search key 210, ignoring any mismatch between bits indicated to be masked by the entry mask information for the segment (i.e., $MSK_{S1}$, $MSK_{S2}$, $MSK_{S3}$, $MSK_{S4}$). In both NFA and search operation, the segment flags are output to the flag logic circuit 489 which generates the block flag 474 (BF) in accordance with the entry size value from the configuration register and the block select signal 332. The segment flags are also output to the segment priority logic 491 which generates a block priority value (BP) and a plurality of index select signals, $IS_1$–$IS_4$. The index select signals are input to the segment index encoder 493 which encodes the index select signals to generate a segment index 488 (SIN). In a NFA operation, the segment priority logic 489 selects the segments flags, SF1–SF4, to be output as the index select signals, while in a search operation, the entry priority values ($PRI_{S1}$, $PRI_{S2}$, $PRI_{S3}$, $PRI_{S4}$) are qualified by the segment flags and used to generate the index select signals. The NFA signal 212 is input to the segment priority logic 491 to select the source of the index select signals.

FIG. 33 illustrates an embodiment of the flag logic 489 of FIG. 32 (other embodiments may be used). The flag logic 489 receives the entry size information from the configuration register (i.e., element 473 of FIG. 31) in the form of three component entry size signals: x1, x2 and x4. The x1 signal is asserted (i.e., to a logic high state in this example) when the CAM device is configured for x1 mode, the x2 signal is asserted in the x2 mode, and the x4 signal is asserted in the x4 mode. In x1 mode, the asserted x1 signal enables the output of OR gate 501 to pass through gate 511 and OR gate 517 to a first input of AND gate 519. A second input of AND gate 519 is coupled to receive the block select signal 332. Accordingly, in the x1 mode, if the block select signal 332 is asserted and any one of the segment flags $SF_1$–$SF_4$ are high (indicating an empty condition within the corresponding segment during a NFA operation and a match condition during a search operation), the block flag 474 will be asserted by AND gate 519.

In the x2 mode, gate 513 is selected to drive the block flag 474 via OR gate 517 and AND gate 519. AND gate 513 receives the output of OR gate 507 which receives outputs of AND gates 503 and 505. Each of AND gates 503 and 505 receives a respective pair of the segment flag signals, $SF_1/SF_2$ and $SF_3/SF_4$, so that an empty (or match) indication is indicated in the x2 mode only if $SF_1$ and $SF_2$ are both asserted or $SF_3$ and $SF_4$ are both asserted. In the x4 configuration, AND gate 515 is selected to drive the block flag 474 via OR gate 517 and AND gate 519. In the x4 mode, all four segment flags, $SF_1$–$SF_4$, are ANDed together in AND gates 503, 505 and 509 to generate the signal input to AND gate 515. Thus, in the x4 mode, all four segment flags must indicate an empty status in order for the block flag 474 to be asserted during a NFA operation, and all four segments flags must indicate a match condition in order for the block flag 474 to be asserted during a search operation. In an alternative embodiment, three of the four segment flags could be ignored in the x4 mode and one segment flag in each pair of segment flags could be ignored in the x2 mode.

FIG. 34 illustrates an embodiment of the segment priority logic 491 of FIG. 32 (other embodiments may be used). The segment priority logic 491 includes search priority logic 550 NFA priority logic 571, multiplexer 565 and multiplexer bank 570. The segment priority logic 491 receives the x2 and x4 entry size signals from the configuration register and also receives the segment flags, $SF_1$–$SF_4$, from the compare logic circuits and the corresponding priority values, $PRI_{S1}$–$PRI_{S4}$, from the segmented memory. As discussed above, the segment priority logic 491 outputs the index select signals, $IS_1$–$IS_4$, and also outputs the block priority value 472 (BP). The NFA signal 212 is coupled to the control inputs of multiplexers 570 to select the source of the index select signals, $IS_1$–$IS_4$. During a NFA operation, the asserted NFA signal 212 selects segment flags $SF_1$–$SF_4$ to be output as the index select signals $IS_1$–$IS_4$. for example, if segment flag $SF_1$ is high (indicating that the corresponding segment within the segmented memory is empty), index select signal $IS_1$ will also be high. By contrast, during a search operation, the NFA signal 212 is deasserted and search priority logic 550 is selected (i.e., by multiplexer bank 570) to drive the index select signals. Multiplexer 565 is responsive to the NFA signal 212 to select an insert priority value 574 (IP) from the NFA priority logic 571 to be output as the block priority value 472 during a NFA operation, and to select a search priority value 564 (SP) from the search priority logic 550 to be output during a search operation (i.e., when the NFA signal 212 is deasserted).

The search priority logic 550 includes logic OR gates 541, 543, 545 and 547 to generate match-qualified priority values; comparator circuits $C_1, C_2$ and $C_3$ to compare the match qualified priority values; multiplexers 549, 551 and 553 to select a search priority value from among the match qualified priority values; and AND gates 555, 557, 559 and 561 to output the index select signals $IS_1$–$IS_4$ via multiplexer bank 570. Each of the OR gates 541, 543, 545, 547 outputs a respective match qualified priority $QP_{S1}, QP_{S2}, QP_{S3}, QP_{S4}$ according to the state of the corresponding segment flags $SF_1$–$SF_4$. For example, if segment flag $SF_1$ is high (indicating a match condition), OR gate 541 will output the $PRI_{S1}$ value as the match-qualified priority value $QP_{S1}$. If $SF_1$ is low, indicating a mismatch condition, OR gate 541 will output a match disqualified priority value $QP_{S1}$ in which all constituent bits are high (i.e., due to the inversion of the segment flag at the input to OR gate 541), which, in the embodiment of FIG. 34, is the lowest possible priority value. OR gates 543, 545 and 547 are additionally coupled to receive the x4 signal so that, in the x4 mode, the priority values $QP_{S2}$, $QP_{S3}$ and $QP_{S4}$ are driven to the lowest possible priority value (i.e., disqualified because they are unused). Consequently, in the x4 configuration, the match qualified priority values for segments 2–4 of the segmented memory will not exceed the match qualified priority value for segment 1 and therefore are effectively ignored. That is, the segment 1 priority value $PRI_{S1}$, is the priority value for a x4 entry. In alternative embodiments, any of others of the segments, including combinations of two or more segments may be used to source the x4 priority value. OR gates 543 and 547 are further coupled to receive the x2 signal so that, in the x2 mode, the priority values for segments 2 and 4 are ignored, the x2 entries being represented by priority values stored in segments 1 and 3. In alternative embodiments, others of the segments, including combinations of segments may be used to source the x2 priority values and/or the x4 priority value.

Comparator $C_1$ compares priority values $QP_{S1}$ and $QP_{S2}$ and generates a select signal 552 having a high logic state if priority value $QP_{S1}$ indicates a higher priority (or equal priority) than priority value $QP_{S2}$, and a low state if priority value $QP_{S1}$ indicates a lower priority than priority value $QP_{S2}$. That is, select signal 552 is high or low according to whether priority value $QP_{S1}$ or $QP_{S2}$, respectively, is the winner of the priority comparison in comparator $C_1$. The select signal 552 is input to multiplexer 549 to select the $C_1$ comparison winner (i.e., priority value $QP_{S1}$ or $QP_{S2}$) to be output to multiplexer 553 and comparator $C_3$. Similarly comparator $C_2$ compares the priority values $QP_{S3}$ and $QP_{S4}$ and generates a select signal 554 having a high or low state according to whether priority value $QP_{S2}$ or $QP_{S4}$ is the comparison winner. The select signal 554 is input to multiplexer 551 to select the $C_2$ comparison winner (i.e., priority value $QP_{S3}$ or $QP_{S4}$) to be output to multiplexer 553 and comparator $C_3$. Comparator $C_3$ compares the priority numbers output by multiplexers 449 and 551 and generates a select signal 556 having a high or low state according to whether the priority value from multiplexer 449 or 551 is the comparison winner. The select signal 556 is provided to a select input of multiplexer 553 to select the $C_3$ winner to be output as the search priority value 564 (SP). The select signals 552, 554 and 556 are also input to AND gates 555, 557, 559 and 561 to enable one of the AND gates to assert a high logic signal according to which priority value, $QP_{S1}$, $QP_{S2}$, $QP_{S3}$ or $QP_{S4}$, is the overall priority comparison winner. Thus, if select signals 552 and 556 are both high, then the output of AND gate 555 is high to indicate that $QP_{S1}$ is the priority comparison winner. Similarly, if select signal 552 is low and 556 high, the output of AND gate 557 is high to indicate that $QP_{S2}$ is the priority comparison winner; if select signal 556 is low and 554 high, the output of AND gate 559 is high to indicate that $QP_{S3}$ is the priority winner; and if select signal 556 and 554 are both low, the output of AND gate 561 is high to indicate that $QP_{S4}$ is the priority comparison winner. Thus, when in the x1 configuration, the memory segment that sources the highest priority match-qualified priority value will cause the corresponding index select signal, $IS_1$–$IS_4$, to be asserted.

NFA priority logic 571 is provided to generate the insert priority value 574. As discussed above, the insert priority value 574 may be compared with insert priority values from other hash CAM blocks during a NFA operation to select a hash CAM block for entry insertion. In the embodiment of FIG. 34, the NFA priority logic 571 includes a multiplexer 572 to select between two predetermined priority values according to whether the indexed row within the segmented memory contains at least one occupied segment. More specifically, if the indexed row includes at least one occupied segment (indicated by a logic low segment flag), the output of AND gate 573 will be low, thereby selecting a first predetermined priority value (zero in this example) to be output as the insert priority value 574. Conversely, if all the segment flags indicate empty, an empty row within the segmented memory has been selected by a hash index and second predetermined priority value of (100H in this example, the 'H' indicating hexadecimal notation) is selected to be output as the insert priority value 574. In one embodiment, the first predetermined priority value has a higher priority than the second predetermined priority so that, a hash CAM block which is indexed at a partially filled row of a segmented memory will output a higher insert priority value than a hash CAM block which is indexed at a completely empty row. (Note that the NFA priority logic 571 need not account for a completely filled row because the block flag 474 will not be asserted in that circumstance). Different insertion policies may be used in alternative embodiments, however it is generally desirable to insert entries into partially filled rows within the segmented memory whenever possible in order to use the memory efficiently.

FIG. 35 illustrates alternative NFA priority logic 580 that may be used in place of NFA priority logic 571 of FIG. 34. The NFA priority logic 580 generates an insert priority value 582 having an R-bit fill count component 586 and at least one bit 588, referred to herein as a partial fill bit, that indicates whether or not at least one segment of the indexed memory row is occupied by at least one valid entry (i.e., a partially filled row). The R-bit fill count 586 is generate by a fill counter 585 which is incremented in response to an insert operation and decremented in response to a delete operation (i.e., an operation to invalidate an entry). Accordingly, the fill count 586 indicates the number of valid entry stored in the memory of a hash CAM block such that, in an embodiment in which numeric value is inversely proportional to priority, the less filled of two CAM blocks having matching partial fill bits 588 will output a higher priority value than the more filled CAM block. In the embodiment of FIG. 35, insert and delete signals (INS and DEL) are applied, respectively, to up and down inputs of the fill counter 585, the insert and delete signals being generated, for example, by an instruction decoder. In an alternate embodiment, the fill counter 585 may count down in response to the insert signal and up in response to the delete signal so that the less filled of tow CAM blocks having matching partial fill bits 588 will output a numerically higher (lower priority) priority value than the more filled CAM block.

The partial fill bit 588 is generated by AND gate 573 according to the states of the segment flags $SF_1$–$SF_4$. Specifically, if any of the segment flags indicates an occupied segment (i.e., segment flag is low), the output of AND gate 573 goes low to produce a low partial fill bit 588. Conversely, if all the segment flags indicate unoccupied segments (i.e., all segments flags are high), the partial fill bit 588 is high. Thus, in the exemplary embodiment of FIG. 35, the partial fill bit 588 is 0 in the case of a partially (or completely) filled memory row, and 1 in the case of a completely unfilled memory row. In one embodiment, the partial fill bit is the most significant bit of the insert priority value 582 (or at least more significant than the fill count 586) so that a CAM block containing a partially filled row will output a numerically lower (i.e., higher priority) insert priority value than a CAM block containing no valid entries within the indexed row (i.e., a completely unfilled row), regardless of the relative fill levels of the two CAM blocks.

FIG. 36 illustrates an embodiment of the segment index encoder 493 of FIG. 32. The segment index encoder 493 receives the index select signals, $IS_1$–$IS_4$, from the segment priority logic and selects one of four predetermined segment indices, 00b, 01b, 10b or 11b (the 'b' indicating binary notation) to be output as the segment index 488. Each of the predetermined indices is an address to one of the four different segments within the segmented memory. Thus, if during either a NFA operation or a search operation, index select signal $IS_1$ is asserted, value 00 at port P1 of a multiplexer 581 is output as the segment index 488. That is, if segment 1 within the segmented memory is signaled to be unoccupied in a NFA operation, or signaled to contain a matching entry in a search operation, the address of that segment (i.e., 00b) will be output as the segment index 488. In one embodiment, the multiplexer 581 is designed to resolve ties (i.e., more than one index select signal being asserted) in favor of the lowest numbered of the index select signals. For example, if all four index select signals are asserted, the segment index that corresponds to index select signal $IS_1$ (i.e., 00b) is output as the segment index 488. Different tie resolution schemes may be used in alternative embodiments.

FIG. 37 illustrates a NFA operation within an exemplary CAM device 592 having four hash CAM blocks, $470_1$–$470_4$, each of which includes a four-segment memory, and each of which outputs one of two insert priority values according to whether an indexed memory row is partially filled (i.e., each hash CAM block includes NFA priority logic 571 of FIG. 34). For simplicity, each hash CAM block $470_1$–$470_4$ is depicted as having six memory storage rows (each with four segments), with hash CAM blocks 1 and 2 ($470_1$, $470_2$) programmed to select the hash index generated by a first hash function circuit 431 and hash CAM blocks 3 and 4 ($470_3$, $470_4$) programmed to select a hash index generated by a second hash function circuit 433. Thus, for a given masked key value (MKEY), the hash indices generated within hash CAM blocks 1 and 2 will be the same (i.e., index 340), and the hash indices generated within CAM blocks 3 and 4 will be the same (i.e., index 341), but, except in cases of coincidence, index 340 will be different from index 341. Also for simplicity, the key mask values and entry type values programmed within the four hash CAM blocks are assumed to be the same (i.e., all four hash CAM blocks are in the same insertion pool).

In the example of FIG. 37, hash CAM block 1 ($470_1$) includes five entries each stored within segment 1 (indicated by cross-hatched shading). Hash CAM blocks 2, 3 and 4 are each completely empty. Because hash CAM block 1 is indexed at a partially filled row, hash CAM block 1 will generate a numerically lower (higher priority) insert priority value than hash CAM blocks 2, 3 and 4. Thus, in FIG. 37, hash CAM block 1 is selected for entry insertion instead of hash CAM blocks 2, 3 and 4. The insertion location is indicated by lined shading (i.e., at row 2, segment 2 of hash CAM block 1).

FIG. 38 illustrates another exemplary NFA operation within the hash CAM device 592 of FIG. 37 after additional entries have been loaded into the hash CAM blocks 1, 2 and 3. Hash CAM block 4 is still completely empty. In this example, hash CAM blocks 1 and 2 are conflicted (i.e., the rows at the indexed location are fully loaded), and therefore will not assert a block flag signal. Hash CAM blocks 3 and 4, by contrast, both have completely empty rows at the indexed location. Because hash CAM blocks 3 and 4 both output the same priority number (the relative fill levels of the CAM blocks not being incorporated into the insert priority values), hash CAM block 3 is selected to store the entry according to a hardwired tie resolution policy that favors lower numbered hash CAM blocks. Different tie resolution policies may be implemented in alternative embodiments.

FIGS. 39 and 40 illustrate NFA operations within a hash CAM device 594 that is identical to the exemplary hash CAM device 592 of FIGS. 37 and 38 except that the hash CAM device 594 includes the capacity-dependent NFA priority logic 580 of FIG. 35. Referring specifically to FIG. 39, hash CAM blocks 1, 2, 3 and 4 are all indexed at completely unfilled rows so that the partial fill bit of the insert priority value for each hash CAM block is set. Because the fill level of hash CAM block 2 is lower than that of hash CAM blocks 1, 3 and 4, however (hash CAM block 2 contains only one entry, while hash CAM blocks 1, 3 and 4 each contain more than one entry), hash CAM block 2 outputs a numerically lower (higher priority) priority value than hash CAM blocks 1, 3 and 4 and is therefore selected for entry insertion.

In the example of FIG. 40, only hash CAM blocks 1, 2 and 4 are able to store the data value within the indexed row (hash CAM block 3 is conflicted). Hash CAM block 2 is the least filled of hash CAM blocks 1,2 and 4, but is indexed at a completely empty row. Consequently, the most significant bit of the insert priority value output by hash CAM block 2 will be set. By contrast, hash CAM blocks 1 and 4 are indexed at partially filled rows and therefore will have a cleared most significant bit within their insert priority values. Thus, the insert priority values output by hash CAM blocks 1 and 4, will be numerically lower (higher priority) than the insert priority value output by hash CAM block 2, even though hash CAM block 2 is less filed than hash CAM blocks 1 and 4. Hash CAM blocks 1 and 4 will output equal priority values because each contains the same number of at least partly occupied rows (i.e., fill counter 585 of FIG. 35 will have been incremented each time an unfilled row within the binary CAM was loaded with a new hash index to enable of an entry within an unfilled row of the corresponding memory). Because hash CAM blocks 1 and 4 both output the same priority number, hash CAM block 1 is selected to store the entry according to a hardwired tie resolution policy that favors lower numbered hash CAM blocks. Different tie resolution policies may be implemented in alternative embodiments.

Although FIGS. 39 and 40 illustrate NFA examples using a least-filled insertion policy, a most-filled insertion policy (i.e., policy which favors a more-filled rather than a less filled hash CAM block for entry insertion purposes) may be applied instead. A most-filled insertion policy may be implemented, for example, by using an empty counter rather than the fill counter 585 within the NFA priority logic of FIG. 35. The empty counter may be preloaded to a predetermined value, then decremented in response to each binary CAM load operation (i.e., indicated by assertion of the INS signal) and incremented in response to each binary CAM delete operation (i.e., indicated by assertion of the DEL signal). Referring to FIG. 39, in such an embodiment, hash CAM block 1 would output a numerically lower (higher priority) priority value than hash CAM blocks 2, 3 and 4 because more of its rows are filled or at least partially filled (i.e., hash CAM block 4 has an occupied row count of 4, while hash CAM block 2 has an occupied row count of 2, and hash CAM blocks 2 and 4 each have an occupied row count of 1).

Indirect Hashing using Binary CAM

Figure 41:
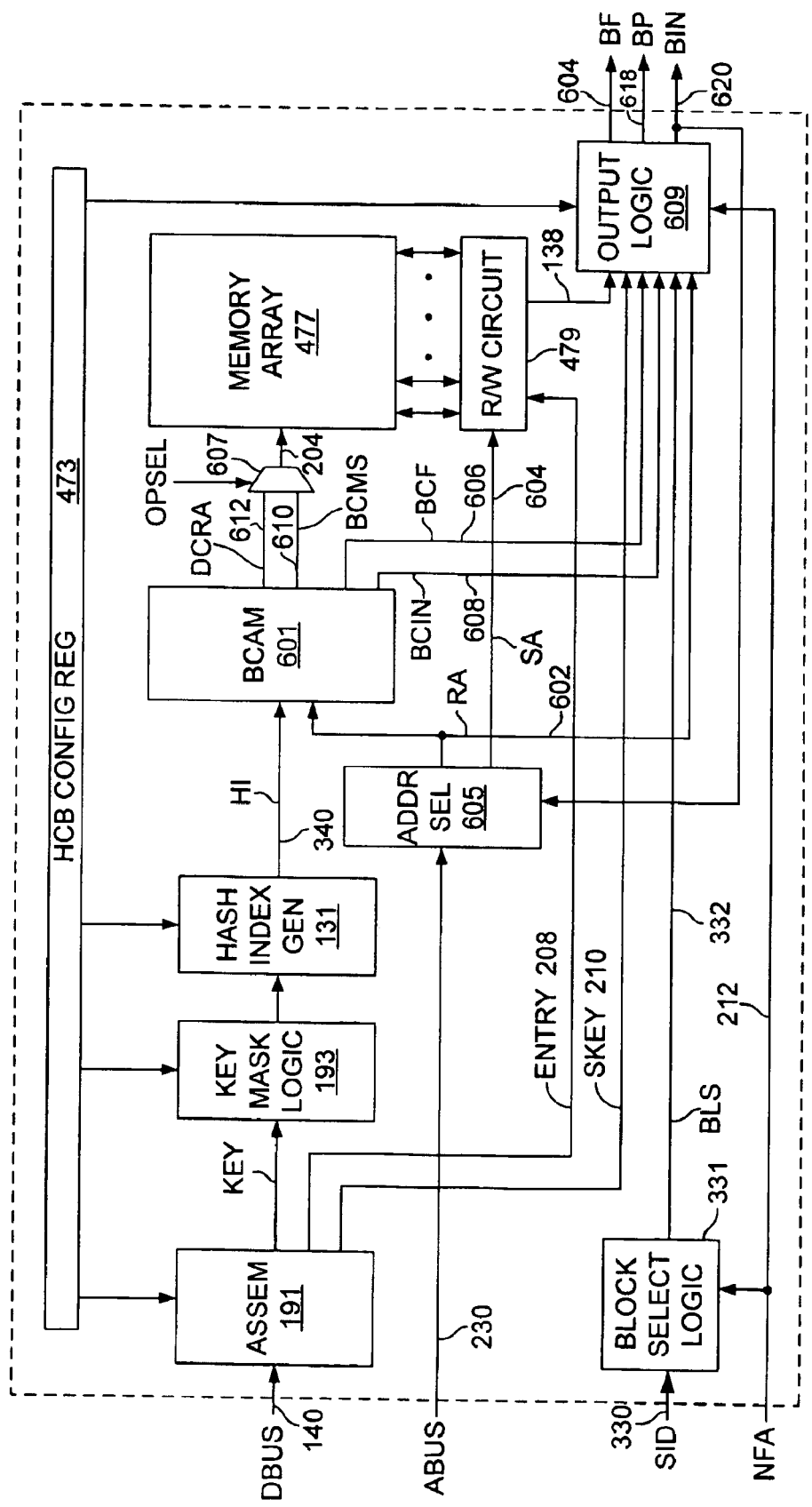
FIG. 41 illustrates another embodiment of a hash CAM block.

FIG. 41 illustrates another embodiment of a hash CAM block 600 which may be used within any of the multiple hash block CAM devices or single hash CAM block devices described above. The hash CAM block 600 includes an assembler circuit 191, key mask logic 193, hash index generator 131, block select logic 331 and configuration register 473, all of which operate as generally described above in reference to FIG. 31. The hash CAM block 600 additionally includes a binary CAM circuit 601 to perform a function referred to herein as indirect hashing. In indirect hashing, the hash index 340 generated by the hash index generator 131 is not used to index the memory 477 directly, but rather is compared with stored hash indices within the binary CAM 601 to identify a matching hash index within a storage row of the binary CAM 601, and to select a corresponding row within a memory array 477.

Figure 42:
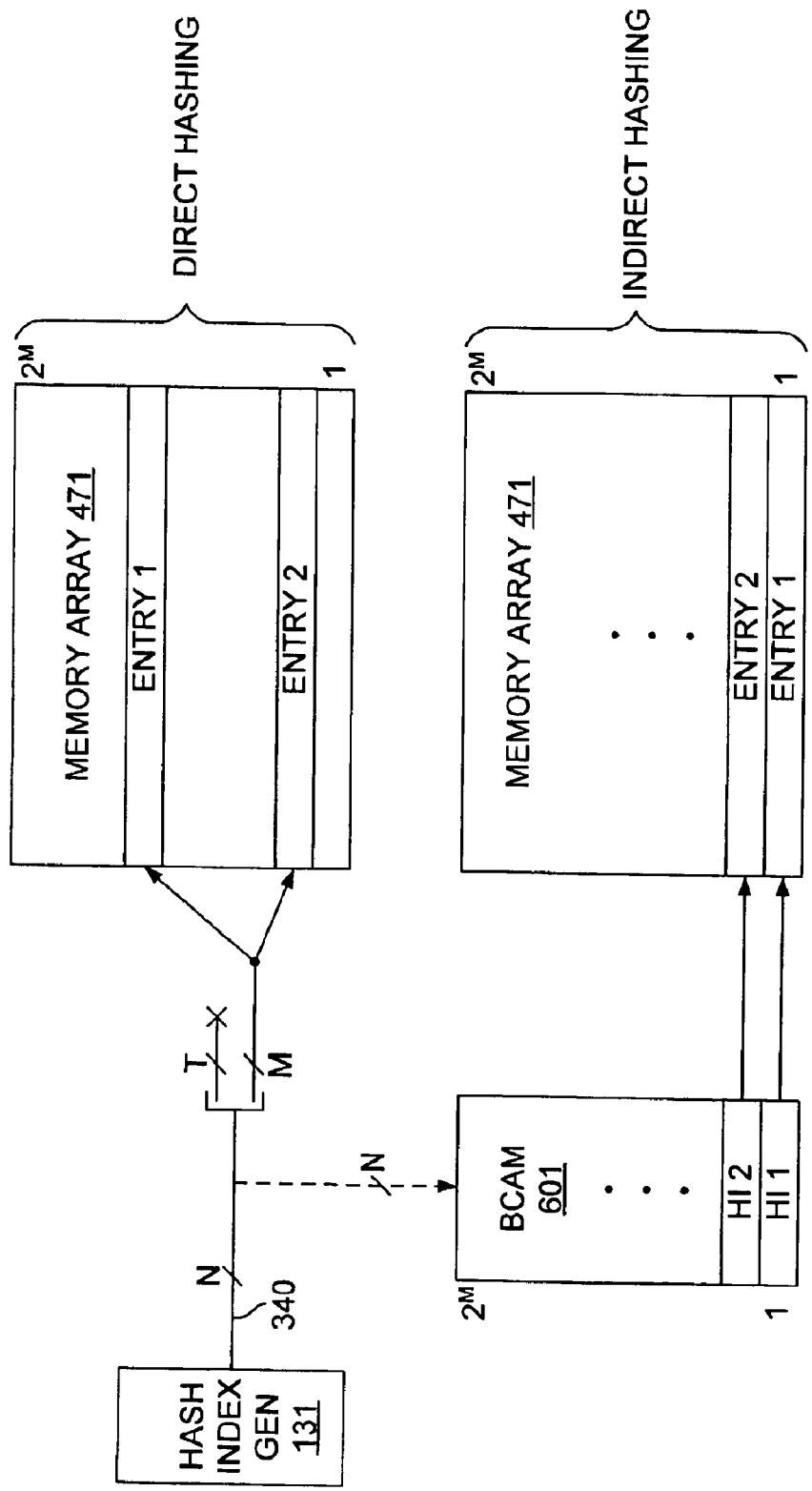
FIG. 42 illustrates the different results produced by direct hashing and indirect hashing.

FIG. 42 illustrates the different results produced by direct hashing, in which a hash index is used to address the memory array 477 directly, and indirect hashing achieved through use of the binary CAM 601. As shown, the hash index generator 131 generates a hash index 340 having N constituent bits. Because the memory array 477 only has $2^M$ storage rows, however, only M of the N bits within hash index 340 may be used to directly address the memory array 477. That this, in a direct hashing scheme, either the hash index generator 131 generates a hash index having a number of bits that corresponds to the size of the memory to be addressed, or the hash index is truncated to the appropriate number of bits before addressing the memory array. The truncation of T bits from the N-bit hash index is shown in the direct hashing example of FIG. 42 (i.e., N=M+T). The truncation of T bits reduces the overall hashing space by a factor of $2^T$, thereby increasing the likelihood of collisions relative to indirect hashing. By contrast, in the indirect hashing approach, the full set of N bits may be used (or at least more than M bits) to select a row of the memory array 477, even though the memory array 477 has fewer than $2^N$ storage rows. As shown, the binary CAM 601 is used to store the full N-bit hash index within a selected row of CAM cells during an insert operation, the selected row of CAM cells corresponding to a row within the memory array in which the entry is inserted. In a search operation, the hash index generated by the hash index generator 131 is compared with each of the hash indices stored within the binary CAM 601 to determine whether the hash index has previously been loaded in to the binary CAM 601. If a match is found, a match line corresponding to the row of the binary CAM 601 containing the matching hash index is activated. In one embodiment, the match line is used to drive a corresponding word line within the memory array. By this arrangement, a matching hash index within the binary CAM enables read or write access to the corresponding storage row within the memory array 477. Thus, the binary CAM effectively presents a larger hash index space to the address generation circuitry (i.e., the hash index generator 131) than is provided by the underlying memory array 477. Because the full hash index 340 may be used (that is, rather than a truncated hash index), the likelihood of collisions between incoming data values is substantially reduced (i.e., as compared with direct hashing). Further, as shown in FIG. 42 the binary CAM may be loaded in a predetermined manner (e.g., bottom to top, top to bottom, etc.) such that the full space within the memory array may be used. This is in contrast to the direct hashing approach in which the memory array may be filled only up to a certain percentage before collisions become so statistically likely that the hash CAM block is, for practical purposes, full.

In one embodiment, the hash index generator 131 generates a 16-bit hash index (a CRC value), the memory array contains 512 rows (i.e., addressable by a $\log_2(512)=9$ bit address), and the binary CAM stores 12 bits of the hash index, thus truncating the hash index by four, but not all seven extra bits. In an alternative embodiment, a ternary CAM may be used to store the full hash index together with mask information to mask out selected bits of the hash index. For example, a ternary CAM having a 16-bit storage width may be used to store a full 16-bit hash index, with any number of the hash index bits masked to produce, in effect, a smaller hash index. The hash index bits to be masked, if any, may be configured by a value stored within the configuration register of the hash CAM block. By this arrangement, different hash CAM blocks may be configured to use unmasked portions of a hash index to further reduce the likelihood of collisions in the CAM device. It should be noted that not all the CAM cells within such a ternary CAM device (i.e., ternary CAM device used to support indirect hashing) need to be ternary CAM cells. That is, each row within the ternary CAM device could include a number of binary CAM cells and a number of ternary CAM cells according to application needs.

Figure 43:
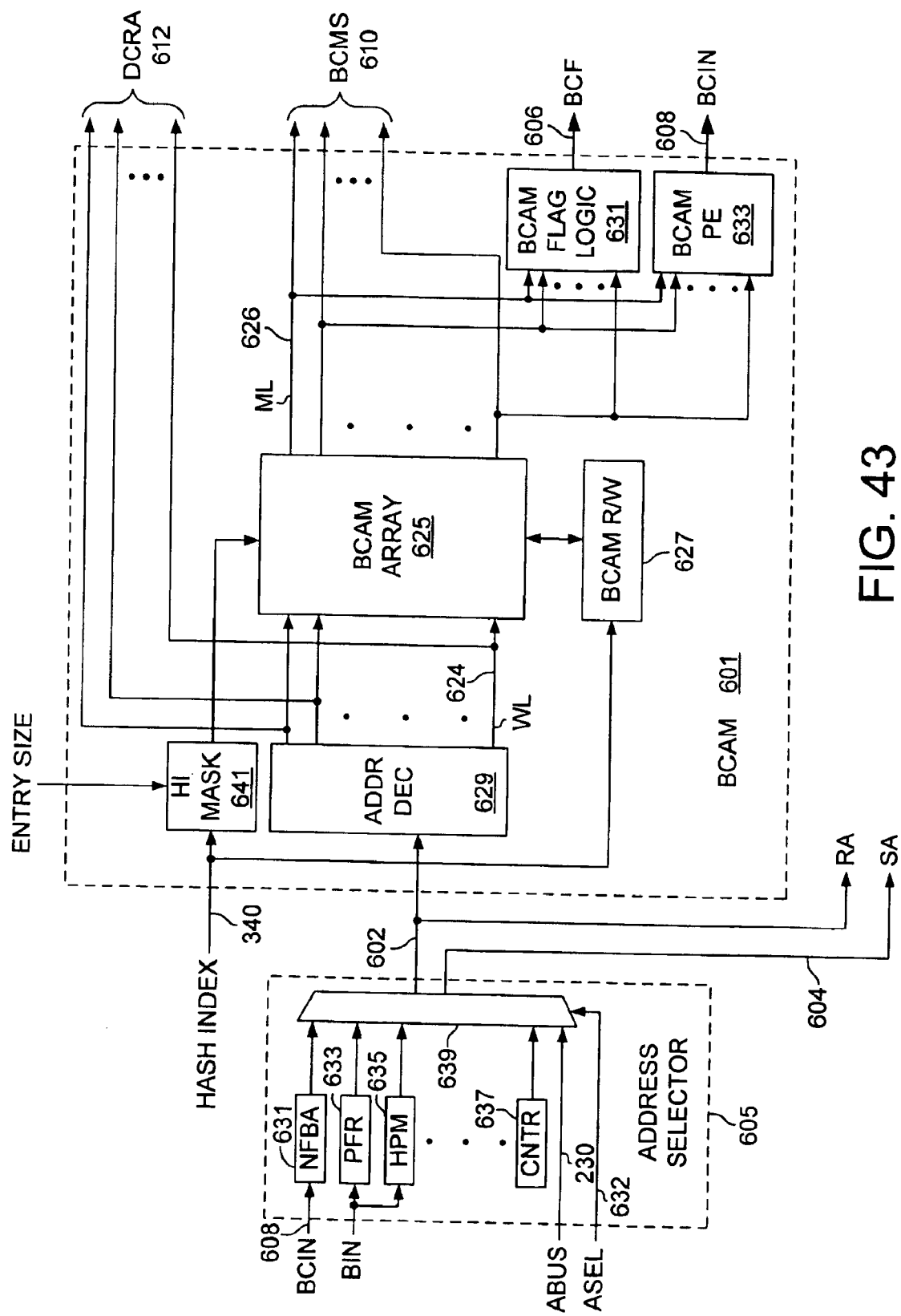
FIG. 43 illustrates en embodiment of the binary CAM and the address selector of FIG. 41.

In applications in which insertion policy favors insertion at partially filled rows, it may be desirable to increase the likelihood of a match within the binary CAM array 625 by masking selected bits of the hash index, effectively selecting a smaller hash index. In the embodiment of FIG. 43, a hash index mask circuit 641 is provided to mask selected bits of the hash index 340 in accordance with the entry size value within the block configuration register. As a specific example, for a x1 configuration, a truncated, 12-bit hash index 340 is output from the hash index generator 131 and four of the bits of the hash index 340 are masked by the hash index mask circuit 641 hash for x1 entries; two bits of the hash index 340 are masked by the hash index mask circuit 641 for x2 entries, and none of the bits of the hash index 340 are masked by the hash index mask circuit 641 for x4 entries. This hash index masking policy reflects the significance of partially filled rows for the x1, x2 and x4 configurations. That is, there can be no partially filled row in the x4 configuration (row is either entirely occupied or unoccupied), and partially filled rows are statistically more likely in the x1 configuration than the x2 configuration due to the fact that a partially filled row remains partially filled in the x1 configuration until it has been selected for entry insertion four times (versus two times for the x2 configuration). Different masking levels may be used in alternative embodiments, including embodiments having more or fewer entry segments and therefore different configurations in which partially filled rows are possible. Also, different hash index truncation selections may be enabled in different hash CAM blocks within a given device. For example, in one embodiment some of the hash CAM blocks include memory arrays (and binary CAM arrays) having 512 storage rows, while others of the hash CAM blocks include memory arrays (and binary CAM arrays) having 256 storage rows. Different hash index truncation selections may be programmed for the different hash CAM blocks according to the total addressable storage space (and therefore the storage capacity) of the memory array.

In alternative embodiment, the hash index mask circuit 641 may be omitted and a ternary CAM array may be used in place of the binary CAM array 625. Mask values may then be stored with each hash index 340 loaded into the ternary CAM to effect the desired level of hash index masking. In another alternative embodiment, the hash index 340 is not masked for any of the entry size configurations (or to achieve truncation) so that the hash index mask circuit 641 may be omitted altogether.

Returning to FIG. 41, the binary CAM 601 is coupled to receive a hash index 340 from hash index generator 131 and outputs a decoded row address 612 (DCRA) and a set of binary CAM signals 610 (BCMS) to a multiplexer 607. The multiplexer 607 is responsive to an operation select signal (OPSEL) to select either the decoded row address 612 or the binary CAM match signals 610 to drive the word lines of the memory array 477. For example, during a NFA operation or search operation, the binary CAM match signals 610 are selected by the multiplexer 607 to drive the word lines of the memory array 477. Accordingly, if a matching hash index is detected within the binary CAM 601 during an NFA or search operation, the asserted binary CAM match signal enables the corresponding row of the memory array 477 to be sensed by the sense amplifiers banks within the read write circuit 479 and provided to the output logic 609. During an insert operation (or other write operation), a row address 602 (RA) output from an address selector 605 is decoded within the binary CAM 601 to generate the decoded row address 612. If the insert operation involves loading a new hash index into the binary CAM 601, the hash index is loaded into the binary CAM row indicated by the decoded row address 612. If the insert operation involves loading a new entry into a partially filled row of the memory array (that is, a row for which a corresponding hash index is already stored in the binary CAM 601), a hash index is not stored in the binary CAM 601. In either case, the decoded row address 612 is selected by the multiplexer 607 to activate the corresponding word line within the memory array 477 and thereby enable an entry to be stored within the indicated storage row.

The binary CAM 601 also outputs a binary CAM index 608 (BCIN) and binary CAM flag 606 (BCF) to the output logic 609 where they are used to generate a block index 620 (BIN), block priority value 618 (BP) and block flag 616 (BF). The block index 620 is fed back to the address selector 605 to update selected address registers therein. It should be noted that, instead of outputting a decoded address to the memory array 477, a separate address decoder may be provided to receive an encoded address from binary CAM 601, and to decode the encoded address to activate the indicated word line within the memory array 477. In such an embodiment, the multiplexer 607 may receive the row address 602 output by the address selector (i.e., instead of the decoded row address 612) and the binary CAM index 608 output by the binary CAM 601 (i.e., instead of the binary CAM match signals). During an NFA or search operation, the binary CAM index 608 is selected to address the memory array 477, and during other operations (e.g., an insert operation), the row address 602 is selected to access the memory array 477.

In the embodiment of FIG. 41, the memory array 477 is a segmented array that operates in the manner described above in reference to FIG. 31. Accordingly, the address selector 605, in addition to outputting the row address 602 to the binary CAM 601, also outputs a segment address 604 (SA) to the read write circuit 479. The segment address is used to select one or more write driver or sense amplifier banks within the read/write circuit 479 to perform a write or read at the indicated segment(s) of the word-line selected row. As in the embodiment of FIG. 31, entry size information stored within the configuration register 473 is provided to the read/write circuit to control the number of memory segments accessed during a given insert, search or NFA operation. In an alternative embodiment, an unsegmented memory array (i.e., memory containing a single segment) may be used in place of memory array 477. Also, while memory array 477 is described below as having four segments and corresponding numbers of supporting circuits, more or fewer segments may be included within the memory array 477 in alternative embodiments. Further, in a single segment embodiment, compare logic (e.g., element 135 of FIG. 6) may be used in place of the output logic 609.

FIG. 43 illustrates an embodiment of the binary CAM 601 and the address selector 605 of FIG. 41. The binary CAM 601 includes an address decoder 629, binary CAM array 625, binary CAM read/write circuit 627, binary CAM flag logic 631, and binary CAM priority encoder 633. The address decoder 629 is coupled to receive the row address 602 from the address selector 605, and decodes the row address to activate an indicated one of word lines 624. The signals carried on word lines 624 constitute the decoded row address 612 and are output from the binary CAM 601 as shown. The binary CAM array 625 includes a plurality of rows of CAM cells each including a storage element and a compare circuit to enable an input hash index 340 to be simultaneously compared with the contents of each binary CAM row. The binary CAM read/write circuit 627 is used to store a hash index 340 in the binary CAM array 625 during a binary CAM load operation. The binary CAM read/write circuit 627 may also be used to read the contents of the binary CAM array 625, for example, for test purposes. During a NFA operation or a search operation, a hash index 340 is compared with the contents of each row of CAM cells within the binary CAM array 625 to generate a plurality of binary CAM match signals 610. Each binary CAM match signal indicates whether the contents of the corresponding binary CAM row matches the hash index, and is output via a respective one of the binary CAM match lines 626 (ML). The binary CAM flag logic 631 and the binary CAM priority encoder 633 are each coupled to the binary CAM match lines 626 to receive the binary CAM match signals 610. The binary CAM flag logic 631 outputs the binary CAM flag 606 (BCF) according to whether a match is detected within the binary CAM 601 during a search or NFA operation. The binary CAM priority encoder 633 outputs the binary CAM index 608 (BCIN) according to which, if any, of the binary CAM match signals 610 is asserted. Thus, the binary CAM index 608 is a row address that corresponds to a row of CAM cells within the binary CAM array 625 that contain a hash index that matches the input hash index 340. In one embodiment, the binary CAM priority encoder 633 is a multiplexer circuit that selects one of a plurality of row address values according to which of the binary CAM match signals 610, if any, is asserted during a binary CAM search operation. In an alternative embodiment, the binary CAM priority encoder 633 is a lookup table (e.g., a read only memory) that is indexed by binary CAM match signals such that an asserted one of the binary CAM match signals 610 selects a corresponding row address value to be output from the lookup table as the binary CAM index 608. Note that, in an embodiment of the binary CAM in which only one of binary CAM match signals 610 is asserted for a given search (i.e., no multiple match) the priority encoder 633 may be replaced by an encoder circuit that encodes the asserted one of the match signals 610 into a row address. The encoder circuit may be implemented, for example, by a multiplexer circuit or a lookup table as discussed above.

During a load operation in the binary CAM 601, a hash index 340 is stored within a selected row of CAM cells within the binary CAM array 625, and validity values for each of the CAM rows are output on the match lines to indicate whether the corresponding row of CAM cells within the binary CAM array 625 are occupied. The binary CAM flag logic 631 generates the binary CAM flag 606 according to the state of the validity values. If the validity values indicate that all the rows of the binary CAM array 625 are occupied by valid hash indices, the binary CAM array 625 is full, and the binary CAM flag 606 is deasserted to indicate the full condition. The binary CAM priority encoder 633 also operates on the validity signals to generate a binary CAM index 608 that is indicative of a next free address within the binary CAM array 625. That is, the binary CAM priority encoder 633 generates an address of the highest priority location within the binary CAM array 625 indicated to be unoccupied by a corresponding validity signal.

In one embodiment, the binary CAM index 608 generated during a binary CAM load operation is buffered in a next free binary CAM address (NFBA) register 631 within the address selector 605. As discussed below, if no match is detected within the binary CAM array 625 during a subsequent NFA operation, the address value within the NFBA register 631 is selected by multiplexer 639 to be output as row address 602 and is selected by output logic 609 of FIG. 41 to be a row index portion of the block index 620.

The address selector 605 additionally includes a partially filled row (PFR) register 633, a highest priority match (HPM) register 635 and an address counter 637 (CNTR), all of which are used to store address values. The partially filled row register 633 is used to store the block index 620 generating during a NFA operation that indexes a partially filled row (i.e., as opposed to a NFA operation in which no match is detected in the binary CAM 601). The HPM register 635 is used to store the block index 620 generated during a search operation that results in a match detection. Address counter 637 may be selected by multiplexer 639 to provide a sequence of ascending or descending indices to the binary CAM 601 and memory array 477, for example, to enable the binary CAM 601 and memory array 477 to be sequentially loaded with entries (e.g., during system startup). In alternative embodiments more or fewer address sources may be included within and/or selected by the address selector 605. For example, an error address register or test address generator may be included within the address selector 605 and selected by the multiplexer 639 to provide a sequence of error check addresses to the binary CAM 601 and/or memory array 477. In the embodiment of FIG. 43, the multiplexer 639 is responsive to address select information 632 (ASEL) from an instruction decoder to select one of the address sources. In one embodiment, an address bus 230 is also coupled to a input port of the multiplexer 639 to enable externally generated addresses to be selected to address the binary CAM array 601 and/or the memory array 477. The address selector 605 outputs the row address portion 602 (RA) of the selected address to the address decoder 629 within the binary CAM 601 and also to the output logic 609 of FIG. 41. The address selector 605 also outputs a segment address portion 604 (SA) of the selected address to the read/write circuit 479 of FIG. 41. As discussed above, the segment address 604 is used to control access to individual segments within the memory array during insert, read and other memory access operations.

Figure 44:
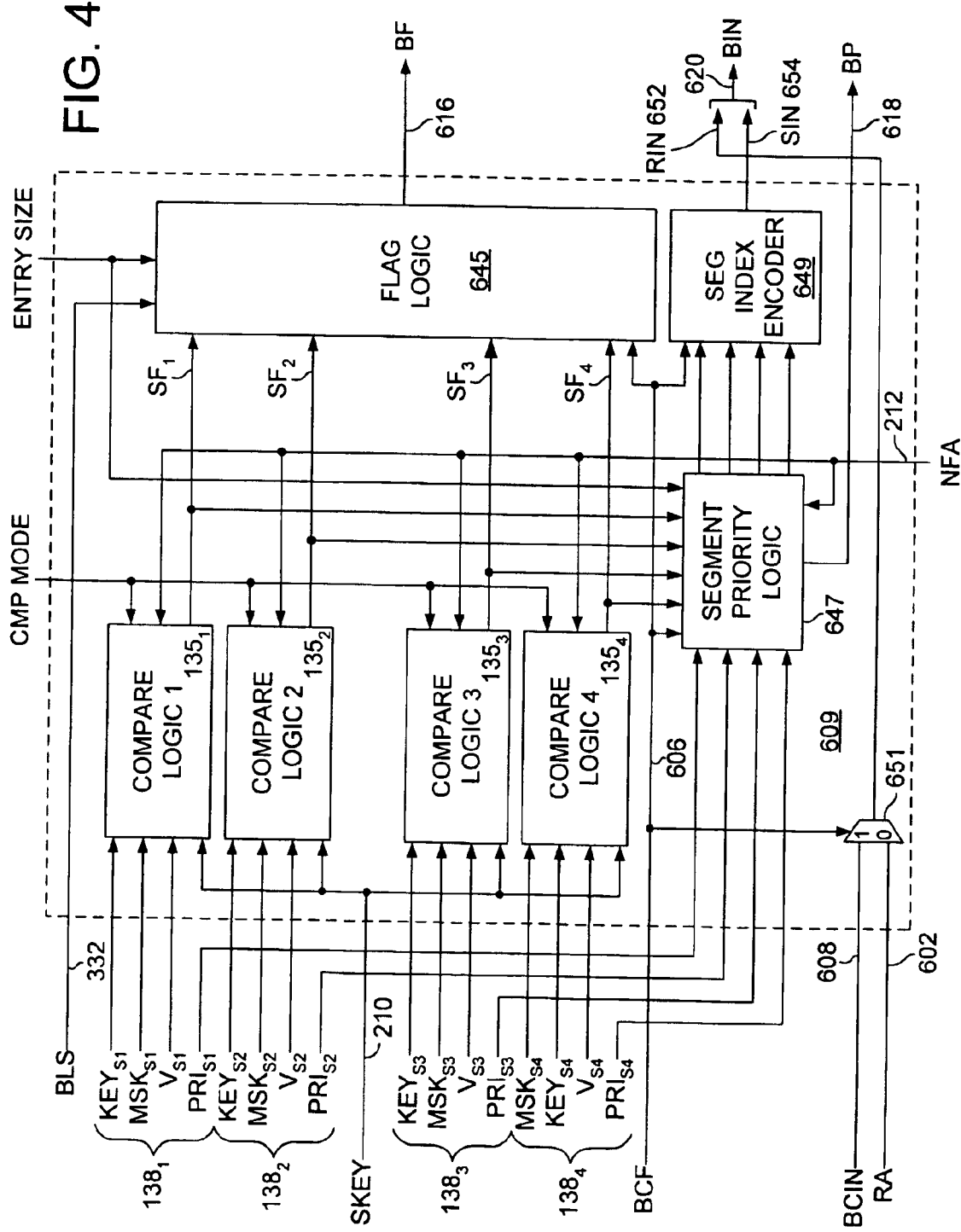
FIG. 44 illustrates an embodiment of the output logic of FIG. 41.

FIG. 44 illustrates an embodiment of the output logic 609 of FIG. 41 (other embodiments may be used). The output logic 609 includes compare logic circuits $135_1$–$135_4$, flag logic 645, segment priority logic 647 and segment index encoder 649, all of which perform the same general functions as corresponding circuit blocks within the output logic 475 of FIG. 32. Also, like the output logic 475 of FIG. 32, the output logic 609 receives the segment entries $138_1$–$138_4$, search key 210, block select signal 332 and NFA signal 212 as inputs. The output logic 609 additionally receives the binary CAM flag 606 (BCF), binary CAM index 608 (BCIN) and row address 602 (RA) as inputs. The binary CAM flag 606 is input to the segment priority logic 647 and also to the flag logic 645 and segment index encoder 649. The binary CAM index 608 and row address 602 are alternatively selected to be the row index component 652 of the block index 620 depending upon whether the binary CAM flag 606 is asserted. During a NFA operation, the next free binary CAM address is selected (e.g., from the NFBA register 631 within the address selector 605 of FIG. 43) to drive the row address 602 so that the multiplexer 651 effectively selects either the binary CAM index 608 or the next free binary CAM address to be the row index 652. Thus, if during a NFA operation, no match is found within the binary CAM (meaning that the hash index has not previously been stored in the binary CAM), the binary CAM flag 606 is not asserted and the multiplexer 651 selects the next free binary CAM address to be the row index 652. If the binary CAM flag is asserted during the NFA operation (meaning that the hash index has previously been stored within the binary CAM), the binary CAM index 608 is indicative of the location of a matching hash index within the binary CAM and is selected to be the row index 652.

Still referring to FIG. 44, the compare logic circuits $135_1$–$135_4$ operate as described above in reference to FIG. 32 to generate segment flags $SF_1$–$SF_4$. Each segment flag corresponds to a respective segment within the segmented memory and indicates, during a NFA operation, an empty/occupied status of the segment. During a search operation, each segment flag indicates whether the content of the corresponding segment matches the search key 210 (or portion thereof).

Figure 45:
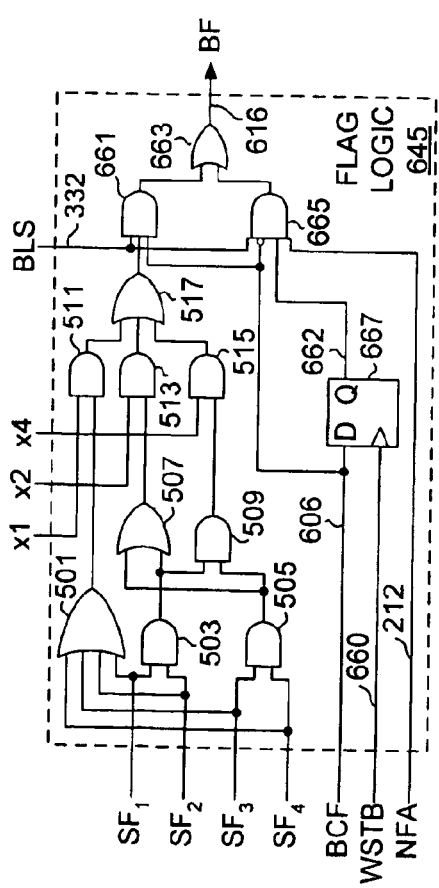
FIG. 45 illustrates the flag logic of FIG. 44 according to one embodiment.

FIG. 45 illustrates the flag logic 645 of FIG. 44 according to one embodiment. The flag logic 645 receives the segment flags SF1–SF4 and entry size signals, x1, x2 and x4 as inputs includes the logic gates 501, 503, 505, 507, 509, 511, 513, 515 and 517 described above in reference to FIG. 33. The flag logic additionally receives the binary CAM flag 606 and NFA signal 212 and includes a storage element 667 (a D-flip flop in this example) to store a buffered binary CAM flag 662 in response to a write strobe signal 660 (WSTB). Logic gates 501, 511 and 517 operate as described in reference to FIG. 33 to output a logic high signal if the x1 signal is high (i.e., x1 mode selected) and any of segment flags $SF_1$–$SF_4$ are high (indicating a match detection during a search operation, or detection of an unoccupied segment during a NFA operation). Because the segment flags are only meaningful if a binary CAM match was detected during a search or NFA operation (otherwise, no match signal was asserted by the binary CAM to select an entry to be input to the output logic 609) and if the CAM block is allocated to the entry type pool or insertion pool indicated by the corresponding search or NFA instruction, the output of logic OR gate 517 is ANDed with the binary CAM match flag 606 and the block select signal in AND gate 661. The output of AND gate 661, if high, will cause OR gate 663 to assert the block flag 616. Logic gates 503, 505, 507, 513 and 517 also operate as described in reference to FIG. 33 to output a logic high signal if the x2 signal is high and either pair of segments flags $SF_1/SF_2$ or $SF_3/SF_4$ indicates a x2 match/empty condition, and logic gate 503, 505, 507, 509 and 515 operate as described in reference to FIG. 33 to output a logic high if the x4 signal is high and all four segment flags $SF_1$–$SF_4$ are asserted (i.e., to indicate a x4 match/empty condition). Because the output of OR gate 517 is ANDed with the block select signal 332 and the binary CAM flag 606, as in the x1 mode, the block flag 616 will be asserted in response to a match/empty detection in the x2 and x4 modes only if the block select signal 332 is high and a match is detected in the binary CAM (i.e., binary CAM flag 606 high).

The flag logic 645 includes an additional path for assertion of the block flag 616 in the event that the binary CAM flag 606 is not asserted during a NFA operation, but the binary CAM is not full. That is, if the binary CAM flag 606 is not asserted during the NFA operation then no matching index was located within the binary CAM; a result indicating that the hash CAM block is not conflicted. Accordingly, so long as the binary CAM is not full, the new hash index (i.e., the storage index generated in response to the entry candidate) may be stored in the next free address of the binary CAM and the entry candidate may be stored in the corresponding row of the memory. In the embodiment of FIG. 45, the write strobe signal 660 is asserted (e.g. by an instruction decoder) during a binary CAM load operation; an operation during which the binary CAM flag 606 is low if the binary CAM is full and high if the binary CAM is not full. Thus, the buffered binary CAM flag 662 indicates whether the binary CAM is full. The buffered binary CAM flag 662, block select signal, and NFA signals 212 are supplied to non-inverting inputs of AND gate 665, and the binary CAM flag 606 is supplied to an inverting input of AND gate 665. Consequently, AND gate 665 outputs a high signal to OR gate 663 (resulting in assertion of the block flag 616) if the hash CAM block is selected to participate in a NFA operation (block select signal 332 and NFA signal 212 are high) in which no match is detected in the binary CAM (binary CAM flag 606 is low) and the binary CAM is not full (buffered binary CAM flag 662 is high).

Figure 46:
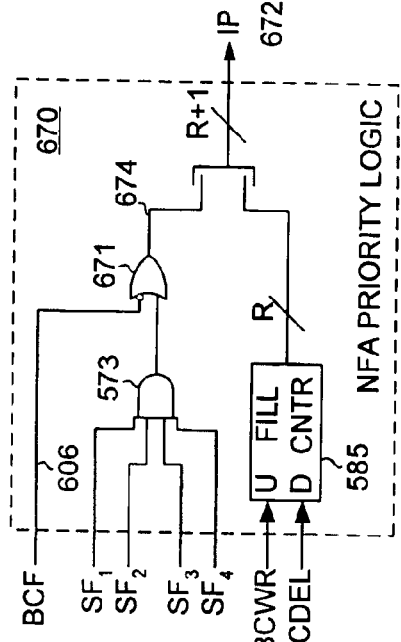
FIG. 46 illustrates a NFA priority logic embodiment that may be included within the segment priority logic of FIG. 44.

FIG. 46 illustrates a NFA priority logic embodiment 670 that may be included within the segment priority logic 647 of FIG. 44 (other embodiments may be used). The NFA priority logic 670 generates an insert priority value 672 in the manner described in reference to the NFA priority logic 580 of FIG. 35, except that OR gate 671 is provided to force partial fill bit 674 to a logic high state (thereby indicating a completely empty row) if the binary CAM flag 606 is not high. That is, if no match is detected in the binary CAM during a NFA operation, an ensuing entry insertion within the hash CAM block (i.e., if the hash CAM block is selected for entry insertion) will occur in a completely unfilled row. If a match is detected in the binary CAM, the binary CAM flag 606 will be high to enable AND gate 573 to control the state of the partial fill bit 674. AND gate 573 will drive the partial fill bit 674 high if any of the segment flags $SF_1$–$SF_4$ indicate an empty segment.

Figure 47:
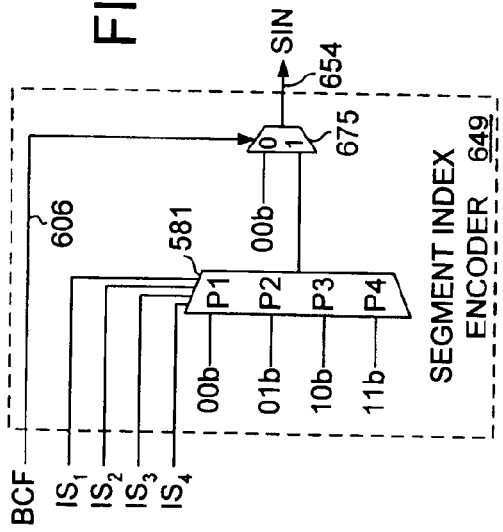
FIG. 47 illustrates an embodiment of the segment index encoder of FIG. 44.

The fill counter 585 within priority logic 670 is incremented in response to a binary CAM load (indicated by a BCWR signal) and decremented in response a binary CAM delete (indicated by a BCDEL signal). By this arrangement, the fill counter 585 indicates the number of rows within the memory array which are at least partially filled. As discussed above, different fill measures may be used in alternative embodiments, and the fill count may be omitted from the insert priority value 672 altogether. FIG. 47 illustrates an embodiment of the segment index encoder 649 of FIG. 44 (other embodiments may be used). The segment index encoder 649 operates similarly to the segment index encoder 493 of FIG. 36, except that an additional multiplexer 675 is provided to force the segment index 654 to zero if the binary CAM flag 606 is not asserted. Thus, if no match is found within the binary CAM during a NFA operation, any subsequent insertion into the memory array will occur within a completely unfilled row and therefore will be directed to a predetermined segment of the row (in this example, the segment indicated by segment address 00b). Note that, in an alternate embodiment, the binary CAM flag 606 may be inverted, then logically ORed with index select signal $IS_1$ to achieve the same result achieved by the addition of multiplexer 675.

Figure 48:
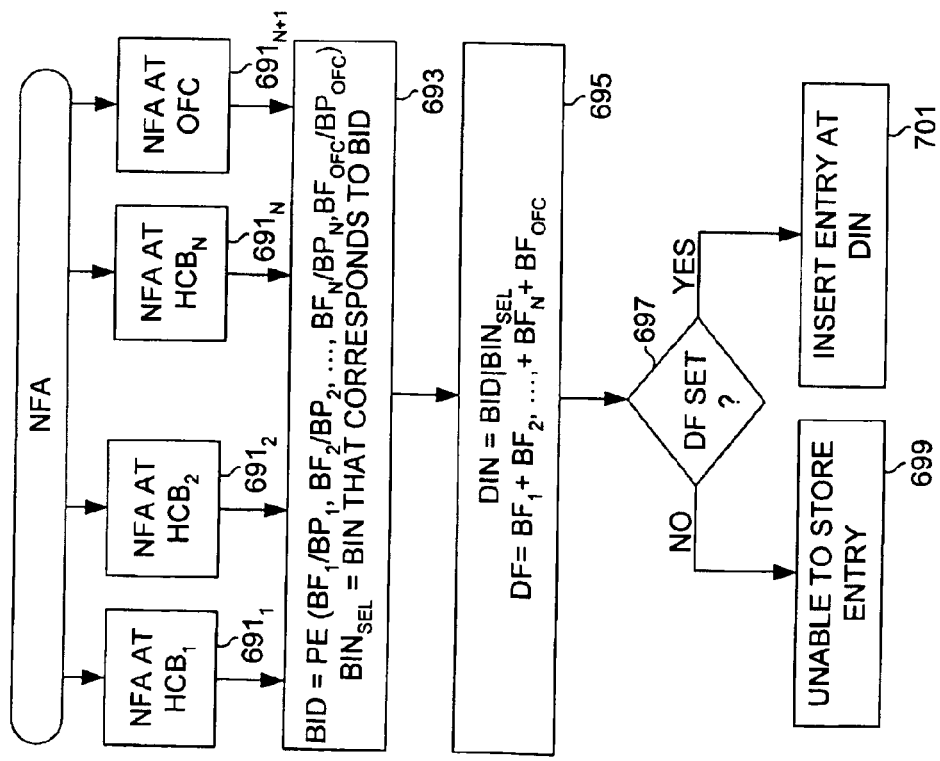
FIG. 48 is a flow diagram of a NFA operation within a hash CAM device that includes multiple hash CAM blocks each according to FIG. 41.

FIG. 48 is a flow diagram of a NFA operation within a hash CAM device that includes N hash CAM blocks each according to FIG. 41. At $691_1$–$691_N$, concurrent NFA operations are performed within each of the N hash CAM blocks. In one embodiment, a NFA operation is also performed within the overflow CAM block at $691_{N+1}$ (i.e., concurrently with operations $691_1$–$691_N$) to determine whether the overflow CAM block includes any storage rows that are at least partly unoccupied and that have been tagged with an entry type that matches the class code specified by the NFA instruction. If such a storage row is detected, the overflow CAM outputs a predetermined priority value and asserts its block flag. This operation of the overflow CAM is discussed below in greater detail.

Still referring to FIG. 48, at 693 the block flags are priority encoded according to their corresponding block priority values to generate a block identifier (BID). The block index that corresponds to the block identifier is selected as the block index component of the device index (i.e., $BIN_{SEL}$). At 695, the block identifier and selected block index are output as the device index (DIN), and the device flag is generated, for example, by ORing the block flags from the hash CAM blocks and the overflow CAM block. At 697, the device flag is evaluated to determine whether a CAM block (hash CAM block or overflow CAM block) within the CAM device is able to store the entry candidate. If the device flag is not asserted, the hash CAM device is unable to store the entry (699). If the device flag is asserted, the entry is inserted at the CAM block and memory location indicated by the device index (701). The entry may be inserted at the indicated location without further host instruction (i.e., CAM device automatically inserts the entry in response to assertion of the device flag), or, alternatively, in response to a separate insert instruction from a host device.

Figure 49:
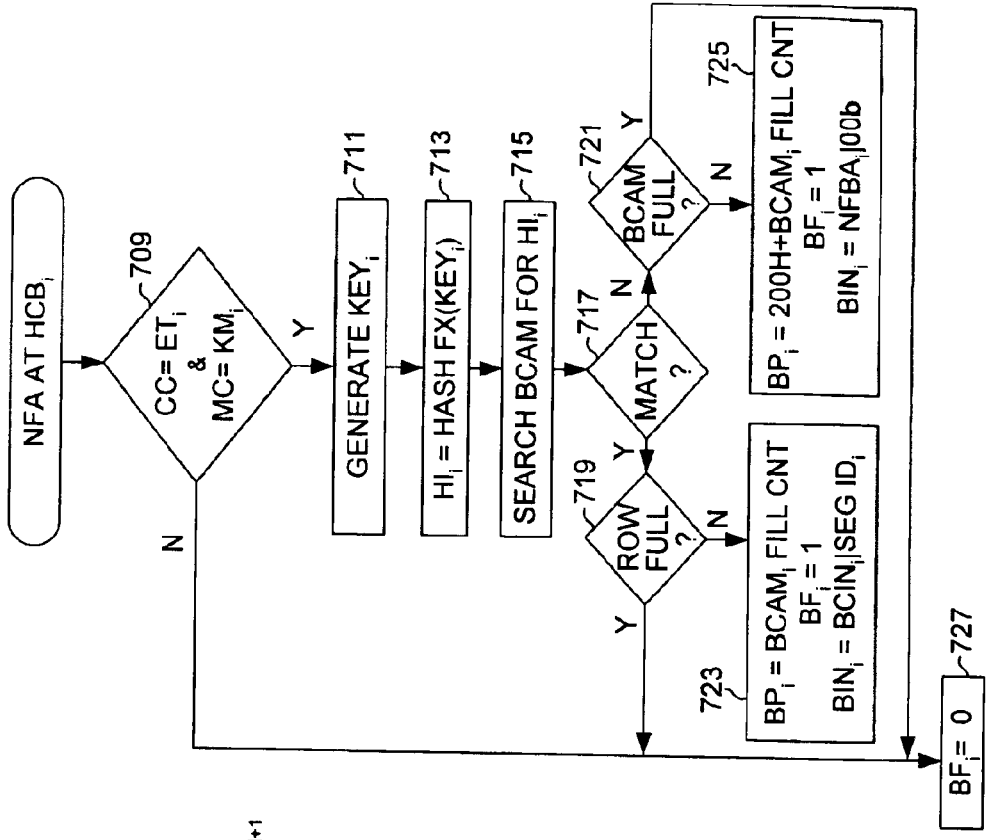
FIG. 49 is a flow diagram of a NFA operation within the hash CAM block of FIG. 41.

FIG. 49 is a flow diagram of a NFA operation within an $i^{th}$ one of the hash CAM blocks of FIG. 41, i being any integer value from 1 to N. At 709, the class code of the NFA instruction (CC) is compared with the entry type of the CAM block ($ET_i$), and the mask code of instruction (MC) is compared with the key mask of the CAM block ($KM_i$). If the class code does not match the entry type or the mask code does not match the key mask, the block flag is deasserted at 727 and the NFA operation within the hash CAM block is concluded. If the class code matches the entry type and the mask code matches the key mask, a key is generated at 711 and used to generate a hash index ($HI_i$) at 713. At 715, the binary CAM is searched for a match with the hash index generated at 713. If a matching hash index is detected within the binary CAM at 717, the corresponding row of the memory array is output to the output logic to determine whether the row is full (719). If the row is not full, a partially filled row has been detected. Accordingly, at 723, the binary CAM fill count is output as the block priority value (the partial fill bit being cleared to 0), the block flag is asserted, and the binary CAM index (BCIN) and segment index (i.e., address of an unoccupied segment within the partially filled row) are output as the block index. If the row is full, the hash CAM block is conflicted and the block flag is deasserted at 727.

If a match is not detected within the binary CAM (717), then at 721 a buffered binary CAM flag (stored during the most recent binary CAM load operation) is inspected to determine whether the binary CAM is full. If the binary CAM is full, the block flag is deasserted at 727. If the binary CAM is not full, then at 725 the binary CAM fill count and a logic high partial fill bit (indicated by the summation of 200 hex and the fill count in the example of FIG. 49) are output as the block priority value, the block flag is asserted, and the next free binary CAM address (NFBA) and predetermined segment index (00 in this example) are output as the block index.

FIG. 50 is a flow diagram of an insert operation within hash CAM device that includes multiple hash CAM blocks each according to FIG. 41. At 741, the block ID component of a device index generated during the NFA operation of FIG. 48 is compared with the block ID of the overflow CAM ($BID_{OFC}$) to determine whether the entry candidate is to be inserted within the overflow CAM. If so, then at 743 the entry is stored in the CAM array of the overflow CAM at the row and segment indicated by the block index component ($BIN_{SEL}$) of the NFA-generated device index. If the block ID does not match the overflow CAM block ID, then the block ID corresponds to a hash CAM block ID, and the binary CAM flag of the hash indicated hash CAM block is evaluated at 745. If the binary CAM flag is set, then a matching hash index was located within the binary CAM and, at 747, the entry is stored in the hash CAM block memory at the row and segment indicated by block index component of the NFA-generated device index. If the binary CAM flag is not set, then no matching hash index was located within the binary CAM of the indicated hash CAM block. Accordingly, at 749, the NFA-generated hash index is stored at the next free address of the binary CAM (NFBA) of the indicated hash CAM block; at 751, the entry is stored in the hash CAM block memory at a predetermined segment (e.g., segment 1) of the row indicated by the next free binary CAM address; at 753, the next free binary CAM address register is updated with the binary CAM index generated during the binary CAM load (that is the address of the next free binary CAM location); and at 755, the row fill count is incremented.

FIG. 51 is a flow diagram of a search operation within an $i^{th}$ one of the hash CAM blocks of FIG. 41, i being any integer value from 1 to N (note that a device level search may be performed as described in reference to FIG. 23). At 761, the class code of the search instruction (CC) is compared with the entry type of the CAM block ($ET_i$). If the class code does not match the entry type, the block flag is deasserted at 777 and the search operation within the hash CAM block is concluded. If the class code matches the entry type, a key is generated at 763 and used to generate a hash index ($HI_i$) at 765. At 767, the binary CAM is searched for a match with the hash index generated at 765. If a matching hash index is detected within the binary CAM at 769, the contents of the corresponding row of the memory array are output to the output logic for comparison with the search key (771). If, at 773, the row of the memory array is determined to contain a valid entry that matches the search key, then a match has been detected. Accordingly, at 775, the block flag for the hash CAM device is asserted (e.g., $BF_1=1$), the binary CAM index and segment address of the matching entry ($SA_{ME}$) are output as the block index ($BIN_i$), and the priority value stored within the matching entry ($PRI_{ME}$) is output as the block priority ($BP_i$). If row does not contain a valid entry that matches the search key, then the block flag is deasserted at 777 to indicate that no match was detected.

Overflow CAM Having Search-Based NFA Function

Figure 52:
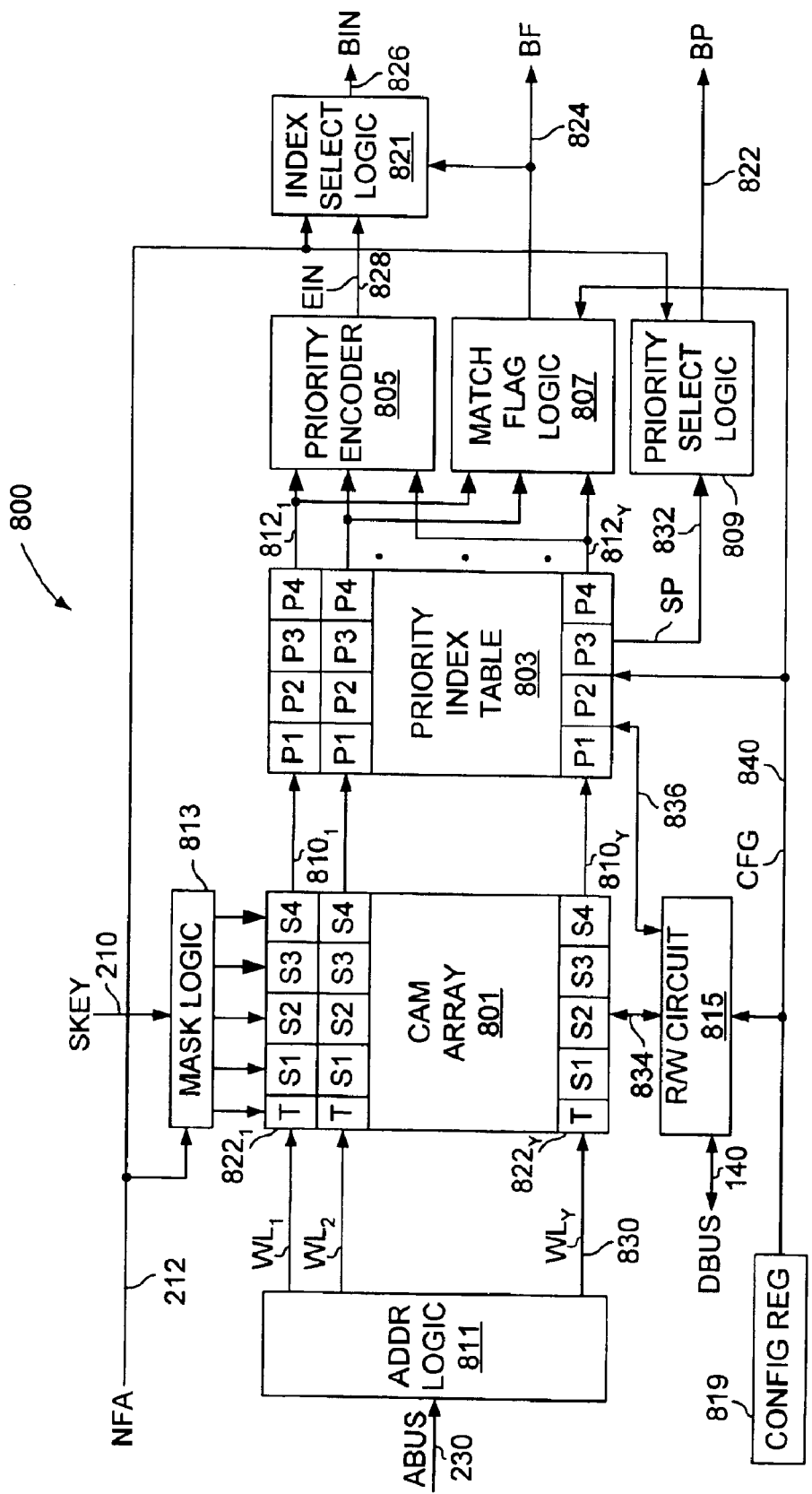
FIG. 52 illustrates an embodiment of an overflow CAM block having a programmable data storage width and a programmable priority function.

FIG. 52 illustrates an embodiment of an overflow CAM block 800 having a programmable data storage width and a programmable priority function. The overflow CAM block 800 includes a CAM array 801, address logic 811, mask logic 813, priority index table 803, priority encoder 805, read/write circuit 815, match flag logic 807, index select logic 821, priority select logic 809 and block configuration register 819. The configurable CAM array includes Y rows $822_1$–$822_Y$ of CAM cells with each row segmented into a tag (T) segment and four entry segments (S1–S4). More or fewer segments may be provided in alternative embodiments, and the tag segment may be omitted. Each of the CAM cells includes storage for at least one data bit, and a compare circuit to compare the data bit with a corresponding bit of a search key 210. The CAM cells may be binary CAM cells, ternary CAM cells (i.e., CAM cells that permit selective masking of mismatch conditions), range compare cells, or any combination of binary, ternary and/or range compare CAM cells. One or more of the row segments may also include a different number of CAM cells than others of the row segments. For example, in one embodiment, the tag segment includes four CAM cells to store three tag bits and a validity bit, while each of the entry segments, S1–S4, includes more than three CAM cells.

The CAM array 801 can be configured into different width by depth configurations by programming an entry size value into the configuration register 819. The entry size information is output as a set of one or more signals 840 (CFG) to configuration dependent circuit blocks within the overflow CAM block 800. In the exemplary embodiment shown in FIG. 52, each row of CAM cells within the CAM array 801 may be configured to store four data entries that each span a single entry segment (x1 configuration), two data entries that each span two entry segments (x2 configuration), or a single entry that spans all four entry segments (x4 configuration). In alternative embodiments, the overflow CAM block 800 may have more or fewer segments and/or more or fewer configuration options. Also, other types of configuration information may be programmed within configuration register 819 in alternative embodiments.

When an entry is loaded into the CAM array 801, the address logic 811 decodes an address received via bus 230 to assert an indicated one of the word lines 830 ($WL_1$–$WL_Y$), and the read/write circuit 815 drives an entry onto array bit lines 834 of the appropriate entry segment or segments (as discussed above, a segment address portion of the incoming address may be used in conjunction with the configuration value to select one or more entry segments to be written). A priority value may be loaded into the priority index table 803 (e.g., by the operation of read/write circuit 815 to drive a priority value onto priority bit lines 836) concurrently with the loading of the corresponding entry within the CAM array 801 or at a different time. In the x1 configuration, for example, entries stored within segments S1–S4 of a given row of the CAM array 801 correspond to priority values stored within priority storage circuits P1–P4 in the priority index table 803. In one embodiment, the priority values used in the x1, x2 and x4 configurations are the same size (i.e., have the same number of constituent bits). Consequently, in the x1 embodiment, each of the four priority storage circuits P1–P4 is used to store a priority value that corresponds to an entry in a corresponding one of entry segments S1–S4, while in the x2 configuration, only two of the priority storage circuits are used to store priority values (i.e., to correspond to respective entries that span two entry segments), and in the x4 configuration, only one of the priority storage circuits is used to store a priority value (i.e., to indicate the priority of a corresponding x4 entry). In the x2 and x4 configurations, the unused priority circuits may be disabled or loaded with null data (e.g., minimum priority values). In alternative embodiments, differently sized priority values may be used for different CAM array configurations, and all or a portion of one priority storage circuit may be concatenated with another priority storage circuit to enable storage of larger sized priority values.

The priority values stored within the priority index table 803 indicate the relative priorities of corresponding entries within the CAM array 801 and may be assigned in ascending priority order or descending priority order. During a search operation, search key 210 is simultaneously compared with all the entries within the CAM array 801 to generate a set of match signals $810_1$–$810_Y$, each indicating whether an entry or entries within a corresponding row of the CAM array 801 matches the search key 210. The priority values within the priority index table 803 that correspond to key-matching entries within the CAM array 801 (i.e., match-qualified priority values) are compared with one another to determine a highest priority match-qualified priority value. The highest priority match-qualified priority value is output from the priority index table 803 as a search priority value 832 (SP) and is received by the priority select logic 809. The priority select logic 809 selects, according to the state of NFA signal 212, either the search priority value 832 or an insert priority value to be output as the block priority value 822. More specifically, during an NFA operation, when the NFA signal 212 is high, the priority select logic 809 outputs an insert priority value, and during a search operation, when the NFA signal is low, the priority select logic 809 outputs the search priority value 832.

The priority index table additionally outputs a set of qualified match signals 812 to the priority encoder 805 and match flag logic 807. Each of the qualified match signals corresponds to a row of the priority index table 803 (and therefore to a row of CAM array 801) and is asserted if a match qualified priority value equal to the search priority value 832 is stored in the priority index table row.

Figure 53:
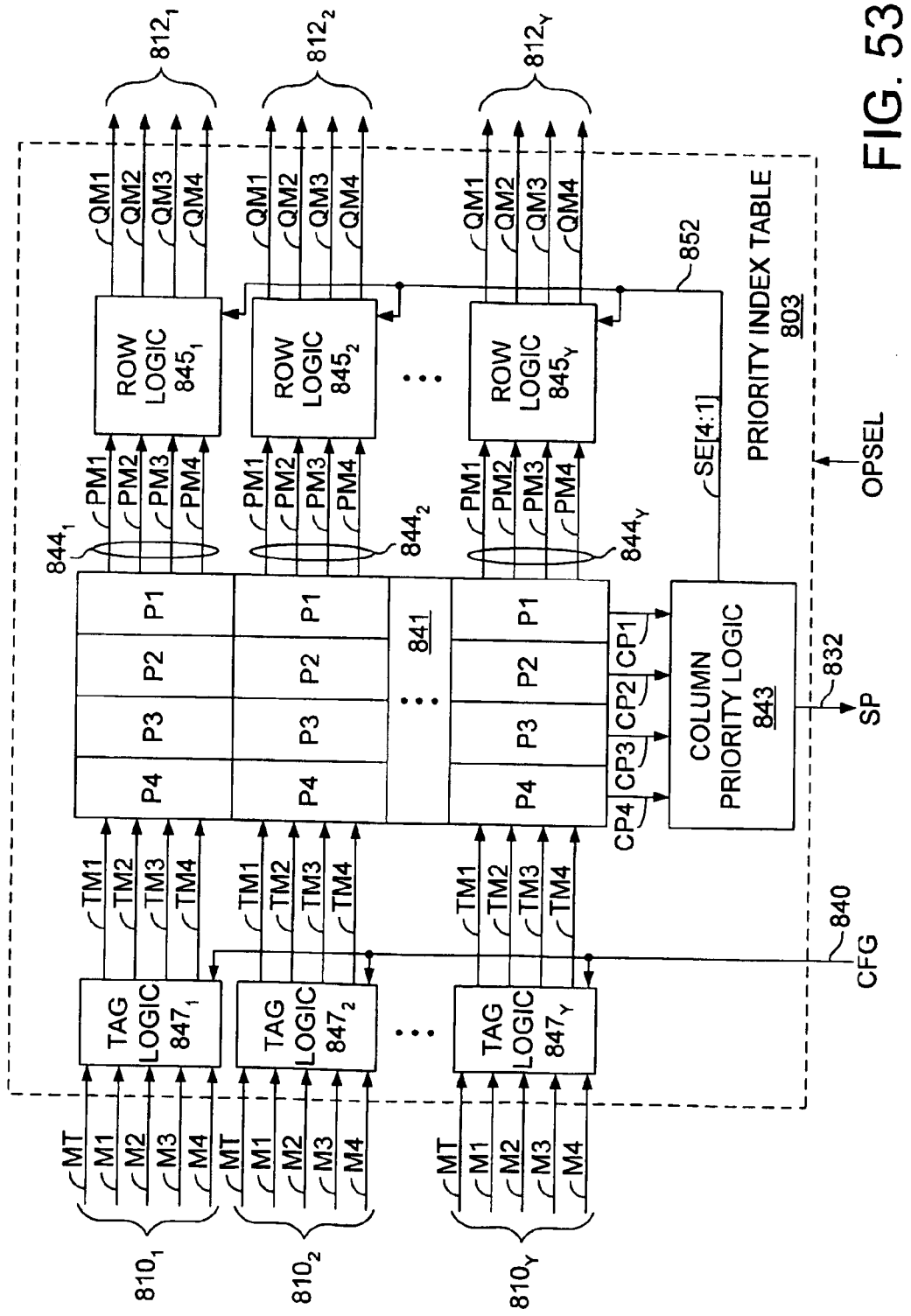
FIG. 53 illustrates an embodiment of the priority index table of FIG. 52.

FIG. 53 illustrates an embodiment of the priority index table 803 of FIG. 52 (other embodiments may be used). The priority index table 803 includes a segmented priority number storage array 841 (referred to herein as a priority array), tag logic circuits $847_1$–$847_Y$, column priority logic 843, and row logic circuits $845_1$–$845_Y$. The priority index table 803 receives priority values from, and outputs priority values to read/write circuit 815 of FIG. 52 (e.g., via bit lines not shown in FIG. 53). During a search or insert operation in the CAM array, the priority index table 803 receives Y sets of match signals $810_1$–$810_Y$ from the CAM array 801 and generates Y corresponding sets of qualified match signals $812_1$–$812_Y$ in accordance an operation select signal, OPSEL (generated, for example, by the instruction decoder 302 of FIG. 15) and the entry size information, CFG 840.

Each of the Y tag logic circuits 847 receives a respective match signal 810 from a corresponding row of the CAM array. In one embodiment, each of the match signals 810 includes five component match signals MT and M1–M4, that correspond to the tag segment and entry segments S1–S4, respectively. Each of the tag logic circuits $847_1$–$847_Y$ outputs a respective set of four tag match signals, TM1–TM4, with each of the tag match signals being asserted if (1) a tag value stored in the tag segment matched a class code value associated with the search key (i.e., the class code value (CC) discussed above in reference to FIG. 17), and (2) an entry stored in the corresponding entry segment (or, in the x2 and x4 configurations, in a group of two or four entry segments) matched the search key. The entry size information, CFG 840, is input to the tag logic circuits $847_1$–$847_Y$ to qualify the detection of a match condition.

In the embodiment of FIG. 53, the priority array 841 includes Y rows of priority cells, each segmented into four priority storage circuits P1–P4. During a compare operation, each row of priority storage circuits receives a respective set of four tag match signals, TM1–TM4 from a corresponding tag logic circuit and outputs a corresponding set of four prioritized match signals 844 (PM1–PM4). Each asserted tag match signal is used within the priority array to enable a corresponding priority storage circuit to participate in a priority value compare operation with other such enabled priority storage circuits within the same column of priority storage circuits (the enabled priority storage circuit and priority value stored therein being referred to herein as a match-selected priority storage circuit and match-qualified priority value, respectively). The priority value compare operation within each column of priority storage circuits (i.e., $P1_1$–$P1_Y$, $P2_1$–$P2_Y$, etc.) is referred to herein as a column priority comparison and produces a respective one of column priority values CP1–CP4 (i.e., the highest priority of the match-qualified priority values within the column) and results in assertion of a prioritized match signal 844 for each match-qualified priority value that is equal to the column priority value. As an example, if during a compare operation, there is a match-qualified priority value within each of the four columns of priority storage circuits of the priority array 841, then four column priority values will be output from the priority arrays 841 to the column priority logic 843, and at least four prioritized match signals will be asserted (i.e., at least one for each column of priority storage circuits). More than one prioritized match signal may be asserted for a given column if the column contains more than one match-qualified priority value equal to the column priority value, thus providing a potential source of multiple-match indications.

Figure 54:
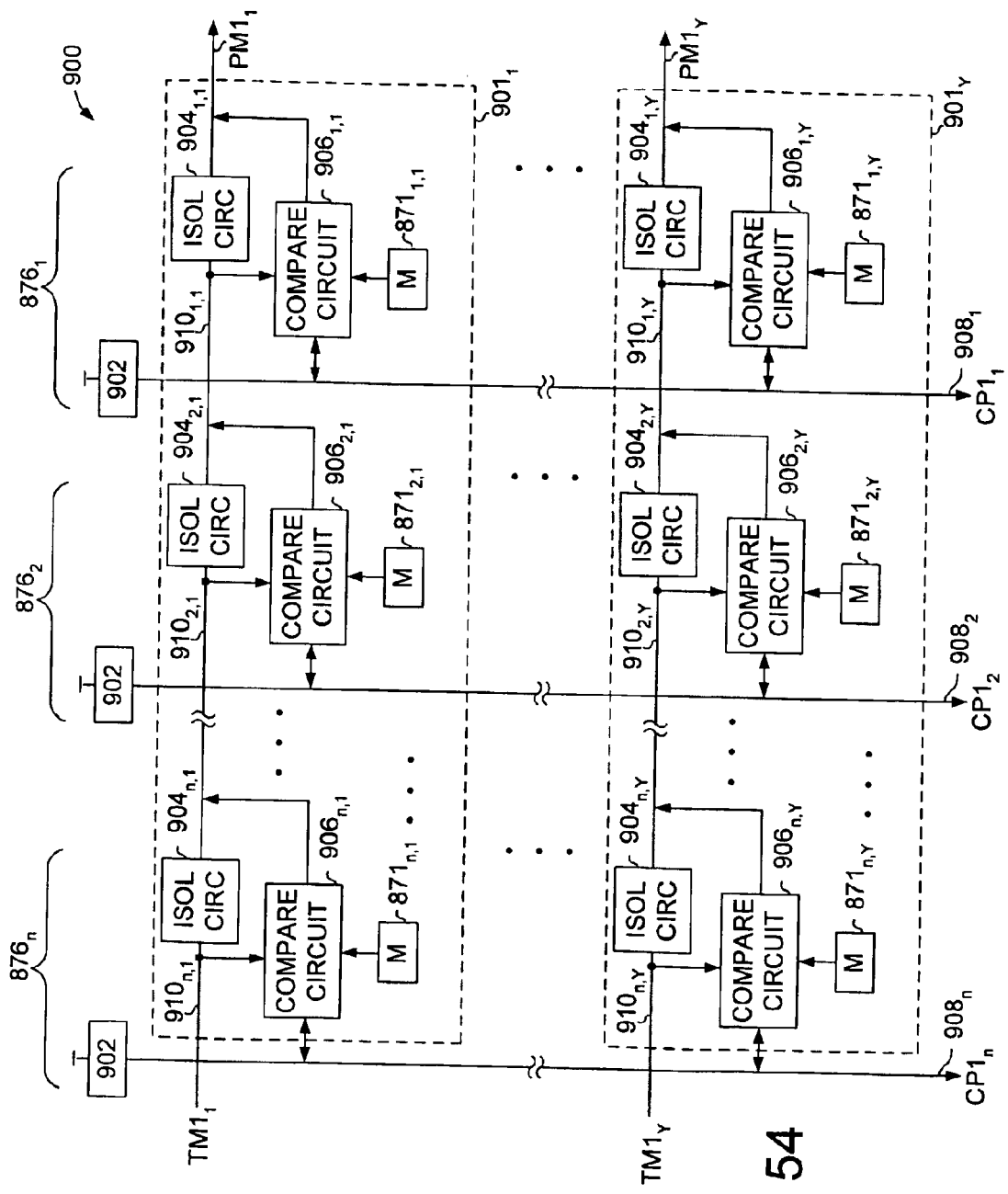
FIG. 54 shows a prior index table that is one embodiment of two priority storage circuits of the priority array of FIG. 53.

FIG. 54 shows priority index table 900 that is one embodiment of two priority storage circuits, $901_1$ and $901_Y$, of priority array 841 of FIG. 53. Each priority storage circuit includes a chain of n priority cells, with each cell including a compare circuit 906, isolation circuit 904 and storage element 871. Each compare circuit 906 is connected in a wired-OR configuration with the other compare circuits in its respective column by one of priority signal lines $908_1$–$808_n$. Each priority signal line may be pre-charged towards a power supply voltage (or any other predetermined voltage) by a pre-charge circuit 902. Each compare circuit 906 may be any digital or analog compare circuit that compares the priority value bit stored in the corresponding storage element 871 with the priority value bits stored in every other storage element 871 of the same column (i.e., bits $871_{1,1}$–$871_{1,Y}$ are compared; bits $871_{2,1}$–$871_{2,Y}$ are compared, and so forth). Additionally, each compare circuit 906 monitors the comparison result of the more significant priority value bits through the logical states of match line segments 910. Match line segments 910 are coupled between match lines that carry incoming tag match signals $TM1_1$–$TM1_Y$ and match lines that carry outgoing prioritized match signals $PM1_1$–$PM1_Y$ by isolation circuits 904. The isolation circuits 904 isolate the comparison results generated for less significant priority bit locations from affecting the comparison results generated for more significant priority bit locations. The isolation circuits 904 may also work together with the comparison circuits 906 to control the state of the match line segments 910.

Figure 55:
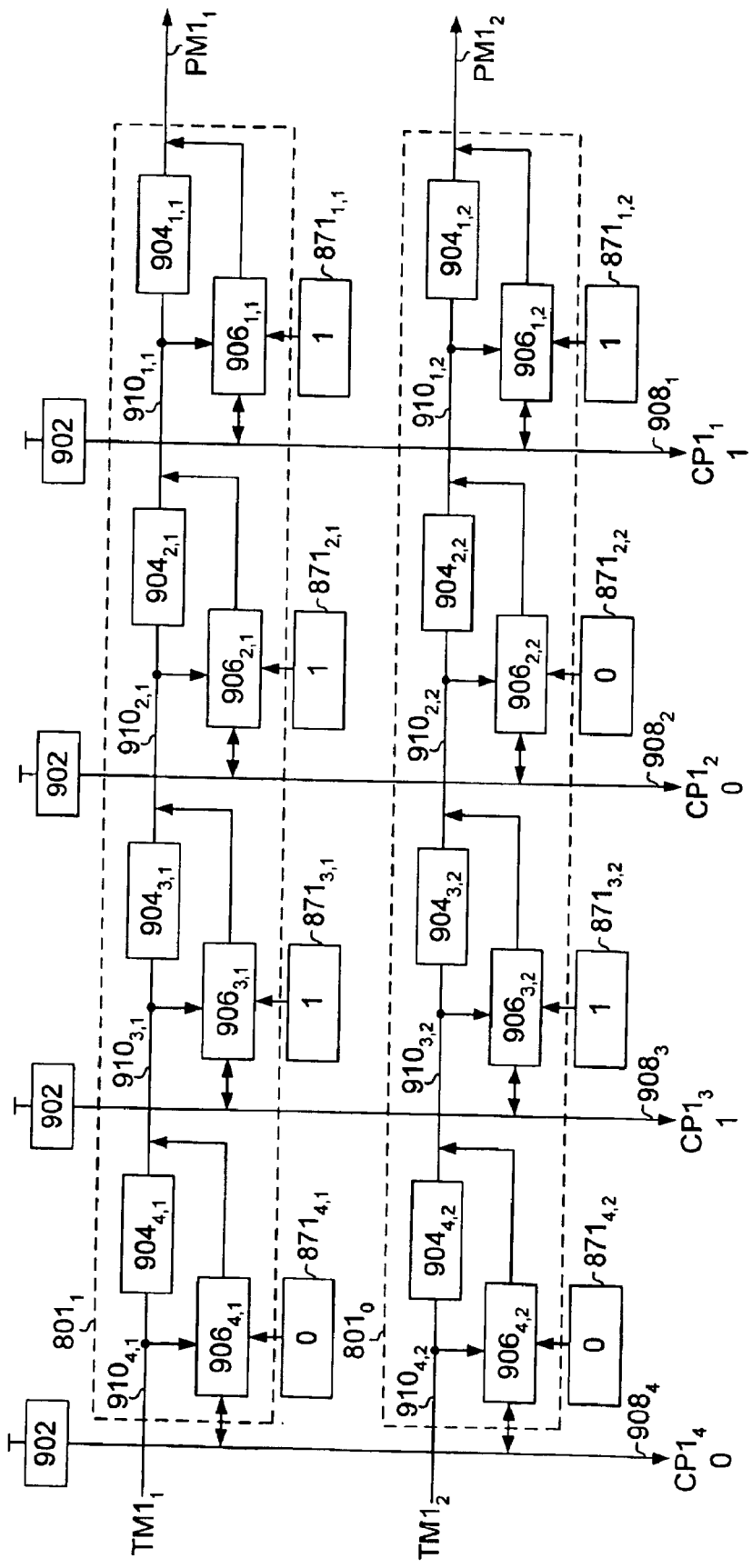
FIG. 55 illustrates an exemplary operation of the priority index table of FIG. 54.

The operation of priority index table 900 can be illustrated with an example shown in FIG. 55. In this example, priority index table 900 comprises a 2×4 matrix of rows and columns. For other embodiments, any numbers of rows and columns can be used. Row one stores priority number 0110 having the decimal equivalent of the number 6, and row two stores priority number 0101 having the decimal equivalent of the number 5. For this example, the corresponding row of the CAM array contains segment entries that result in assertion of tag match lines $TM_1$ and $TM_2$. Also, for this example, the priority numbers are stored in ascending priority order such that 0101 is the more significant (i.e., "higher priority") priority number between 0101 and 0110.

Compare circuits $906_{1,1}$–$906_{4,2}$ determine that 0101 is the more significant priority value, and cause $PM1_2$ to be asserted as follows. The most significant bit $CP1_4$ is resolved first. When any memory element 871 stores a logic zero and the corresponding match line segment 910 is asserted, the corresponding priority signal line 908 is discharged. Thus, each of compare circuits $906_{4,2}$ and $906_{4,1}$ discharge signal line $908_4$ such that $CP1_4$ is a logic zero. Additionally, compare circuit $906_{4,2}$ compares the state of priority signal line $908_4$ with the priority number bit stored in $871_{4,2}$, and determines that both have the same logic state. This causes compare circuit $906_{4,2}$ not to affect the logical state of match line segment $910_{3,2}$ such that match line segment $910_{3,2}$ has the same logic state as match line segment $910_{4,2}$ ($TM1_2$). Similarly, compare circuit $906_{4,1}$ compares the state of priority signal line $908_4$ with the priority number bit stored in $871_{4,1}$ and determines that both have the same state. This causes compare circuit $906_{4,1}$ not to affect the logical state of match line segment $910_{3,1}$ such that match line segment $910_{3,1}$ has the same logic state as match line segment $910_{4,1}$ ($TM1_1$).

The next most significant bit $CP1_3$ is then resolved. Memory elements 871 that store a logic one do not discharge their corresponding priority signal lines 908. Since memory elements $871_{3,2}$ and $871_{3,1}$ both store logic one states, signal line $908_3$ remains pre-charged such that $CP1_3$ is a logic one. Additionally, compare circuit $906_{3,2}$ compares the state of priority signal line $908_3$ with the priority number bit stored in $871_{3,2}$ and determines that both have the same logic state. This causes compare circuit $906_{3,2}$ not to affect the logical state of match line segment $910_{2,2}$ such that match line segment $910_{2,2}$ has the same logic state as match line segment $910_{3,2}$. Similarly, compare circuit $906_{3,1}$ compares the state of priority signal line $908_3$ with the priority number bit stored in $871_{3,1}$ and determines that both have the same logic state. This causes compare circuit $906_{3,1}$ to not affect the logical state of match line segment $910_{2,1}$ such that match line segment $910_{2,1}$ has the same logic state as match line segment $910_{3,1}$.

$CP1_2$ is resolved next. Since memory element $871_{2,2}$ stores a logic zero and match line segment $910_{2,2}$ is asserted, compare circuit $906_{2,2}$ discharges priority signal line $908_2$. This causes $CP1_2$ to be a logic zero. Additionally, compare circuit $906_{2,2}$ compares the logic zero state of priority signal line $908_2$ with the logic zero stored in $871_{2,2}$ and allows match line segment $910_{1,2}$ to have the same state as match line segment $910_{2,2}$. Compare circuit $906_{2,1}$, however, compares the logic zero on priority signal line $908_2$ with the logic one stored in memory element $871_{2,1}$, and de-asserts match line segment $910_{1,1}$. When a match line segment is de-asserted, all subsequent compare circuits for that row will de-assert the remaining match line segments of the row such that the corresponding prioritized match signal $PM1_1$ will be de-asserted. When the prioritized match signal is de-asserted for a particular segment, this indicates that the most significant priority number is not stored in that segment. Additionally, when the remaining match line segments are de-asserted for a row, the compare circuits for that row do not discharge the remaining priority signal lines regardless of the logic states stored in the corresponding memory elements of that row. For example, compare circuit $906_{1,1}$ does not discharge priority signal line $908_1$ even though memory element $871_{1,1}$ stores a logic zero. Additionally, isolation circuits $904_{4,1}$, $904_{3,1}$, and $904_{2,1}$ isolate the de-asserted match line segment $910_{1,1}$ from match line segment $910_{4,1}$, $910_{3,1}$, and $910_{2,1}$ such that $CP1_4$, $CP1_3$, and $CP1_2$ are not affected by the de-assertion of match line segment $910_{1,1}$.

Lastly, the least significant bit $CP1_1$ is resolved. Compare circuit $906_{1,2}$ alone determines $CP1_1$ since compare circuit $906_{1,1}$ cannot discharge priority signal line $908_1$. Since memory element $871_{1,2}$ stores a logic one and match line segment $910_{1,2}$ is asserted, compare circuit $906_{1,2}$ leaves priority signal line $908_1$ pre-charged, and $CP1_1$ is a logic one. Additionally, compare circuit $906_{1,2}$ allows prioritized match signal $PM1_2$ to have the same state as match line segment $910_{1,2}$. Since match line segment $910_{1,2}$ is asserted, $PM1_2$ will be asserted indicating that the most significant priority number is stored in that row.

Thus, when the priority comparison is completed, bits $CP1_4$–$CP1_1$ indicate that the most significant priority number stored in the priority index table is 0101, and prioritized match signal $PM1_2$ is asserted to signal that 0101 is stored in row two.

For the example described above with respect to FIG. 55, the most significant priority number is the lowest number such that 0101 is the most significant number between 0101 and 0110. For another embodiment, the priority numbers are stored in descending priority order such that 0110 is the most significant priority number between 0101 and 0110.

Any circuits may be used for compare circuits 906 and/or isolation circuits 904 to implement the priority comparison illustrated above. Table 2 shows one example of a truth table for implementing each compare circuit 906, where X (column) and Y (row) are any integers. Other truth tables may be used (and corresponding logic generated accordingly) including those that logically complement one of more or the signals indicated in Table 2. Any logic or circuitry may be used to implement the truth table of Table 2.

TABLE 2

| STATE | 908 | 871 | $910_{X,Y}$ | $910_{X-1,Y}$ |
|---|---|---|---|---|
| 0 | 0 | 0 | 0 | 0 |
| 1 | 0 | 0 | 1 | 1 |
| 2 | 0 | 1 | 0 | 0 |
| 3 | 0 | 1 | 1 | 0 |
| 4 | 1 | 0 | 0 | 0 |
| 5 | 1 | 0 | 1 | 1 |
| 6 | 1 | 1 | 0 | 0 |
| 7 | 1 | 1 | 1 | 1 |

Figure 56:
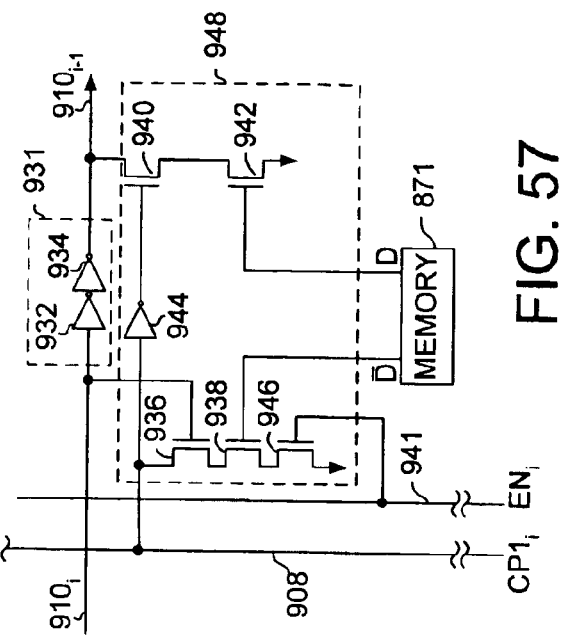
FIG. 56 shows one embodiment of a priority cell for implementing the truth table of Table 2.

FIG. 56 shows one embodiment of a circuit 930, referred to herein as a priority logic element or priority cell, for implementing the truth table of Table 2. The priority cell 930 includes compare circuit 933, isolation circuit 931, and memory element 871. Compare circuit 933 is one embodiment of compare circuit 906, and isolation circuit 931 is one embodiment of isolation circuit 904. The priority cell 930 may be used to implement all the priority cells in the priority index table.

Compare circuit 933 includes inverter 944, transistors 936 and 938 connected in series between priority signal line 908 and ground, and transistors 940 and 942 connected in series between match line segment $910_{i-1}$ and ground. N-channel transistor 936 has its drain coupled to signal line 908, its gate coupled to match line segment $910_i$, and its source coupled to the drain of n-channel transistor 938. Transistor 938 has its gate coupled to receive the logical complement of the priority number bit (/D) stored in memory element 871, and its source coupled to ground. N-channel transistor 940 has its drain coupled to match line segment $910_{i-1}$, its gate coupled to signal line 908 via inverter 944, and its source coupled to the drain of N-channel transistor 942. Transistor 942 has its gate coupled to receive the priority number bit (D) stored in memory element 871, and its source coupled to ground. Any of transistors 936, 938, 940, and 942 can be replaced with other types of transistors and the logic adjusted accordingly.

Isolation circuit 931 includes inverters 932 and 934. For alternative embodiments, only one inverter may be used and the logic of the next compare circuit adjusted accordingly. For other embodiments, other isolation circuits such as one or more AND, OR, or XOR logic gates or pass gates may be used.

Reflecting on the operation of priority cell 930, it can be seen that at least two principal functions are performed. First, the compare circuit 933 pulls down the column priority signal line 908 if (1) the incoming match line segment 910, is high (thereby indicating that priority cell 930 is enabled to participate in the bitwise priority comparison with other priority cells in the same column), and (2) the priority number bit is the lowest valued priority number bit in the column (i.e., the priority number bit, D, is a 0). Second, the priority cell 930 selectively enables or disables the next less significant priority cell from affecting the bitwise priority comparison for its column by setting the state of the outgoing match line segment $910_{i-1}$. Specifically, the priority cell 930 pulls down the outgoing match line segment $919_{i-1}$ to disable the next less significant priority cell from affecting the bitwise priority comparison for the next less significant column if (1) the incoming match line segment $910_i$ is low (i.e., causing $910_{i-1}$ to be pulled down via isolation circuit 931) or (2) the column priority signal line 908 settles to a low state and the priority number bit, D, is a 1 (i.e., priority cell 930 is a loser of the column priority comparison). In a priority table having Y rows (priority cell 930 being at column i, now j), the above described functions may be described by the following Boolean expressions:

$$/CPI_i = (910_{i,1} * /D_{i,1}) + (910_{i,2} * /D_{i,2}) + \ldots + (910_{i,Y} * /D_{i,Y}) \quad (1)$$

$$/910_{i-1,j} = /910_{i,j} + (D_{i,j} * /CPI_i) \quad (2)$$

Substituting (1) for $CP1_i$ in expression (2) yields:

$$/910_{i-1,j} = /910_{i,j} + [D_{i,j} * \{(910_{i,1}) + (910_{i,2} * /D_{i,2}) + \ldots + (910_{1,Y} * /D_{i,Y})\}]$$

Thus, if the incoming match line segment $910_i$ is high and the priority number bit, D, is a 1, the outgoing match line segment $910_{i-1}$ may not settle to its final state until all (or a significant number) of the priority cells within the same column have completed their comparisons of priority number bits and input match line segment states. Because of this potentially long settling time, it becomes possible for the outgoing match line segment $910_{i-1}$ to temporarily be high, before ultimately being pulled low. Consequently, the next less significant priority cell within may be enabled to temporarily pull the next less significant column priority signal line low (i.e., $CP1_{i-1}=0$) before finally being disabled by the low going match line segment $910_{i-1}$. While an array of the priority cells 930 is self-correcting and will ultimately output the correct set of priority number bits as the column priority value and will assert the proper prioritized match signals, the temporary transition of one or more priority cells to an incorrect state requires time to correct. That is, transistor states require time to be reversed, and signal lines require time to charge/discharge, thereby slowing the overall generation of prioritized match signals and determination of a column priority number.

Figure 57:
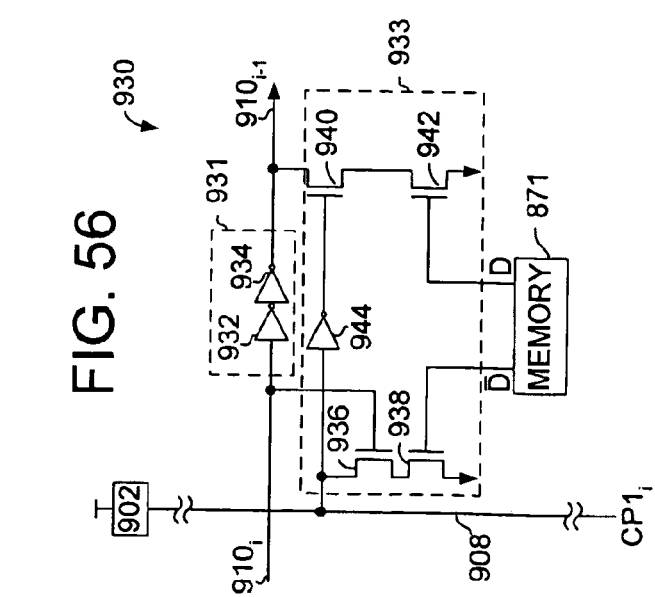
FIG. 57 illustrates an alternate embodiment of a priority cell for implementing the truth table of Table 2.

FIG. 57 illustrates an alternate embodiment of a priority cell 945 that includes timing circuitry to prevent the priority cell 945 from affecting the state of its column priority signal line 908 until the state of the incoming match line segment $910_i$ has settled. The priority cell 945 includes an isolation circuit 931, compare circuit 948, and memory element 871, all coupled in the manner described in reference to FIG. 56 to match line segments $910_i$ and $910_{i-1}$ and column priority signal line 908. The compare circuit 948 is identical to the compare circuit 933 except that a ripple control transistor 946 is coupled between the source of transistor 938 and ground. A gate terminal of ripple control transistor 946 is coupled to an enable signal line 941 ($EN_i$) so that, until a ripple enable signal is asserted on line 941 (i.e., driving line 941 high), compare circuit 948 is disabled from affecting the state of the column priority signal line 908. Thus, even if transistors 936 and 938 are switched on (and therefore poised to pull line 908 low), the compare circuit 948 will not affect the state of the column priority signal line 908 until the ripple enable signal is asserted on line 941. Because other priority cells within the same column also include a ripple control transistor 946 having a gate terminal coupled to line 941, the state of the column priority signal line 908 will remain unaffected (i.e., line 908 will remain precharged to a high logic level via circuit 902 in this example). Further, by providing separate enable signal lines 941 at staggered times (i.e., one after another, progressing from most to least significant column), the priority index table can be made to generate a set of prioritized match signals and a column priority value without any priority cells transiently entering an incorrect state. Overall, a priority index table implemented with priority cells 945 may exhibit faster operation than a priority array implemented using the priority cells 930 of FIG. 56. Also, because the state of each column priority signal line 908 is settled before a less significant column priority signal line is affected, isolation circuit 931 may be omitted from priority cell 945 (i.e., a single shared match line may be coupled to each of the priority cells in a given row).

Figure 58:
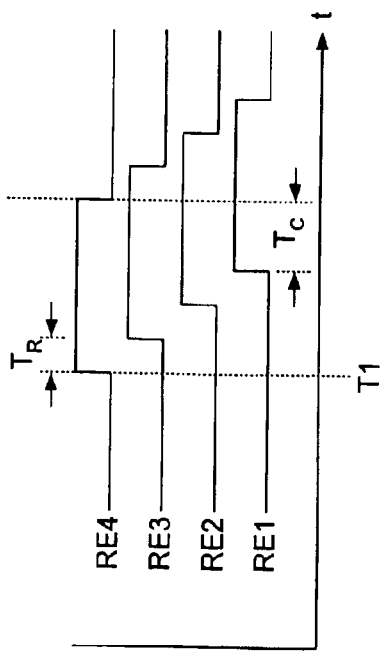
FIG. 58 illustrates waveforms of enable signals that may be used within a priority index table having priority cells according to FIG. 57.

FIG. 58 is a waveform diagram of four ripple enable signals, RE1–RE4, that may be used to control a priority index table containing four columns of priority cells according to FIG. 57. As shown, ripple enable signal RE4 goes high at time T1 to enable the priority cells in the most significant column of priority cells to set the state of the most significant column priority signal line (i.e., pull down or not pull down line 908 of FIG. 57) and to set the states of their respective row match lines (i.e., pull down or not pull down line 910 of FIG. 57). After a predetermined time, $T_R$, ripple enable signal RE3 goes high to enable the priority cells in the next less significant column to set the state of the next less significant column priority signal line and to set the states of their respective row match lines (i.e., if not already pulled down). Ripple enable signals RE2 and RE1 are similarly asserted at subsequent, staggered $T_R$ intervals to enable the operation of their respective columns of priority cells.

In one embodiment, $T_R$ is a fixed value that corresponds to a time required for a column of priority cells to resolve the state of the column priority signal line (e.g., resolution time plus a tolerance value). Alternatively, $T_R$ may be a programmable value within the CAM device (e.g., stored in the configuration register 819 of FIG. 53 or other volatile or nonvolatile storage) that may be set once (e.g., production time setting according to supply voltage level, empirically determined operating speed of the device (e.g., binning), customer specification, etc.), or may be established during device run-time (e.g., as part of device initialization or periodically to compensate for changes in operating conditions such as supply voltage and temperature).

A predetermined time after ripple enable signal RE1 has been asserted, $T_C$, the priority number comparison is completed and all the ripple enable signals may be deasserted in preparation for the next priority number comparison. In the example of FIG. 58, each of the ripple enable signals is a pulse that is phase offset from the others of the pulses by time $T_R$ so that both the assertion and deassertion times of the ripple enable signals is staggered. Although $T_C$ is depicted in FIG. 58 as being a longer time than $T_R$, $T_C$ may alternatively be equal to or shorter than $T_R$.

Referring again to FIG. 53, the column priority logic 843 compares the column priority values received from the priority array 841 to generate a search priority value, SP, that is the highest priority one of the column priority values. The column priority logic 843 further generates a set of four segment enable signals 852 SE[4:1], each segment enable signal 852 being asserted or deasserted according to whether a corresponding one of the four column priority storage circuits contains a priority value equal to the search priority value. Thus, in the embodiment of FIG. 53, if only one column of priority storage circuits contains a priority value equal to the search priority value, then only one of the four segment enable signals 852 will be asserted. Conversely, if more than one column of priority storage circuits contains a priority value equal to the search priority value, then more than one of the four segment enable signals 852 may be asserted. The row logic circuits 845$_1$-845$_Y$ receive respective sets of the prioritized match signals 844$_1$-844$_Y$ from the priority array 841 and output, according to the segment enable signals 852, respective sets of qualified match signals 812$_1$-812$_Y$, each set of qualified match signals including four component match signals, QM1–QM4. In one embodiment, the column priority logic 843 is implemented in the same manner as the search priority logic 550 of FIG. 34, except that the segment flag signals and OR gates 541, 543, 545 and 547 are omitted (i.e., the column priority values are input directly to the comparators); the outputs of AND gates 555, 557, 559 and 561 corresponding to the segment enable signals 852 SE[4:1]. In alternative embodiments, other circuits may be used to implement the column priority logic 843 including, without limitation, a priority array as described in reference to FIGS. 52–54 in which the priority values are supplied from priority array 843 rather than being self contained.

Figure 59:
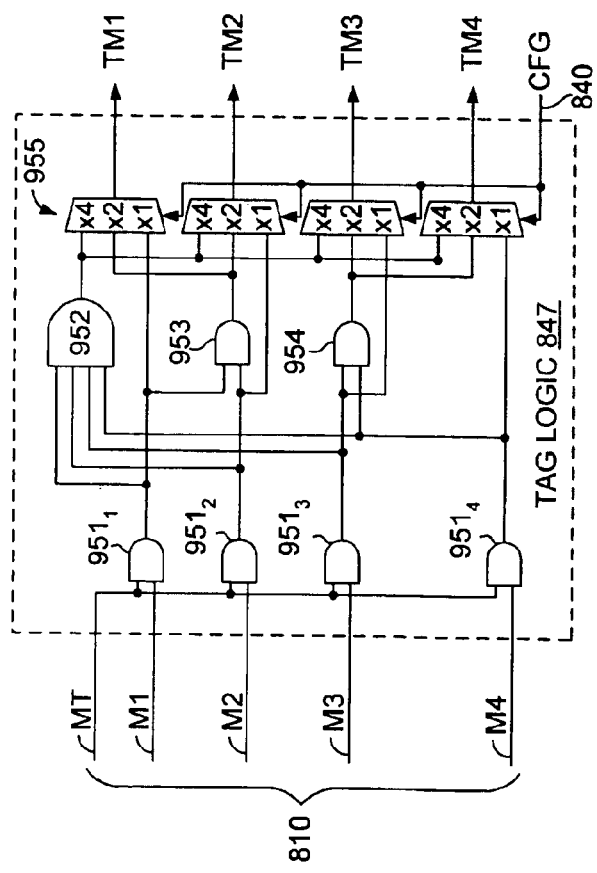
FIG. 59 illustrates an embodiment of the tag logic of FIG. 53.

FIG. 59 illustrates an embodiment of the tag logic 847 of FIG. 53. The tag logic 847 includes AND gates 951$_1$-951$_4$, 952, 953 and 954, and multiplexer bank 955. The tag logic 847 receives a row match signal 810 from a corresponding row of the CAM array, the row match signal 810 including tag segment match signal (MT) and entry segment match signals (M1–M4) as discussed. The tag logic 847 includes four AND gates 951$_1$-951$_4$ each of which receives the tag segment match signal (MT) at a first input and a respective one of the entry segment match signals (M1–M4) at a second input. The output of each of the AND gates 951$_1$-951$_4$ is output to a x1 port of a respective one of the multiplexers 955 so that, when the entry size information 840 (CFG) indicates a x1 mode, the outputs of AND gates 951$_1$-951$_4$ are selected to be the tag match signals TM1–TM4, respectively. Thus, in the x1 configuration, tag match signal TM1 is asserted if the tag segment match signal (MT) (i.e., indicating that the tag matched a class code for the search key) and the entry segment 1 match signal (M1) (i.e., the entry in segment 1 matched the search key) are both asserted. The tag match signals TM2, TM3 and TM4 are similarly asserted if the tag segment match signal (MT) is asserted and entry segment match signals M2, M3 and M4, respectively, are asserted.

If the entry size information 840 indicates a x4 configuration, the output of AND gate 952 is selected to drive each of the tag match signals TM1–TM4. AND gate 952 performs a logical AND of the outputs of all the AND gates 951$_1$-951$_4$ and therefore outputs a logic high signal only if all the incoming segment match signals (MT and M1–M4) are high. Thus, in the x4 condition, all the tag match signals TM1–TM4 are asserted (i.e., to a high logic state in this example) if (1) the stored tag matches the class code associated with the search key, and (2) a x4 entry stored in segments 1–4 matches the search key (as indicated by assertion of signals M1–M4). If the stored tag does not match the class code, or any of the entry segment match signals indicate a mismatch condition, all the tag match signals TM1–TM4 are deasserted to indicate a mismatch.

If the entry size information 840 indicates a x2 configuration, the output of AND gate 953 is selected to drive tag match signals TM1 and TM2, and the output of AND gate 954 is selected to drive tag match signals TM3 and TM4. AND gate 953 performs a logical AND of the outputs of AND gates 951$_1$ and 951$_2$ and therefore outputs a logic high signal if (1) the stored tag matches the class code associated with the search key, and (2) a x2 entry stored in segments 1 and 2 matches the search key (as indicated by assertion of signals M1 and M2). If the stored tag does not match the class code or if either of entry segment match signals M1 and M2 indicate a mismatch condition, tag match signals TM1 and TM2 are both deasserted to indicate a mismatch. AND gate 954 performs a logic AND of the outputs of AND gates 951$_3$ and 951$_4$ and therefore outputs a logic high signal if (1) the stored tag matches the class code associated with the search key, and (2) a x2 entry stored in segments 3 and 4 matches the search key (as indicated by assertion of signals M3 and M4). If the stored tag does not match the class code or if either of entry segment match signals M3 and M4 indicate a mismatch condition, tag match signals TM3 and TM4 are both deasseerted to indicate a mismatch.

Note that for all entry size configurations, the tag match signals TM1–TM4 are deasserted if the tag segment match signal is deasserted (indicating a mismatch between the stored tag and class code for the search value). In alternative embodiments, the tag segment may be used to qualify the entry segment match signals for only a set of one or more of the entry size configurations, with the set of configurations being fixed or programmable (e.g., by a configuration setting within register 819 of FIG. 52). In another alternative embodiment, the match the tag segment may be omitted from the CAM array 801 and the tag logic 847 omitted from the priority index table 803.

Figure 60:
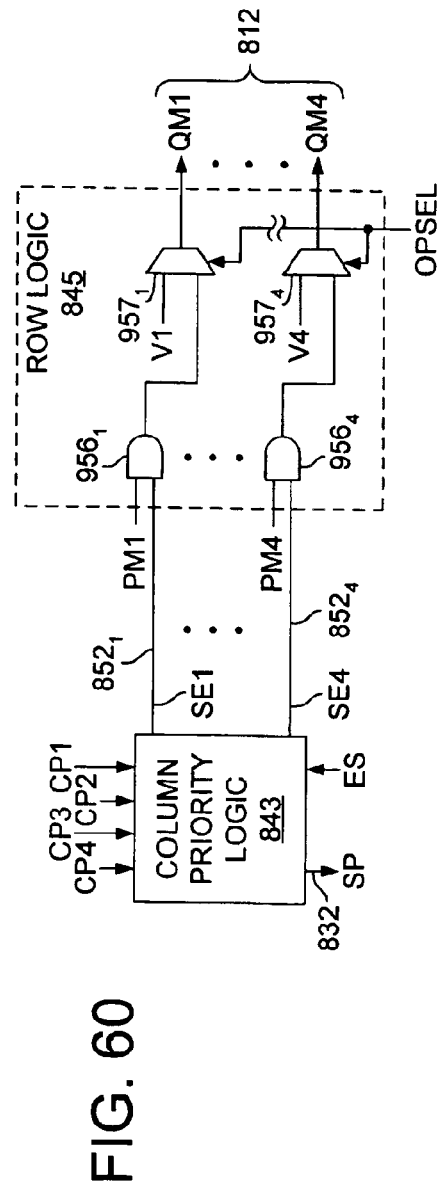
FIG. 60 illustrates an embodiment of the row logic of FIG. 53.

FIG. 60 illustrates an embodiment of the row logic 845 of FIG. 53. As discussed above, the column priority logic 843 compares the column priority values (CP1–CP4) received from the priority array to generate a plurality of segment enable signals $852_1$-$852_4$ (SE1–SE4), each segment enable signal 852 indicating whether the corresponding column priority value is equal to the search priority value 832 (SP) (i.e., a highest priority one of the column priority values). The row logic 845 includes AND gates $956_1$-$956_4$ to logically AND the prioritized match signals PM1–PM4 output from a given row of the priority array with the segment enable signals SE1–SE4. The output of each logic AND gate 956 is coupled to a first input port of a respective one of multiplexers $957_1$-$957_4$, so that, when an operation select signal (OPSEL) indicates a search operation or NFA operation, the outputs of AND gates $956_1$-$956_4$ are selected to be the qualified match signals 812 (QM1–QM4). Thus, during a search or NFA operation, qualified match signal QM1 will be asserted if the corresponding prioritized match signal (PM1) is asserted and segment enable signal SE1 is asserted. That is, qualified match signal QM1 will be asserted if PM1 indicates that the corresponding priority value is equal to the column priority value for column 1 of the priority array, and SE1 indicates that the priority value is equal to the search priority 832 (i.e., the priority value is an intra-column and inter-column winner of priority comparisons). Qualified match signals QM2, QM3 and QM4 are similarly asserted if their corresponding priority values are intra-column and inter-column winners of priority comparisons.

Still referring to FIG. 60, if the operation select signal (OPSEL) indicates a write to the CAM array, then validity values V1–V4 are selected by multiplexers $957_1$-$957_4$ to be output as qualified match signals QM1–QM4 instead of the signals generated by AND gates 956. In one implementation, the validity values are active low signals which, if high, indicate that the corresponding entry segment within the CAM array does not have a valid entry stored therein. That is, the validity values may be interpreted as active high unoccupied (empty) signals. Accordingly, when the validity values are selected to be output as the qualified match signals, QM1–QM4, the qualified match signals effectively represent a set of empty flags for the CAM array. The empty flags may be used within the priority encoder 805 of FIG. 52 to generate an index of a next free address within the CAM array 801. In one embodiment, the validity values are formed by one or more bits stored in the CAM array 801 within the corresponding entry segment. In an alternative embodiment, to facilitate circuit layout, validity storage circuits are provided both in the CAM array and in a location physically near the multiplexers 957. In the latter embodiment, the validity values stored in the validity storage circuits located near the multiplexers 957 mirror the values stored within the CAM array and are used to drive the qualified match signals when a write operation is selected. In an embodiment in which a predetermined entry value (e.g., code) is used to indicate the presence or absence of a valid entry within an entry segment, the multiplexers 957 may be omitted altogether.

Referring again to FIG. 52, the match flag logic 807 generates a block flag 824 (BF) for the overflow CAM device 800 according to the states of the qualified match signals 812 and the block configuration signal 840 (CFG). In one embodiment, for example, the match flag logic 807 asserts the block flag 824 in accordance with the following Boolean expression (the '+' symbol indicates a logical OR operation and the '•' symbol indicates a logical AND operation):

$$BF = x1 \cdot [(QM1_1 + QM1_2 + ... + QM1_Y) + (QM2_1 + QM2_2 + ... + QM2_Y) +$$
$$(QM3_1 + QM3_2 + ... + QM3_Y) + (QM4_1 + QM4_2 + ... + QM4_Y)] +$$
$$x2 \cdot [(QM1_1 \cdot QM2_1) + (QM1_2 \cdot QM2_2) + ... (QM1_Y \cdot QM2_Y) +$$
$$(QM3_1 \cdot QM4_1) + (QM3_2 \cdot QM4_2) + ... (QM3_Y \cdot QM4_Y)] +$$
$$x4 \cdot [(QM1_1 \cdot QM2_1 \cdot QM3_1 \cdot QM4_1) + (QM1_2 \cdot QM2_2 \cdot QM3_2 \cdot QM4_2) +$$
$$(QM1_Y \cdot QM2_Y \cdot QM3_Y \cdot QM4_Y)]$$

Any logic circuit that produces the above Boolean result may be used to implement the block flag logic, and, in alternative embodiments, different Boolean expressions may be used. For example, in an embodiment in which qualified match signals QM2 and QM4 are ignored in x2 mode and qualified match signals QM2, QM3 and QM4 are ignored in x4 mode, the block flag signal may be asserted in accordance with the following Boolean expression:

$$BF = x1 \cdot [(QM1_1 + QM1_2 + ... + QM1_Y) + (QM2_1 + QM2_2 + ... + QM2_Y) +$$
$$(QM3_1 + QM3_2 + ... + QM3_Y) + (QM4_1 + QM4_2 + ... + QM4_Y)] +$$
$$x2 \cdot [(QM1_1 + QM1_2) + ... + QM1_Y) +$$
$$(QM3_1 + (QM3_2 + ... + QM3_Y)] +$$
$$x4 \cdot (QM1_1 + QM1_2 + ... + QM1_Y)$$

Still referring to FIG. 52, the priority encoder 805 generates an address, referred to as an entry index 828 (EIN), that corresponds to the row and segment of the priority index table (and therefore to corresponding row and entry segment of the CAM array 801) indicated by an asserted qualified match signal 812. If more than one qualified match signal $812_1$-$812_Y$ is asserted, hardwired tie resolution logic within the priority encoder 805 generates an index that corresponds to the lowest numbered row and entry segment for which a qualified match signal is asserted. Alternative tie resolution techniques may be used in alternative embodiments, including, but not limited to, providing logic to resolve ties in favor of higher numbered rows or providing configurable tie resolution logic to enable programmable selection between multiple different tie resolution policies. In either case, the entry index 828 generated by the priority encoder is provided to the index select logic 821 which selects, according to the state of the NFA signal 212 and a block flag signal 824, either the entry index 828 or a previously stored version of the entry index to be output as the block index 826 (BIN) for the overflow CAM 800.

Figure 61:
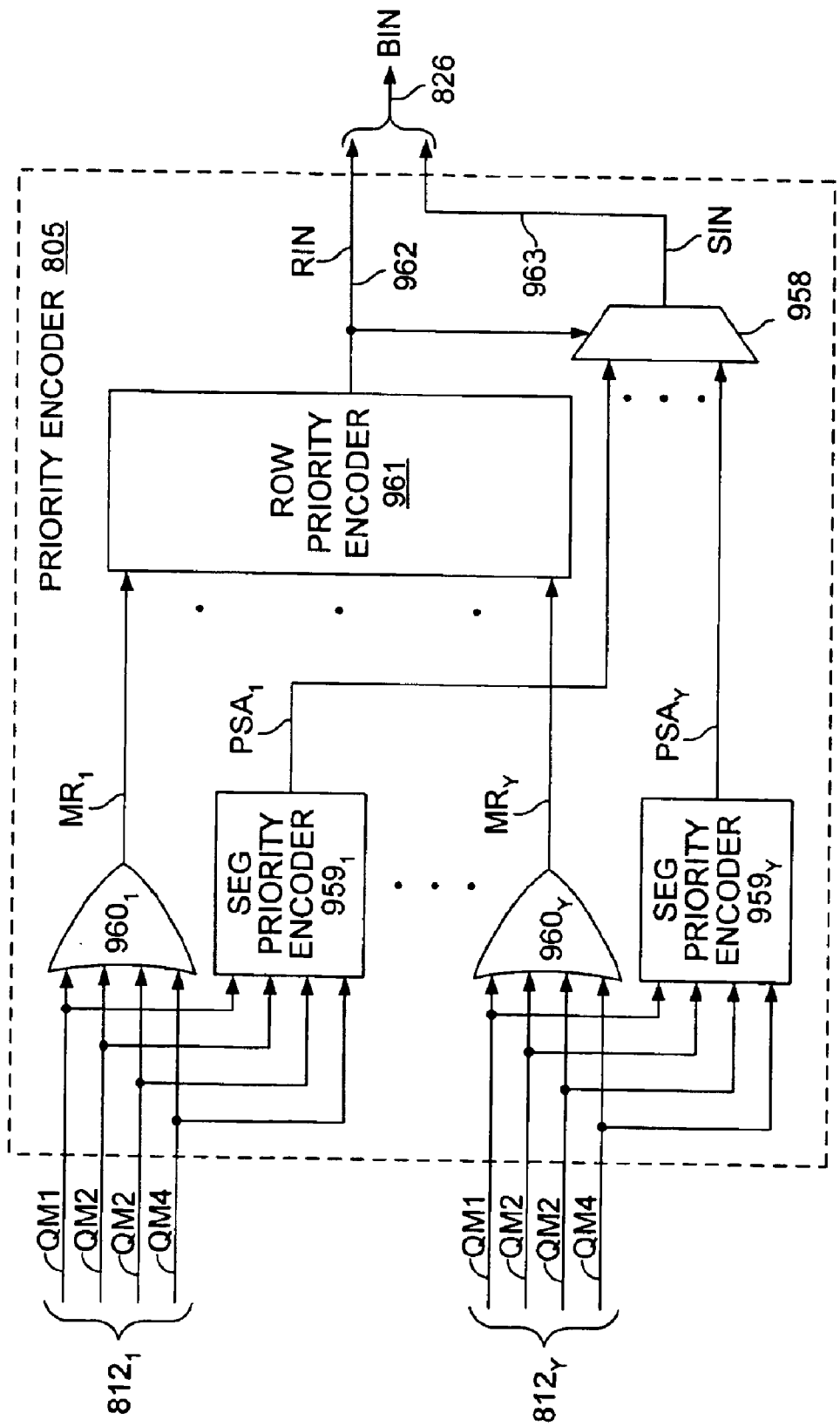
FIG. 61 illustrates an embodiment of the priority encoder 805 of FIG. 52.

FIG. 61 illustrates an embodiment of the priority encoder 805 of FIG. 52 (other embodiments may be used). The priority encoder 805 includes OR gates $960_1$-$960_Y$, segment priority encoders $959_1$-$959_Y$, row priority encoder 961 and multiplexer 958. Each of the OR gates $960_1$-$960_Y$ receives a respective set of qualified match signals, QM1–QM4 (each set forming a respective one of qualified match signals $812_1$-$812_Y$), and outputs a corresponding one of row match signals $MR_1$-$MR_Y$ to the row priority encoder 961. Thus, the row priority encoder 961 receives Y row match signals (MR), each indicating whether any of the qualified match signals $QM_1$-$QM_4$ for the corresponding row are asserted. The row priority encoder 961 performs an encoding operation to generate a row index 962 (RIN) (i.e., row address) that corresponds to the row of the CAM array indicated by an asserted one of the row match signals MR. In one embodiment, if two or more of the row match signals MR are asserted (i.e., a multiple match condition), the row priority encoder 961 generates a row index 962 that corresponds to the lowest numbered one of the indicated rows (i.e., the row having the lowest physical address of the indicated rows). In alternative embodiments, different row prioritizing policies may be used to resolve multiple match conditions (e.g., selecting the row having the highest physical address).

Each of the segment priority encoders $959_1$-$959_Y$ also receives a respective set of qualified match signals QM1–QM4 and performs an encoding operation to generate a respective prioritized segment address PSA. In one embodiment, if two or more of qualified match signals QM1–QM4 are high, the segment priority encoder 959 generates a prioritized segment address that corresponds to the lowest numbered one of the qualified match signal (i.e., the qualified match signal that corresponds to the CAM array segment having the lowest physical address as compared with other segments within the same row). By this arrangement, the prioritized segment address generated in response to a match detection in the x4 configuration (i.e., all qualified match signals asserted) will indicate segment 1 (e.g., PSA=00 binary), and the prioritized segment address generated in response to a match detection in the x2 condition (at least one pair of match signals asserted) will indicate segment 1 or segment 3 (e.g., PSA=00 or 10), as the case may be. Also, in the event of multiple matches within a single row in either the x1 or x2 configuration, the address of the lowest numbered segment will be output as the prioritized segment address. In alternative embodiments, different segment prioritizing policies may be used to generate prioritized segment address.

The multiplexer 958 receives Y prioritized segment addresses ($PSA_1$-$PSA_Y$) from the segment priority encoders $959_1$-$949_Y$ and selects, according to the row index 962, one of the prioritized segment address to be output as a segment index 963 (SIN). Thus, the segment index 963 is the prioritized segment address that corresponds to the row that yielded the row index 962. Together the row index 962 and segment index 963 form the block index 826 for the overflow CAM block.

Figure 62:
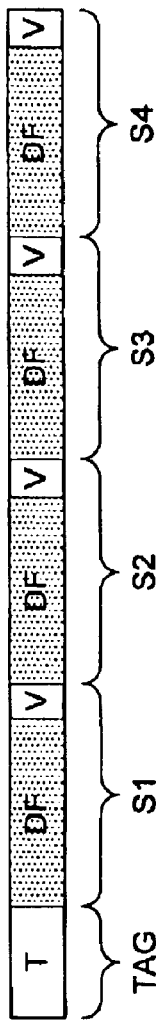
FIG. 62 illustrates the format of a NFA mask according to one embodiment.

Referring again to FIG. 52, the mask logic 813 is used to provide a global masking of the search key (e.g., masking of selective bits within the search key according to host-supplied or host-selected mask values). During an NFA operation, the NFA signal 212 is high and is used within the mask logic 813 to select a NFA mask to be applied to the incoming search key. FIG. 62 illustrates the format of a NFA mask according to one embodiment (other embodiments may be used). The NFA mask includes a tag field (TAG) and four entry segment fields (S1–S4), with each entry segment field including a validity field (V) and a data field (DF). In the embodiment of FIG. 62, the NFA mask is used during an NFA operation to mask the data field components of each entry segment field (as indicated by the shaded areas), and to unmask the tag field, and unmask the validity field components of each segment field. Thus, during an NFA operation, the class code associated with an entry candidate may be compared with the tag field within each row of the CAM array 801, and a predetermined logic value (e.g., logic 1) may compared with each of the four segment validity values within each row to learn whether the CAM array 801 contains a partially filled row that is tagged with the specified class code. That is, the tag segment match signal (MT of FIG. 59) will be high for a given row if the corresponding tag segment contains a tag that matches the specified class code, and each of the entry segment match signals (M1–M4) will be high if the validity value within the corresponding entry indicates an unoccupied status. Because the tag segment match signal is ANDed with the entry segment match signals to produce the tag match signals TM1–TM4, the tag match signals, if asserted, indicate an empty state for an entry segment of the CAM array for which the corresponding tag segment matches the class code.

Figure 63:
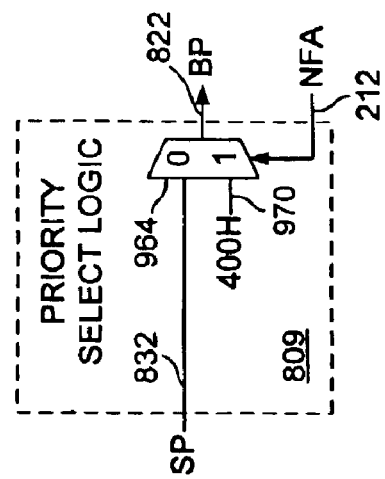
FIG. 63 illustrates an embodiment of the priority select logic of FIG. 52.

Referring to FIG. 63, the priority select logic 809 includes a multiplexer 964 to select, according to the state of the NFA signal 212, either the search priority value 832 (SP) output from the priority index table 803 of FIG. 52, or a predetermined priority value 970 to be output as the block priority value 822. In one embodiment, the predetermined priority value 970 is output during an NFA operation (i.e., when NFA signal 212 is high) to enable the overflow CAM to be selected for entry insertion should none of the hash CAM blocks output a higher priority insert priority value (i.e., as described above in reference to FIG. 48). More specifically, in the exemplary embodiment of FIG. 63, a priority value of 400 hex is output as the predetermined insert priority value for the overflow CAM so that, the overflow CAM will output a numerically higher (i.e., lower priority) priority value than a hash CAM block having a completely or partially unfilled row. In alternative embodiments, the overflow CAM block may output different insert priority values including, without limitation, a priority value indicative of a fill level of the overflow CAM block, a priority value indicative of whether all the entry segments within the row indicated by the block index are empty (or, conversely, that at least one of the entry segments is filled; a partially filled row status), a priority value that indicates both a partially filled row status and a block fill level, etc.

Figure 64:
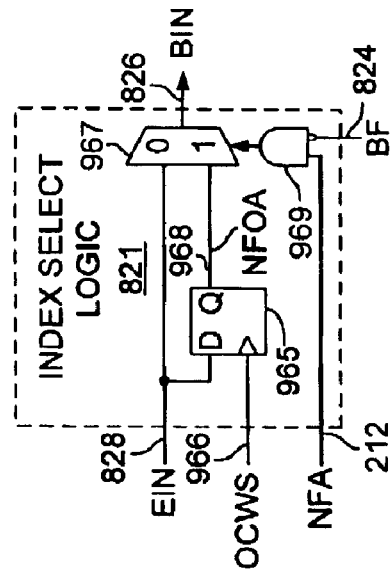
FIG. 64 illustrates an embodiment of the index select logic of FIG. 52.

FIG. 64 illustrates an embodiment of the index select logic 821 of FIG. 52 (other embodiments may be used). The index select logic includes a multiplexer 967, storage element 965 and AND gate 969. The entry index 828 from the priority encoder is input to a first input port of the multiplexer 967 and also to a data input of the storage element 965. During an overflow CAM load operation the entry index 828 will be generated based on the validity values for the CAM array entries (i.e., as represented by the qualified match signals) and therefore will represent the highest priority available location (i.e., next free address) within the overflow CAM. Because the NFA signal 212 will be low during the load operation, the logic AND gate 969 will output a low signal to select the entry index 828 to be output as the block index 826 (BIN). Also, the instruction decoder (not shown in FIG. 64) will generate an overflow CAM write strobe signal 966 (OCWS) to strobe the entry index (i.e., next free overflow CAM address) into the storage element 965. During a search operation, the entry index 828 will be generated based on the qualified match signals and therefore will indicate the CAM array location containing the highest priority key-matching entry. Because the NFA signal 212 will be low during the search operation, the logic AND gate 969 will output a low signal to select the entry index 828 to be output as the block index 826.

During an NFA operation, the NFA signal 212 is high, enabling AND gate 969 to select, according to the state of the block flag 824, either the entry index 828 or the next free overflow CAM address 968 (stored within storage element 965) to be output as the block index 826. More specifically, if the block flag is high during a NFA operation (i.e., indicating an unoccupied entry segment(s) within a row containing a tag that matches the class code associated with the entry candidate) the inversion at the block flag input to the AND gate 969 causes the output of AND gate 969 to be low and therefore to select the entry index 828 (i.e., the index of an empty entry segment within the CAM array) to be output as the block index 826. If the block flag is low during a search operation, then no match was detected (indicating that no row contained both a tag that matched the class code and an empty entry segment), and the output of the logic AND gate 969 is high to select the next free overflow CAM address 968 to be output as the block index 826. Thus, during an NFA operation, an entry index 828 is output for a partially (or completely) empty row having a tag that matches the class code associated with the entry candidate, and the next free overflow CAM address 968 is output if there is no such row.

System Structure and Operation

FIG. 65 illustrates a system 980 that includes a host processor 975 (e.g., general purpose processor, digital signal processor, network processor, application-specific integrated circuit (ASIC), etc.), program store 979, CAM device 977 according to one of the embodiments described herein, and associated storage 111. The system device may be, for example, a network switch or router, or any other type of device in which the compare capability of the CAM device 977 may be used.

The host processor 975 executes program code stored within program store 979 (which may include one or more semiconductor storage devices or other storage media) and issues addresses, comparands, and instructions to the CAM device 977 via the address, data and instruction buses, respectively (i.e., ABUS 230, DBUS 140 and IBUS 200), and receives status and other information from the CAM device 1701 via a result bus (RBUS 990). In particular, the host processor 975 issues instructions to program or select the entry types, key masks, hash function selections, entry sizes, compare modes, fill policies and other programmable or selectable features of one or more CAM blocks within the CAM device 977, as discussed above. In the embodiment of FIG. 64, flag signals 992 (e.g., device-level match flag, multiple match flag, full flag, etc.) are output directly to the host processor 975, however, the flag signals 992 (or a single flag signal) may alternatively or additionally be output to the host processor 975 via the result bus 990, for example in a status word. The device index 976 may be output to an associated storage (e.g., associated storage 111, which may be included within the same integrated circuit (IC) or IC package as the CAM device 977 and/or host processor 975) and/or to the host processor 975. The information output from the associated storage 111 (i.e., in response to the device index 976) may be provided to the host processor 975 (e.g., via path 978), or other processor or control device within the system 980.

In alternative embodiments, one or more of the buses (e.g., ABUS, DBUS, IBUS, or RBUS) may be omitted and the corresponding information time multiplexed onto another of the buses. Further, the CAM device 977 and host processor 975 may be implemented in distinct integrated circuits (ICs) and packaged in distinct IC packages, or in a single IC (e.g., in an ASIC, system-on-chip, etc.), or in an IC package that includes multiple ICs (e.g., a multi-chip package, paper thin package, etc.). Also, the system 980 may include multiple CAM devices 977 each programmed with a respective set of configuration values. For example, in one embodiment, system 980 includes multiple CAM devices according to hash CAM device 190 of FIG. 6, along with an overflow CAM device. During a search or NFA operation, each of the CAM devices may be operated in parallel to generate a match address or insertion address.

Numerous functions described as being implemented within the CAM devices of FIGS. 3–64 may alternatively be implemented by the host processor 975 in response to instructions (i.e., software or firmware) stored within the program store 979. For example, in one embodiment the fill level of the binary CAM (or ternary CAM) within each hash CAM block is tracked by host processor 975 under program control. Each time a hash CAM block is selected for entry insertion at an unfilled row (an event that involves loading anew hash index into the binary CAM), the binary CAM fill count value for the hash CAM block is incremented. Similarly each time a binary CAM entry is deleted (e.g., due to deletion of an entry or entries in a corresponding row of the memory array), the binary CAM fill count value for the hash CAM block is decremented. Prior to selecting a hash CAM block for entry insertion at an unfilled row (a circumstance indicated by a device priority value having, for example, a logic high partial fill bit), the host processor inspects the binary CAM fill count value for the hash CAM block to determine if the count value has reached a maximum (i.e., completely full) level. If the count value indicates a full binary CAM, the host processor does not store the candidate entry in the indicated hash CAM block. Other functions within the CAM devices of FIGS. 3–64 may similarly be implemented by the host processor 975 under program control.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method of operation within an integrated circuit device, the method comprising:
   generating an index based on a search value;
   determining whether constituent bits of the search value, including bits thereof used to generate the index, match corresponding bits of a data value stored at a memory location indicated by the index; and
   outputting, from the integrated circuit device, the indent and an indication of whether the constituent bits of the search value match the corresponding bits of the data value.

2. The method of claim 1 wherein generating the index based on the search value comprises selecting a portion of the search value, and generating the index based on the selected portion of the search value.

3. The method of claim 2 wherein selecting the portion of the search value comprises selecting the portion of the search value in accordance with a configuration value stored within the integrated circuit device.

4. The method of claim 1 wherein accenting an index based on the search value comprises:
   assembling dispersed fields of bits within the march value to form a search key; and generating the index based on the search key.

5. The method of claim 4 further comprising masking selected bits within the search key prior to generating the index.

6. The method of claim 5 wherein masking selected bits within the search key comprises masking bits within the search key in accordance with a configuration value within the integrated circuit device.

7. The method of claim 4 wherein assembling dispersed fields of bits within the search value to form the search key comprises assembling the dispersed fields of bits into a contiguous set of bits in accordance with a configuration value within the integrated circuit device.

8. The method of claim 7 wherein the configuration value specifies a data format of the search value.

9. The method of claim 1 wherein generating the index based on the search value comprises generating a hash index based on the search value, the hash index having fewer constituent bits then the search value.

10. The method of claim 9 wherein generating the hash index comprises generating a cyclic redundancy check (CRC) value.

11. The method of claim 1 wherein determining whether the search value matches the data, value comprises comparing the search value with the data value to generate a match signal that indicates whether the search value matches the data value.

12. The method of claim 11 wherein outputting the indication of whether the search value matches the data value comprises outputting the match signal.

13. The method of claim 11 wherein comparing the search value with the data value comprises comparing a selected potion of the search value with a selected portion of the data value, the selected portions of the search value and data value being indicated by a mask value.

14. The method of claim 13 further comprising retrieving the mask value from the memory, location indicated by the index.

15. The method of claim 13 further comprising decoding an encoded value to generate the mask value.

16. The method of claim 15 fuller comprising retrieving the encoded value from the memory location indicated by the index.

17. The method of claim 11 wherein comparing the search value with the data value comprises determining whether the search value is greater than the data value and wherein generating the match signal that indicates whether the search value matches the data value comprises generating a match signal to indicate that the search value matches the data value if the search value is not greater then the data value.

18. The method of claim 11 wherein comparing the search value with the data value comprises determining whether the search value is less then the data value and wherein generating the match signal then indicates whether the search value matches the data value comprises generating a match signal to indicate that the search value matches the data value if the search value is not less then the data value.

19. The method of claim 11 wherein comparing the search value with the data value comprises performing either a range comparison or a match comparison according to a configuration value within she integrated circuit device, and wherein performing a range comparison comprises determining whether the search value is greater than the date value.

20. The method of claim 1 wherein generating an index based on a search value comprises:
generating a plurality of hash values based on the search value, each hub value having fewer constituent bits than the search value; and
selecting one of the hash values to be the index.

21. The method of claim 20 wherein selecting one of the hash values to be the index comprises selecting the one of the hash values in accordance with a configuration value within the integrated circuit device.

22. The method of claim 1 further comprising:
retrieving a priority value from the memory location indicated by the index; and
outputting the priority value from the integrated circuit device.

23. A method of operation within an integrated circuit device, the method comprising:
receiving a search value;
generating an index based on a selected bits of the search value;
determining whether constituent bits of the search value, including the selected bits match corresponding bits of a data value stated at a memory location indicated by the index; and
selecting the selected bits of the search value in accordance with a configuration value stored within the integrated circuit device.

24. A method of operation within an integrated circuit device, the method comprising:
receiving a search value;
generating an index based on a selected bits of the search value;
determining whether constituent bits of the search value, including the selected bits match corresponding bits of a data value stored at a memory location indicated by the index; and
wherein generating an index based on selected bits of the search value comprises:
assembling dispersed fields of bits within the search value to form a search key; and
generating the index based on the search key.

25. The method of claim 24 further comprising masking bits within the search key prior to generating the index.

26. The method of claim 25 wherein masking bits within the search key comprises masking bits within the search key in accordance with a configuration value within the integrated circuit device.

27. The method of claim 24 wherein assembling dispersed fields of bits within the search value to form the search key comprises assembling the dispersed fields of bits into a contiguous set of bite in accordance with a configuration value within the integrated circuit device.

28. The method of claim 23 wherein generating the index based on selected bits of the search value comprises generating a hash index based on the selected bits of the search value, the hash index having fewer constituent bits than the search value.

29. The method of claim 28 wherein generating the hash index comprise generating a cyclic redundancy check (CRC) value.

30. A method of operation within an integrated circuit device, the method comprising:
generating an index based on a search value;
generating an indication of whether a first portion of the search value, including constituent bits of the search value used to generate the index, matches a selected portion of a data value stored at a memory location indicated by the index; and
wherein generating the index based on the match value comprises selecting portion of the first portion of the search value, and generating the index based on the selected portion of the first portion of the search value, and
wherein selecting the portion of the first portion of the search value comprises selecting the portion of the first portion of the search value in accordance with a configuration value stored within the integrated circuit device.

31. A method of operation within an integrated circuit device, the method comprising:
generating an index based on a search value;
generating an indication of whether a first portion of the starch value, including constituent bits of the search value used to generate the index, matches a selected portion of a data value stored at a memory location indicated by the index; and wherein generating an index based on the search value comprises:
assembling dispersed fields of bits within the search value to form a search key; and
generating the index based on the search key.

32. The method of claim 31 further comprising masking selected bits within the search key prior to generating the index, the selected bits being selected in accordance with a configuration value within the integrated circuit device.

33. The method of claim 30 wherein generating an indication of whether a first portion of the search value matches a selected portion of a data value stored at a memory location indicated by the index comprises:
retrieving the data value from the memory location indicated by the index; and
comparing the first portion of the search value with the selected portion of the data value to generate a match signal that indicates whether the search value matches the data value.

34. A method of operation within an integrated circuit device, the method of comprising:
generating an index based on a search value;
generating an indication of whether a first portion of the search value, including constituent bits of the search value used to generate the index, matches a selected portion of a data value stored at a memory location indicated by the index;
retrieving mask information from the memory location indicated by the index, the mask information indicating the selected portion of the data valve; and
wherein generating the indication of whether the first portion of the search value matches the selected portion of the data value stored at the memory location indicated by the index comprises:
retrieving the data value from the memory location indicated by the index; and
comparing the first portion of the search value with the selected portion of the data value to generate the match signal that indicates whether the search value matches the data value.

35. The method of claim 34 further comprising decoding an encoded value included within the mask information to generate a decoded mask value, the mask value indicating the selected portion of the data value.

36. A method of operation within an integrated circuit device the method comprising:
generating a search index based on a search value; and
identifying, within a content addressable memory (CAM), one of a plurality of stored indices that matches the search index; and
determining whether the search value matches a data value stored at a first location within a data memory, the first location corresponding to a location of the one of the plurality of indices.

37. The method of claim 36 wherein generating the search index based on the search value comprises selecting a portion of the search value, and generating the search index based on the selected portion of the search value.

38. The method of claim 37 wherein selecting the portion of the search value comprises selecting the portion of the search value in accordance with a configuration value within the integrated circuit device.

39. The method of claim 36 wherein generating the search index based on the search value comprises generating a search index having fewer constituent bits than the search value.

40. The method of claim 36 wherein generating the search index comprise generating a cyclic redundancy check (CRC) value.

41. The method of claim 36 wherein identifying, within the CAM, one of a plurality of stored indices that matches the search index comprises comparing the search index with each of the plurality of stored indices.

42. The method of claim 41 wherein comparing the search index with each of the plurality of stored indices comprises simultaneously comparing the search index with each of the plurality of stored indices.

43. The method of claim 41 wherein identifying one of a plurality of stored indices that matches the search index further comprises generating a plurality of match signals, each match signal indicating whether a respective one of the stored indices matches the search index.

44. The method of claim 36 wherein determining whether the search value matches a data value stored at a first location within a data memory comprises:
retrieving the data value from the first location within the memory; and
comparing the search value with the data value.

45. The method of claim 44 wherein retrieving the data value from the first location within the memory comprises:
generating a row address indication that corresponds to the one of the plurality of stored indices that matches the search index; and
retrieving the data value from a location within the memory indicated by the row address indication.

46. The method of claim 45 wherein generating the row address indication comprises generating a plurality of match signals that each indicate whether a respective one of the stored indices matches the search index.

47. The method of claim 46 wherein generating the row address indication further comprises encoding the plurality of match signals into a row address.

48. The method of claim 47 wherein encoding the plurality of match signals into a row address comprises retrieving the row address from a lookup table storage location indicated by the plurality of match signals.

49. A method of operation within an integrated circuit device, the method comprising:
converting a search value into a search index having fewer constituent bits than the search valve;
identifying, within a content addressable memory (CAM), one of a plurality of stored indices that matches the search index; and
outputting a data value from a first location within a data memory, the first location corresponding to a location within the CAM of the one of the plurality of indices.

50. The method of claim 49 further comparing determining whether the search value matches the data value.

51. The method of claim 50 further comprising generating a match signal that indicates whether the search value matches the data value.

52. The method of claim 49 wherein converting a match value into a search index comprises converting a selected portion of the search value into a search index.

53. The method of claim 49 wherein converting a search value into a search index comprises generating a hash index based on the search value.

54. The method of claim 53 wherein generating a hash index comprises generating a cyclic redundancy check (CRC) value.

55. The method of claim 49 wherein identifying within the CAM, one of a plurality of stored indices that matches the search index comprises comparing the search index with each of the plurality of stored indices.

56. The method of claim 55 wherein comparing the search index with each of the plurality of stored indices comprises simultaneously comparing the search index with each of the plurality of stored indices.

57. The method of claim 55 wherein identifying, within a content addressable memory (CAM), one of a plurality of stored indices that matches the search index further comprises generating a plurality of match signals, each match signal indicating whether a respective one of the stored indices matches the search index.

58. The method of claim 49 wherein outputting the data value from the first location within the data memory comprises:

generating a new address indication that corresponds to the one of the plurality of stored indices that matches the search index; and retrieving the data value from a location within the data memory indicated by the row address indication.

59. The method of claim 58 wherein generating the row address indication comprises generating a plurality of match signals that each indicate whether a respective one of the stored indices matches the search index.

60. The method of claim 59 wherein generating the row address indication further comprises encoding the plurality of match signals into a row address.

61. A method of operation within an integrated circuit device, the method comprising:

generating a plurality of indices based on a search value;

selecting, according to a select value, one of the plurality of indices; and determining whether the search value matches a data value stored at a memory location indicated by the one of the plurality of indices.

62. The method of claim 61 wherein generating a plurality of indices based on a search value comprises selecting a portion of the search value, and generating each of the plurality of indices based on the selected portion of the search value.

63. The method of claim 62 wherein selecting the portion of the search value comprises selecting the portion of the search value in accordance with a configuration value stored within the integrated circuit device.

64. The method of claim 62 wherein generating each of the plurality of indices based on the search value comprises:

assembling dispersed fields of bits within the search value to form a search key; and generating each of the plurality of indices based on the search key.

65. The method of claim 64 further comprising masking selected bits within the search key prior to generating the plurality of indices.

66. The method of claim 65 wherein masking selected bits within the search key comprises masking bits within the search key in accordance with a configuration value within the integrated circuit device.

67. The method of claim 61 wherein selecting one of the plurality of indices comprises selecting one of the plurality of indices in accordance with a configuration value within the integrated circuit device.

68. The method of claim 61 wherein generating a plurality of indices based on a search value comprises generating a plurality of different indices based on the search value.

69. The method of claim 68 wherein generating a plurality of plurality of different indices comprises inputting at least a portion of the search value to a plurality of hash function circuits, each hash function circuit being adapted to generate a respective hash index based on a hash function that is different from the others of the hash function circuits.

70. The method of claim 61 wherein determining whether the search value matches a data value stored at a memory location indicated by the one of the plurality of indices comprises comparing the search value with the data value and generating a match signal the indicates whether the search value matches the data value.

71. The method of claim 70 wherein comparing the search value with the date value comprises comparing a selected portion of the search value with a selected portion of the data value, the selected portions of the search values and data value being indicated by a mask value.

72. The method of claim 71 further comprising retrieving the mask value from the memory location indicated by the one of the plurality of indices.

73. A method of operation within an integrated circuit device, the method comprising:

generating a plurality of indices based on a search value;

retrieving a plurality of data values from a plurality of memories, each data value being retrieved from a respective one of the memories at a location indicated by a respective one of the plurality of indices;

comparing the search value to each of the plurality of data values to identity one of the data values that matches the search value; and generating a value that identifies the respective one of the memories from which the one of the data values that matches the search value was retrieved.

74. The method of claim 73 wherein generating a plurality of indices based on a search value comprises generating a plurality of hash indices based on at least a portion of the search value, each of the hash indices having fewer constituent bits than the search value.

75. The method of claim 74 wherein generating the plurality of hash indices comprises generating a plurality of cyclic redundancy check (CRC) values.

76. The method of claim 73 wherein comparing the search value to each of the plurality of data values comprises comparing the search value with a selected portion of each of the data values, the selected portion of each of the data values being indicated by a respective mask value.

77. The method of claim 76 further comprising retrieving the respective mask value from a respective one of the memories at a location indicated by a respective one of the plurality of indices.

78. The method of claim 73 wherein retrieving a plurality of data values from a plurality of memories comprises retrieving a first data value from a first one of the plurality of memories, and retrieving a second data value from a second one of the plurality of memories, the second one of the plurality of memories having a different storage capacity than the first one of the plurality of memories.

79. A method of operation within an integrated circuit device, the method comprising:

receiving a search value and a corresponding search code;

comparing the search code to a plurality of configuration values, each of the configuration values corresponding to a respective one of a plurality of data memories within the integrated circuit device;

generating a plurality of indices based on the search value;

retrieving a plurality of data value from the plurality of data memories, each data value being retrieved from a respective one of the data memories at a location indicated by a respective one of the indices; and generating, for each of the plurality of data memories, a respective match signal having a first state if the search value matches the data value retrieved from the data memory and if the search code matches the configuration value that corresponds to the data memory.

80. The method of claim 79 wherein receiving a search code comprises receiving a search code that indicates a formatting of the corresponding search value.

81. The method of claim 79 wherein receiving a search code comprises receiving a search code that indicates positions of maskable bits within the corresponding search value.

82. The method of claim 79 wherein generating a match signal having a first state if the search value matches the data value retrieved from the data memory and if the search code matches the configuration value that corresponds to the data memory comprises:

comparing a selected portion of the search value and a selected portion of the data value; and generating a match signal having a first state if the selected portion of the search signal matches the selected portion of the data value and if the search code matches the configuration value.

83. The method of claim 79 further comprising retrieving a plurality of priority values from the plurality of data memories, each priority value being retrieved from a respective one of the data memories at a location indicated by a respective one of the indices.

84. The method of claim 79 further comprising generating an identifier based on the plurality of priority values and the match signals generated for the plurality of data memories, the identifier indicating one of the plurality of date memories.

85. The method of claim 84 wherein generating an identifier that indicates one of the plurality of data memories comprises generating an identifier that indicates a data memory of the plurality of data memories that contains a highest priority one of the plurality of priority values and for which the respective match signal has the first state.

86. A method of operation within an integrated circuit device, the method comprising:

generating an index based on an input value;

retrieving a first value from a location, indicated by the index, within a first memory;

comparing the first value to the input value to generate a first match signal that indicates whether the input value matches the first value; and comparing the input value simultaneously to each of a plurality of values stored in a second memory to generate a second match signal that indicates whether the input value matches one of the plurality of values stored in the second memory.

87. The method of claim 86 wherein comparing the input value simultaneously to each of a plurality of values stored in the second memory comprises comparing the input value to a plurality of values stored in an array of content addressable memory (CAM) cells, each CAM cell including a storage element end a compare circuit.

88. The method of claim 86 further comprising:

outputting a first priority value from the location within the first memory;

outputting a second priority value from the second memory; and comparing the first priority value and the second priority value in accordance with the states of the first and second match signals to determine a highest priority one of the priority values.

89. The method of claim 88 wherein comparing the first priority value and the second priority value in accordance with the states of the first and second match signals to determine a highest priority one of the priority values comprises determining the first priority value to be the highest priority value if the first match signal is asserted and the first priority value indicates a higher priority than the second priority value.

90. The method of claim 86 wherein generating an index based on an input value comprises generating an index having fewer constituent bits than the input value.

91. The method of claim 86 wherein generating the index based on the search value comprises selecting a portion of the search value, and generating the index based on the selected portion of the search value.

92. The method of claim 91 wherein selecting the portion of the search value comprises selecting the portion of the search value in accordance with a configuration value within the integrated circuit device.

93. The method of claim 91 wherein generating an index based on the search value comprises:

assembling dispersed fields of bits within the search value to form a search key, and generating the index based on the search key.

94. The method of claim 93 further comprising masking selected bits within the search key prior to generating the index.

95. The method of claim 94 wherein masking selected bits within the search key comprises masking bits within the search key in accordance with a configuration value within the integrated circuit device.

96. A method of operation within an integrated circuit device, the method comprising:

generating a plurality of priority values in response to a first instruction, each priority value indicating a storage capacity of a respective one of a plurality of circuit blocks; and generating, based on the priority values, a block identifier that identifies one of the circuit blocks.

97. The method of claim 96 wherein generating the block identifier based on the priority values comprises generating a block identifier that identifies a least filled one of the plurality of circuit blocks.

98. The method of claim 96 wherein generating the block identifier based on the priority values comprises generating a block identifier that identifies a most filled one of the plurality of circuit blocks.

99. The method of claim 96 further comprising storing in response to generation of the block identifier, a data value in the one of the plurality of circuit blocks identified by the block identifier.

100. A method of operation within an integrated circuit device, the method comprising:

generating a plurality of indices based on a search value; and for each of a plurality of circuit blocks within the integrated circuit device;

selecting one of the indices;

retrieving a data value from a first storage location within the circuit block, the first storage location being indicated by the one of the indices; and determining whether the date value matches the search value.

101. The method of claim 100 wherein generating the plurality of indices based on the search value comprises generating a plurality of indices that each have fewer constituent bits than the search value.

102. The method of claim 100 wherein generating the plurality of indices based on the search value comprises generating each of the plurality of indices based on a selected portion of the search value.

103. The method of claim 100 wherein selecting one of the indices comprises selecting one of the indices in accordance with a configuration value within the integrated circuit.

104. The method of claim 100 wherein determining whether the data value matches the search value comprises comparing a selected portion of the data value with a selected portion of the mask value.

* * * * *